(12) United States Patent
Lee et al.

(10) Patent No.: US 7,716,566 B2
(45) Date of Patent: May 11, 2010

(54) DATA ERROR CONTROL

(75) Inventors: Xiaobing Lee, Nashua, NH (US); David J. Agans, Amherst, NH (US); Bruce E. Mann, Mason, NH (US)

(73) Assignee: SeaChange International, Inc., Acton, MA (US)

( * ) Notice: Subject to any disclaimer, the term of this patent is extended or adjusted under 35 U.S.C. 154(b) by 1015 days.

(21) Appl. No.: 11/187,737

(22) Filed: Jul. 22, 2005

(65) Prior Publication Data

US 2006/0156178 A1    Jul. 13, 2006

Related U.S. Application Data

(60) Provisional application No. 60/590,307, filed on Jul. 22, 2004.

(51) Int. Cl.
*H03M 13/00* (2006.01)

(52) U.S. Cl. ...................... 714/821; 711/114

(58) Field of Classification Search ............... 714/821, 714/752, 766, 800, 805; 711/100, 114
See application file for complete search history.

(56) References Cited

U.S. PATENT DOCUMENTS

| | | | |
|---|---|---|---|
| 4,395,768 A | 7/1983 | Goethals et al. | |
| 4,435,807 A | 3/1984 | Scott et al. | |
| 4,796,260 A | 1/1989 | Schilling et al. | |
| 5,157,671 A | 10/1992 | Karplus | 371/43 |
| 5,910,961 A | 6/1999 | Tolhuizen et al. | |
| 6,453,440 B1 | 9/2002 | Cypher | |
| 6,694,479 B1* | 2/2004 | Murthy et al. | 714/805 |
| 2002/0010892 A1 | 1/2002 | Lodge et al. | 714/777 |
| 2004/0123223 A1 | 6/2004 | Halford | |
| 2005/0086575 A1* | 4/2005 | Hassner et al. | 714/766 |
| 2005/0223156 A1* | 10/2005 | Lubbers et al. | 711/100 |
| 2006/0074954 A1* | 4/2006 | Hartline et al. | 707/101 |

OTHER PUBLICATIONS

International Preliminary Report on Patentability, date of issuance Jan. 23, 2007, including Written Opinion of the International Searching Authority.
International Search Report for International Application No. PCT/US2005/026275, date of mailing Oct. 11, 2006.
L. Xu et al., "Highly Available Distributed Storage Systems," Department of Computer Science, Washington University, St. Louis, MO and Department of Electrical Engineering, CalTech, Pasadena, CA, pp. 1-24.

* cited by examiner

*Primary Examiner*—Sam Rizk
(74) *Attorney, Agent, or Firm*—Proskauer Rose LLP

(57) ABSTRACT

Multiple corruptions and/or erasures in data storage or data communication systems are corrected. An encoder generates M of parity fields from N data channels. Each item of the generated parity fields is the result of simple exclusive-or operations on one item from one or more data fields and possibly one item from one or more of the other parity fields. A decoder can regenerate as many as M missing or corrupted fields of either data or parity using combinations of correct and/or previously corrected items as inputs using M independent parity equations to solve for and correct each missing or corrupted item in turn.

49 Claims, 24 Drawing Sheets

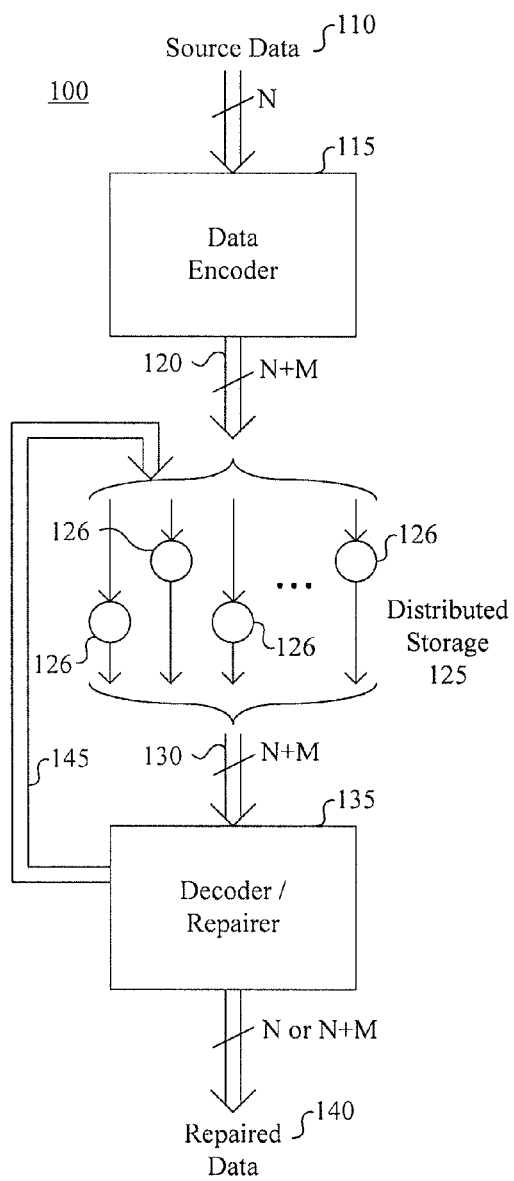
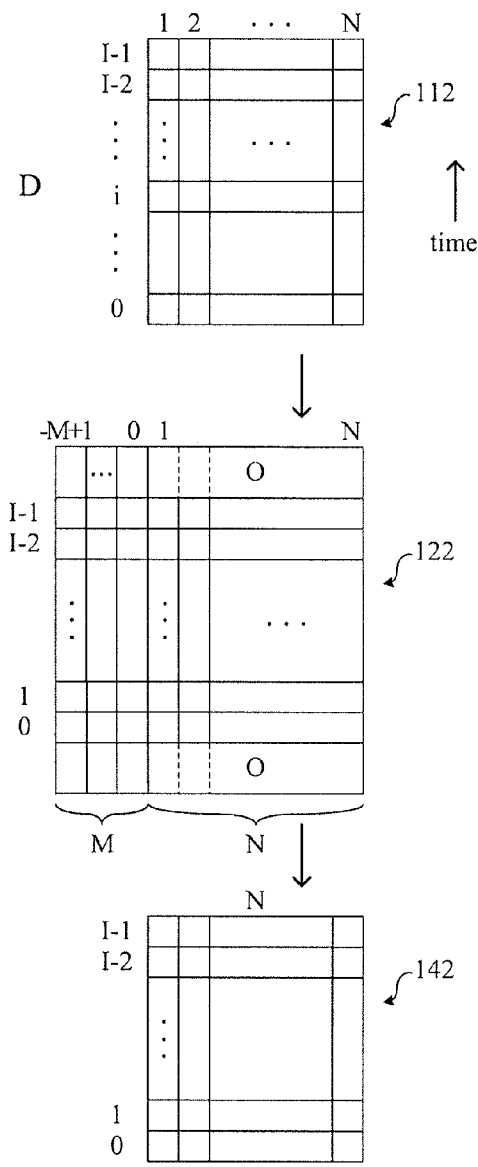
Fig. 1A
Fig. 1B

| n | -3 | -2 | -1 | 0 |
|---|---|---|---|---|
| lastbit$_n$ | I+15 | I+13 | I+12 | I+12 |

| n | -3 | -2 | -1 | 0 |
|---|---|---|---|---|
| firstbit$_n$ | -2 | -4 | -5 | -5 |

DATA ERROR CONTROL

CROSS-REFERENCE TO RELATED APPLICATIONS

This application claims the benefit of U.S. Provisional Application No. 60/590,307 filed Jul. 22, 2004, which is incorporated by reference.

This application is related to PCT Application No. PCT/US2005/026275, of the same title, filed concurrently with this application.

BACKGROUND

This specification relates to error control for data that is subject to corruptions or erasures.

Various techniques are used for error control of data in the face of errors and erasures in the data. A number of techniques are applicable to data that is represented or representable as N channels. In some techniques, in addition to the N channels of data, redundant data in the form of parity is also computed to form additional channels, and the original and redundant channels are distributed each to a separate storage system. If one of the storage systems fails, and therefore represents an "erasure" of the data for the corresponding channel, a redundant parity channel can be used to reconstruct the data. This general approach is used in various variants of RAID (Redundant Array of Inexpensive Disks) systems.

Parity, as well as various other forms of error detecting and correcting codes (generally referred to as Error Correcting Codes, ECCs), have been applied to blocks of data in storage systems, such as in solid state memories and magnetic disk systems. In general, with the addition of M redundant channels, M coincident erasures or coincident corruptions can be corrected in N data channels. RAID- and ECC-type approaches have also been applied when the storage devices are geographically distributed.

Parity approaches have also been used for multiple channels of streaming data, such as parallel bit streams stored on and retrieved from a magnetic tape storage. For example, a stream of parity bits are computed and stored with the data on the tape, with each parity bit being computed from a "stripe" of data bits from the data streams, such as from a stripe across corresponding bits of all the channels. In some approaches, multiple streams of parity bits are computed using diagonal stripes through the data (i.e., using different time offsets for each channel when computing a parity value). With multiple parity streams, one or more errors can be detected, and corrected under certain conditions.

SUMMARY

In one aspect, in general, a method for data error correction includes, in successive iterations, reconstructing entries of one or more of N+M channels of encoded data, the channels representing N channels of source data and satisfying parity equation such that at least some of the entries contribute to M of the parity equations. At each iteration, one or more of the parity equations are applied to reconstruct at least one of the entries in each of the one or more of the N+M channels. M can be 2, 3, 4, 5, or any larger integer.

In another aspect, in general, a method for data error correction includes receiving at least some channels of N+M channels of encoded data that represent N channels of source data, wherein each channel of the N+M channels of encoded data includes a series of entries. The N+M channels of encoded data satisfy parity equations such at least some entries contribute to M of the parity equations. Entries of one or more channels of the N+M channels of encoded data are iteratively reconstructed, at each iteration applying one or more of the parity equations to received or reconstructed entries of the N+M channels of encoded data to reconstruct an entry in each of the one or more of the N+M channels.

One or more of the following features may be included:

Iteratively reconstructing the entries includes reconstructing entries in two or more of the channels.

At each iteration, reconstructing at least some of the entries in the two or more channels uses an entry in another of the two or more channels reconstructed in that iteration.

Reconstructing each entry includes applying a single one of the parity equations to received or reconstructed entries.

Reconstructing at least some entries includes applying a parity equation to a reconstructed entry.

Iteratively reconstructing the entries includes at each iteration reconstructing an entry in one of the one or more channels to be reconstructed using a combination of the parity equations which combination is independent of entries in at least one other of the one or more channels to be reconstructed.

The combination of parity equations is independent of entries in all others of the one or more channels to be reconstructed.

The one or more channels to be reconstructed includes M channels to be reconstructed, and the combination of parity equations is independent of entries in M−1 of the channels.

The method includes determining channels of the N+M channels that were not received, and iteratively reconstructing entries in the one or more channels includes reconstructing entries in channels that were not received.

The method includes detecting errors in entries in the received channels, and iteratively reconstructing entries in the one or more channels includes reconstructing entries in channels in which the errors were detected.

In another aspect, in general, a method includes receiving at least some channels of N+M channels of encoded data that represent N channels of source data, wherein each channel of the N+M channels of encoded data includes a series of entries, the N+M channels of encoded data satisfying parity equations such that each entry in at least some of the N+M channels of encoded data contributes to at least some of the parity equations. At least two of the N+M channels are reconstructed from the received channels, by forming combinations of the parity equations to reconstruct entries in the channels being reconstructed, each combination of parity equations being independent of all entries in at least some of the channels being reconstructed.

One or more of the following features may be included:

Reconstructing the at least two channels includes reconstructing each of the at least two channels independently of other of the at least two channels.

Reconstructing the at least two channels includes reconstructing said channels concurrently.

Reconstructing the at least two channels includes reconstructing said channels in sequence.

In another aspect, in general, a method includes receiving encoded data, including receiving at least N channels of encoded data of N+M channels of encoded data that represent N channels of source data, and correcting errors in the received encoded data by using the received at least N channels of encoded data to correct errors in at least other of the channels of encoded data. Each channel of the N+M channels of encoded data including a series of entries, the channels of encoded data satisfying parity equations such that each entry in at least some of the N+M channels of encoded data contributes to at least M independent parity equations.

One or more of the following features may be included:

Correcting errors in the received encoded data includes using the received at least N channels of encoded data to correct errors in M other of the channels of encoded data.

M is at least three, is at least four, or is at least five.

Receiving the at least N channels of encoded data includes receiving said channels without error.

Receiving the encoded data includes receiving one or more channels other than the received N channels with errors.

Receiving the one or more channels with errors includes receiving said channels with corruption errors.

Receiving the one or more channels with errors includes receiving said channels with erasure errors.

Receiving the encoded data includes not receiving one or more channels other than the received N channels.

Correcting the errors in the received encoded data includes determining a set of error-free channels, the set of error-free channels including at least N channels of encoded data that were received without error.

Correcting the errors further includes determining entries in a set of repaired channels, the set of repaired channels being distinct from the set of error-free channels.

Correcting the errors further includes determining entries in a set of repaired channels, including applying the parity equations to entries in the set of channels of encoded data that were received without error to determine entries in a corrected set of channels of data, the corrected set of channels not in the set of channels of encoded data that were received without error.

Applying the parity equations to entries in the set of channels includes iterating over successive entries in the series of entries in at least one of the repaired channels.

Iterating over the successive entries includes, for each successive entry, applying at least one of the parity equations to determine said entry.

Correcting the errors further includes iterating over entries in the least m other channels of encoded data.

Iterating over the entries includes iteratively determining each entry using one or more of the parity equations.

Determining each entry using one or more of the parity equations includes using one or more of the parity equations in a combination that does not depend on one or more of the at least m other channels of encoded data.

In another aspect, in general, a method includes accepting source data, and representing the source data as N channels of source data, each including a series of I entries. The N channels of source data are encoded to form N+M channels of encoded data, the channels of encoded data satisfying at least M×I independent parity equations, at least I entries of some of the channels of encoded data each being an argument to at least M of the parity equations.

One or more of the following features may be included:

Encoding the N channels includes augmenting the N channels of source data with M channels of parity data, each including a series of at least I entries.

Each entry of the N channels of source data is an argument to M of the parity equations.

In at least some of the M channels of parity data at least I entries in the channel are each an argument to at least two of the parity equations.

In at least some of the M channels of parity data at least I entries in the channel are each an argument to at least M of the parity equations.

Each channel of parity data is associated with a class of parity equations, the class of parity equations being associated with a set of the N+M channels that contribute arguments to the parity equations and relative offsets of entries in the channels that contribute to any of the equations in the class.

The offsets for at least some of the classes of parity equations are such that the relative offsets of the entries form a diagonal line across the N channels of source data when arranged as an array of N columns by I rows.

Representing the source data as N channels of source data includes concatenating a series of extra entries with the series of I entries.

Encoding the N channels of source data to form N+M channels of encoded data includes applying at least some of the parity equations to extra entries and entries representing the source data to determine entries of the encoded data.

The extra entries have zero values.

Encoding the data further includes determining the extra entries as a key to the encoded data.

The encoding of the data enables reconstruction of the source data from any N of the N+M channels of encoded data.

The encoding of the data enables detection of errors in M−1 of the N+M channels of encoded data.

Accepting the source data includes accepting the source data as one or more data streams, representing the one or more data streams as N channels, and encoding the data includes processing the accepted data using a cross-convolutional encoding approach across the N channels to produce the N+M channels of encoded data as a stream of data.

Any two of the parity equations share at most one entry of the N+M channels as an argument.

In another aspect, in general, a method for data error protection includes accepting source data and representing the source data as N channels of source data, each including a series of I entries. The N channels of source data are encoded to form N+M channels of encoded data, the channels of encoded data satisfying at least M×I independent parity equations, at least I entries of some of the channels of encoded data each being an argument to at least M of the parity equations. The N+M channels of encoded data are handled, and then entries in one or more channels of the N+M channels of encoded data are iteratively reconstructed. At each iteration one or more of the parity equations are applied to received or reconstructed entries of the N+M channels of encoded data to reconstruct an entry in each of the one or more of the N+M channels. The source data is recovered using the reconstructed entries.

In another aspect, in general, a method includes representing the source data as N channels of source data, each including a series of I entries. The N channels of source data are encoded to form N+M channels of encoded data, the channels of encoded data satisfying at least M×I independent parity equations, at least I entries of some of the channels of encoded data each contributing to at least M of the parity equations. Errors are introduced into at least M/2 of the N+M channels, and the source data is recovered from the channels.

One or more of the following features may be included:

Encoding the N channels includes augmenting the N channels of source data with M channels of parity data.

The channels are transmitted over different paths.

Transmitting the channels over different paths includes transmitting the channels over different communication links.

Transmitting the channels over different paths includes transmitting the channels at different times.

Transmitting the channels over different paths includes transmitting the channels in different packets.

The channels are stored in different storage devices.

Recovering the source data includes correcting errors in the channels of encoded data, including using least N channels of encoded data to correct errors in at least m>M/2 other of the channels of encoded data.

In anther aspect, a method for distributed storage of data includes representing the source data as N channels of source data, each including a series of I entries. The N channels of source data are encoded to form N+M channels of encoded data, the channels of encoded data satisfying at least M×I independent parity equations, at least I entries of some of the channels of encoded data each being an argument to at least M of the parity equations. The N+M channels of encoded data are distributed to separate storages. At least some of the N+M channels of encoded data are retrieved from the separate storages. The entries in one or more channels of the N+M channels of encoded data are iteratively reconstructed using the retrieved channels, at each iteration applying one or more of the parity equations to received or reconstructed entries of the N+M channels of encoded data to reconstruct an entry in each of the one or more of the N+M channels. The source data is recovered using the reconstructed entries.

In another aspect, in general, a multiple corruptions and/or erasures in data storage or data communication systems are corrected. N of data fields each contain I of items. The data fields are distributed across the storage or communication system so as to contain typical errors or failures in as few fields as possible. An encoder generates M of parity fields. Each item of the generated parity fields is the result of simple exclusive-or operations on one item from one or more data fields and possibly one item from one or more of the other parity fields. The generated parity field operations are unique within the parity field, such that no two parity field operations within the same parity field share any data or parity item. The generated parity fields are independent of each of the other parity fields, such that no two parity field operations from two different parity fields share more than one item. The generated parity fields have a sufficient number of items such that the generated parity field's operations include every item of every data field. The generated parity fields have additional items, the additional items being the result of exclusive-or operations which include fewer than N data items, such that errors in data fields which are not included in those operations have no effect on the result of said operation. A decoder begins with the additional items of the generated parity fields, and regenerates as many as M missing or corrupted fields of either data or parity, item by item, using combinations of correct and previously corrected items as inputs to a cross-convolution of the M independent parity equations, to solve for and correct each missing or corrupted item in turn.

One or more of the following features can be included.

Each item is a bit and the exclusive-or parity operations are bit-wise.

Each item includes multiple bits, and the exclusive-or operations are bit-wise on one of the bits in each item is performed in parallel.

The parity fields are arranged alongside the data fields, and the parity equations of each parity field are generated along a straight line through items in both parity and data fields.

Each parity operation to generate a parity item contains one item from each of the other parity fields.

A first parity field is generated using parity operations including only data fields, and subsequent parity fields are generated using parity operations including data fields and the previous parity field.

The subsequent parity fields have only items whose equations include data fields, but do not have items whose equations cover only the additional items in previous parity fields, and wherein the previous additional parity items which are not included in the subsequent parity field are stored or transmitted using some reliable means.

The parity fields are arranged alongside the data fields, and the parity equations of each parity field are generated along a line which is straight through items in the data fields, but bends to an angle that is perpendicular to the parity fields.

The decoder uses an equation at the beginning or end of the data and parity fields, that include only correct items and one incorrect item, to correct the incorrect item.

The decoder uses another equation which includes only correct items, the previously corrected incorrect item, and one more incorrect item, to correct the second incorrect item.

The decoder proceeds through as many equations are necessary to correct one incorrect item from each data or parity field, establishing a new boundary of correct items.

The decoder repeats the above sequence to move the boundary of correct items through the data and parity fields, until all incorrect items in all fields have been corrected.

In another aspect, in general, an encoder enables correction of up to two incorrect fields. The encoder uses two parity fields, and the parity fields are arranged alongside the data fields, and the parity equations of each parity field are generated along a line which is straight through items in the data fields. A decoder combines a pair of equations at the beginning of the fields, which cross at one of the two incorrect fields, thus XORing the item from that field twice and canceling its incorrect value, and which equations cross the second incorrect field at two places, the first of which is before the data field and therefore has a given value, and the second of which is the first item in the data field. The decoder calculates the value of the item in the second incorrect field at the second equation crossing, in terms of the first given value and the other correct items in the equation, and not including the cancelled item from the first incorrect field, and repeating the above, moving the crossed equations forward through the field, using previously corrected items from the second incorrect field rather than given items from outside the field, until all of the items of the second incorrect field have been corrected. The decoder repeats the above but arranges the equations so that they cross on the second incorrect field, canceling it, and regenerates the first incorrect field from the correct fields and from given or previously corrected items from the first incorrect field, until all of the items in the first incorrect field have been corrected. Alternatively, the decoder regenerates the first incorrect field using standard parity equations on the correct fields and the now-corrected second incorrect field.

In another aspect, in general, an encoder enables correction of three incorrect fields. The encoder uses three parity fields, and the parity fields are arranged alongside the data fields. The parity equations of each parity field are generated along a line which is straight through items in the data fields, the slope of the line being defined as the item offset divided by the field offset between any two items on the line. The equation lines have slopes $k_0$, $k_1$, and $k_2$ respectively, such that $k_0<k_1<k_2$, and such that $k_1$ is equal $(k_0+k_2)/2$. A decoder combines one equation with slope $k_0$, denoted $L_0$, with one equation with slope $k_2$, denoted $L_2$, with two equations with slope $k_1$, denoted $L_{1L}$ and $L_{1H}$ such that the intersection of $L_{1H}$ and $L_0$ is on the first incorrect field, and the intersection of $L_{1H}$ and $L_2$ is on the second incorrect field, the intersection of $L_{1L}$ and $L_2$ being on the first incorrect field and the intersection of $L_{1L}$ and $L_0$ being on the second incorrect field, due to the relationship among the slopes of the lines, thus XORing the items from the first two incorrect fields twice and canceling their incorrect values, and such that the four equations cross the third incorrect field at four places, the first three of which are before the data field and therefore have given values, and the fourth of which is the first item in the data field. The decoder calculates the value of the item in the third incorrect field at the fourth equation crossing, in terms of the first three given values and the other correct items in the equation, and not including the cancelled items from the first and second incorrect fields. Repeating the above, the decoder moves the crossed equations forward through the field, eventually using previously corrected items from the third incorrect field rather than given items from outside the field, until all of the items of the third incorrect field have been corrected. The decoder repeats the above but arranges the equations so that they cross on the first and third incorrect field, canceling them, and regenerates the second incorrect field from the correct fields and from given or previously corrected items from the second incorrect field, until all of the items in the second incorrect field have been corrected. The decoder either repeats the above but arranges the equations so that they cross on the second and third incorrect fields, canceling them, and regenerates the first incorrect field from the correct fields and from given or previously corrected items from the first incorrect field, until all of the items in the first incorrect field have been corrected, or regenerates the first incorrect field using standard parity equations on the correct fields and the now-corrected second and third incorrect fields.

Incorrect bits in one data field can be detected by using the two crossed equations to cancel each field, one field at a time, until the remaining parity equations show no errors, such that the errors must be in the cancelled field.

Incorrect bits in up to two data fields can be detected by using the four crossed equations to cancel each pair field, one pair of fields at a time, until the remaining parity equations show no errors, such that the errors must be in the pair of cancelled fields.

Aspects can include one or more the following advantages.

In a system where data is stored in separate storage devices and/or transmitted across multiple communication channels (or at multiple different times or in multiple different packets) and where the storage devices and/or communication channels may fail or corrupt data, it is desirable to protect data from loss or corruption. An advantage over previous methods can include providing protection against more simultaneous failures using limited redundant data.

The data reconstruction, which is based on combination of parity equations, can be implemented as an XOR of delayed versions of the data channels using efficient hardware or software. The reconstruction approach can be more efficient than techniques based on more complex error correction approaches, such as Reed Solomon codes.

The approach can be extended to handle detection of M−1 error channels and reconstruct M error channels with the addition of M parity channels.

Data protection can be applied in storage and communication systems, as well as in tandem combinations of such systems.

Data protection is achieved with arbitrary numbers of failures with the least possible redundant data.

Detecting and correction of multiple data storage or communication failures is possible in situations which are undetected by other means.

Additional protection can be incrementally added to less-protected data, for example being added to data protected using standard parity protection.

Other features and advantages of the invention are apparent from the following description, and from the claims.

DESCRIPTION OF DRAWINGS

FIG. 1A is a block diagram.
FIG. 1B is a diagram of array representations of data.

DESCRIPTION

Figure 2:
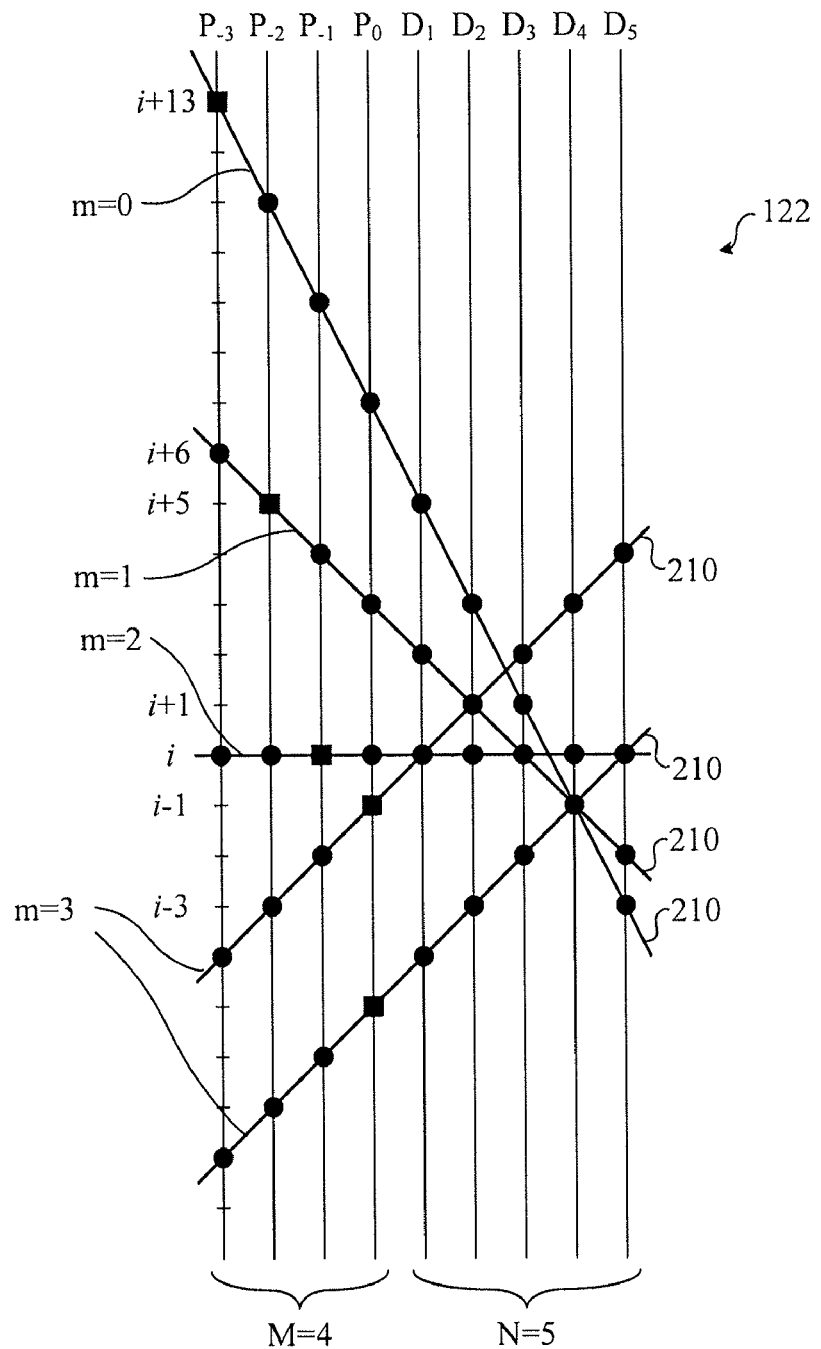
FIG. 2 is a diagram of an encoded array.

Referring to FIG. 1A, a distributed transmission and/or storage system 100 accepts source data 110, which is represented by the system as a finite length block of N parallel data channels (also referred as "fields"), each channel including a series of entries (or "items"). The data may be naturally divided into parallel data channels, or alternatively, the system 100 may segment the data into separate channels as part of its input processing. As an example, the data may represent audio/video recordings, which are stored by the system 100 for later transmission on demand to viewers serviced by the system. The system can segment a continuous stream into blocks. As an example, a continuous stream (e.g., a multimedia stream) may be segmented into 64 kilo-byte (KB) portions, each portion being divided into N=4 channels of 16 KB each (e.g., as a round robin), and each of the 8 bit positions generating one array of 64 kilo-bits (Kb) (i.e., 16 Kb per channel) of size N=4 and length I=16K.

A data encoder 115 of the system accepts the N parallel data channels of source data 110 and computes an additional M channels of redundant data that is generally based on parity computations on the source data. In some embodiments, the (N+M) parity encoded channels 120 are stored in a distributed storage system 125, for example based on magnetic disk storage devices. In one example, the separate storage devices may be implemented using separate computers on a data network, and the separate computers can be geographically distributed for added resilience against errors that are caused by geographically-localized phenomena (e.g., earthquakes). In other embodiments, the (N+M) channels are transmitted from the encoder 110 to the decoder 135 without storage (other than buffering in the transmission system).

Errors (i.e., corruptions and erasures) may be introduced in the data at a number of different points. For example, data errors may be introduced during transmission of data from the data encoder 115 to the storage devices 126. Once stored, data may be introduced within the storage devices themselves, for example, due to media faults in the devices or due to failures of entire devices. For example, with sufficiently large quantities of stored data, even with today's high data reliability rates, at least some errors are likely be introduced while that data is stored. Finally, data transmission errors may be introduced when the data is retrieved from the storage devices 126.

In addition to corruptions, typically characterized by incorrect binary digits in the data, data may be "erased" or be otherwise unavailable. Erasures are different then corruptions in that an erasure of a channel can be distinguished from incorrect data on that channel by a downstream decoder without having to apply an error detection algorithm, for example using multiple channels. For example, erasures can be indicated by side information (not illustrated) that indicates the status of a channel or a range of data within a channel.

The system 100 includes a data decoder/repairer 135, which receives the N+M 130 channels that may have errors from storage system 125, or alternatively directly (e.g., over imperfect transmission channels) from the data encoding module 115 if the data is not stored. This module serves functions including detection of errors in particular channels of the stored data, and based on the detected errors both reconstructs error-free data 140 for transmission to users of the data and optionally passes rebuilding data 145 for correcting errors that may be represented in the stored data to the distributed data 125. For example, if errors were introduced during transmission of data from the data encoding module 115 to the storage 125, or were introduced after the data was initially stored in the storage, the rebuilding data 145 is used to correct those errors so that if the same data is later read from the storage 125, it will no longer be in error.

The error-free data 140 can include all (N+M) channels (i.e., including the redundant channels), or alternatively only the original N channels are provided. Providing all (N+M) enables downstream application of further decoding and repair modules 135, for example to correct errors made during the downstream transmission or in subsequent storage of the channels.

Referring to FIG. 1B, the data encoder 115 and the corresponding data decoder/repairer 135 implement an encoding/decoding procedure that is generally applicable in situations in which source data 110 can be represented as a source array D 112.

In matrix D 112, an entry $D_{ni}$ represents a data value at row i column n (i.e., channel n), where the row indices range from 0 to I−1 and the column indices range from 1 to N. In the discussion below, the data values $D_{ni}$ are treated as binary digits but multibit values can be handled as well, for example, by processing each bit position separately or performing logical operations on an entire multibit word in parallel (i.e., FIG. 1B represents one bit of the multibit data). After encoding, the encoded data 120 is represented by a somewhat larger encoded array 122. The encoded array has M additional columns of redundant ("parity") data, with column indices for the redundant data ranging from −M+1 (the "leftmost") to 0 (the "rightmost") with entries $P_{mi}$, where −M<m≦0. Therefore, the column indices of the encoded array 112 range from −M+1 to N. $PD_{ni}$ denotes the entries of the original encoded matrix 112, such that $PD_{ni}=D_{ni}$ for n≧1 and $PD_{ni}=P_{ni}$ for n≦0.

The encoded array 122 includes a number of additional rows at row indices less than 0 and greater than or equal to I. In the data columns 1 through N, the values in the additional rows are defined to have zero entries (or alternatively are defined to have a pattern of values that will be known to the decoder without error). In the parity columns (i.e., columns −M+1 through 0), parity data in general extends for a number of rows before row 0, and for a number of rows after row I−1. As a definition, $firstbit_n$ is the first (lowest index) row that may have nonzero data in column n, and $lastbit_n$ is the row index of the last row that may have nonzero data in column n. For columns n=1 through n=N, $firstbit_n=0$ and $lastbit_n=I−1$. For parity columns n<0, $firstbit_n$ is generally less than zero and $lastbit_n$ is generally greater than I−1. The repaired data 140 can be represented as a repaired array 142, which has the same structure as the source array 112.

The encoding approach is applicable to situations in which errors are likely to remain within a limited number of columns. For example, this can be the case when each column is associated with a particular storage device, a communications channel, or a communications packet. In such situations, many errors might be expected to occur in the columns associated with those devices with no errors in other devices.

In various versions of the approach the data encoder produces a set of parity columns whose values are generated from a set of parity equations. Each parity equation forms a constraint on the entries to which it is applied (i.e., on the entries that appear in the equation, which are also referred to as the arguments of the parity equation). The encoding in these versions can be accomplished using various selections of bits for each parity equation. A preferred way to select bits for the parity equations is to select the bits is to establish straight lines across the data columns, with each parity equation using a line at a different slope. The parity equation for a line is the sum (modulo 2, or equivalently an XOR) of the values in the array that intersect the line. The parity equations for successive parity values in a particular parity column therefore correspond to parallel lines through the data and parity columns. Every data value (bit) is contained in one and only one of the parity equations for any particular parity column. That is, in general each data value is intersected by multiple parity equation lines, but at most one line associated with a particular parity column. Parity equations are independent. Therefore no two parity equations share (i.e., have lines that cross at) any more than one data or parity bit.

Since the parity equations crisscross with data columns and with each other, one general decoding method is to work from bottom to top, calculating each unknown data bit in a column, one at a time, from lower row index, known good or corrected bits in the same column, and known good or corrected bits from other columns, using the relationships established by the multiple, crisscrossing equations. This "cross-convolution" differs from other convolution approaches in that data column bits are not just generated from the column's own earlier values, but also from values in other columns.

1 Cross-Convolutional Encoding 1.1 Parity to Column Mapping

For notational simplicity, as introduced above, the extra parity values are indexed from m=0 through m=M−1. In one example which is carried through much of the discussion below, the m=0 parity value is stored in column index −M+1 and the m=M−1 parity value is stored in column index 0. For generality, we define a mapping $pcolL_m$ to be the column index in which parity value m is stored, and its inverse mapping $lpcol_n$ to be the index of the parity value that is stored in column n. In this example, definitions of $pcolL_m$ and $lpcol_n$ are provided in EQS. 1.1-1.2.

Each parity value in a row is associated with a line of a particular different slope. The rightmost parity uses the highest slope line, and the leftmost parity uses the lowest slope line.

Referring to FIG. 2, in an example with N=5 and M=4, the slopes of lines 210 increase with increasing parity index m and range from −2 to +1 for parity indices m=0 to m=3. The quantity $K_m$ denotes the slope of a line 210, denoted $L_m$, associated with parity index m.

1.2 Determine Firstbit and Lastbits for Parity

The definitions of the lines associated with the parity columns implicitly define the values of $firstbit_n$ and $lastbit_n$ for n≦0. A procedure to compute the firstbit and lastbit values is provided in PROC. 1.1. In the example with M=4 and N=5, and with line slopes $K_m$=−2, . . . , +1, the values of $firstbit_n$ are −2, −4, −5, −5, and the values of $lastbit_n$ are I+13, I+11, I+10, I+10, respectively. In other examples, different line slopes, for example ascending with increasing column index, result in different values of $firstbit_n$ and $lastbit_n$ for the parity columns.

Figure 3:
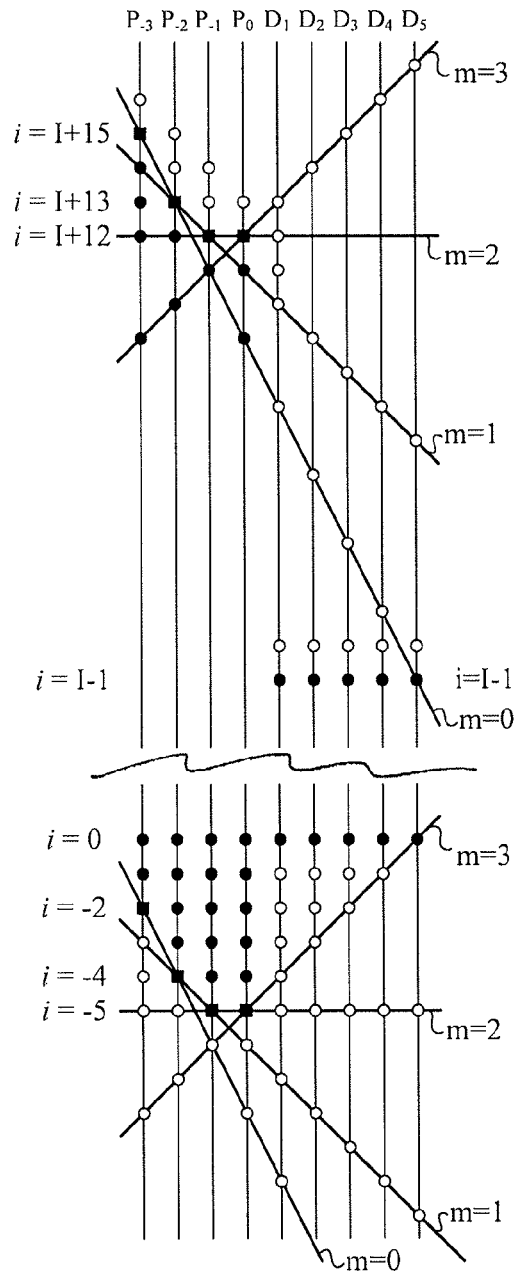
FIG. 3 is a diagram that illustrates computation for firstbit and lastbit values in a data array.

Referring to FIG. 3, the firstbits are computed such that in column n=0 (parity index m=3), $firstbit_0$ is −5 so that a line of slope +1 from $P_{0,-5}$ passes through the data value $D_{5,0}$. In column n=−1, $firstbit_1$ is −5 so that a line of slope 0 from $P_{-1,-5}$ passes through $P_{0,-5}$. In column n=−2, $firstbit_2$ is −4 so that a line slope of −1 from $P_{-2,-4}$ passes through $P_{-1,-5}$. Finally, in column n=−3, $firstbit_3$ is −2 so that a line of slope −2 from $P_{-3,-2}$ passes through $P_{-2,-4}$.

The lastbits are determined similarly.

1.3 Parity Bit Values

Referring to FIG. 2, a diagram illustrating encoded array 122 represents each column as a vertical line, in this example with M=4 parity columns and N=5 data columns. A set of exemplary parity lines 210 are illustrated, with the parity value associated with a line being indicated by a filled square and a data or parity value used to compute the parity value being indicated by a filled circle. For example, parity values with index m=1 are stored in column n=−2 and are associated with lines 210 of slope −1. For example, the parity value $P_{-2,i+5}$ is computed using parity values $P_{-3,i+6}$, $P_{-1,i+4}$, $P_{0,i+3}$, $D_{1,i+2}$, $D_{2,i+1}$, $D_{3,i}$, $D_{4,i-1}$, and $D_{5,i-2}$. With the computed parity values, and assuming data and parity values are defined to be zero outside the range of firstbit to lastbit for each column, the sum (modulo 2, or equivalently the logical XOR) of all values indicated along each line is zero. Note that each data value has M lines at different slopes passing through it and therefore is part of M separate (and linearly independent) parity equations. As is discussed more fully below, by having each value protected by M parity equations, up to M totally erased data columns can be reconstructed from the encoded parity values. A procedure to compute the parity values is shown in PROC. 1.2 which makes use of EQ. 1.3. For notation, the symbol ⊕ denotes an XOR operation or modulo 2 sum, and $^\oplus\Sigma$ denotes an XOR or modulo 2 summation of a series of values.

Note that PROC. 1.2 cannot be directly implemented as shown because some of the values on the right hand side of EQ. 1.3 have not yet been computed when a particular parity value in the iteration is to be computed. Therefore, PROC. 1.2 should be treated as "conceptual," with a specific encoding method that can be implemented being presented later in this description.

Note that in alternative embodiments, each parity line does not necessarily make use of all the parity values (i.e., only a subset of array entries intersecting a line are part of the associated parity equation), while each data value remains part of M separate parity equations. For example, a parity value index m=0 can make use parity values with indices m=1, 2, and 3, while the parity value at index m=1 can make use of values at m=2, and 3, the value at m=2 makes use of m=3, and m=3 does not makes use of any other parity values. Such an embodiment is described in the provisional application that is incorporated by reference.

2 Parity Edge Decoder

A first type of decoder addresses a situation in which M columns of an encoded array 122 are erased. That is, the decoder is given the column indices $e_0 < e_1 < e_{M-1}$ that need to be rebuilt and all the data in the remaining columns are assumed to be uncorrupted ("good").

As one of a number of alternative implementations of a decoding procedure, the following general approach is used:

Select the leftmost good column.

Starting at the leftmost good column, rebuild one bit of each of the erased columns moving outward (to left and to right from the leftmost good column), using lines in order such that $L_0$ is used for leftmost erased column and $L_{(M-1)}$ is used for rightmost erased column. The first bit position in the column to be rebuilt is based on the firstbits of the good columns.

If the leftmost parity column is good, start on the firstbit of that column and therefore $L_0$ will go from there to the leftmost erased column.

If the leftmost parity column is erased, and the leftmost good column is a parity column, start on the firstbit of the leftmost good column.

Otherwise, all of the parities are erased, and the leftmost good column is $D_1$ and therefore start on $D_1$ at the point where $L_{(M-1)}$ crosses $D_1$ and the firstbit of $P_0$.

Increment all bit numbers and repeat until all erased columns have had their respective lastbit rebuilt.

Note that as shown in the following examples an aspect of this approach is the use of a series of equations which are "tangents" to a curve that separates the data and parity space into two areas: below the curve are known good, assumed zero, or rebuilt bits, and above the curve are known good or erased bits. As each equation is applied, it includes one erased bit and one known good or already rebuilt bit along the curve, and other bits which are below the curve and therefore also known good or rebuilt.

2.1 Example (M=4, N=5, and all Parities are Erased)

Figure 4A:
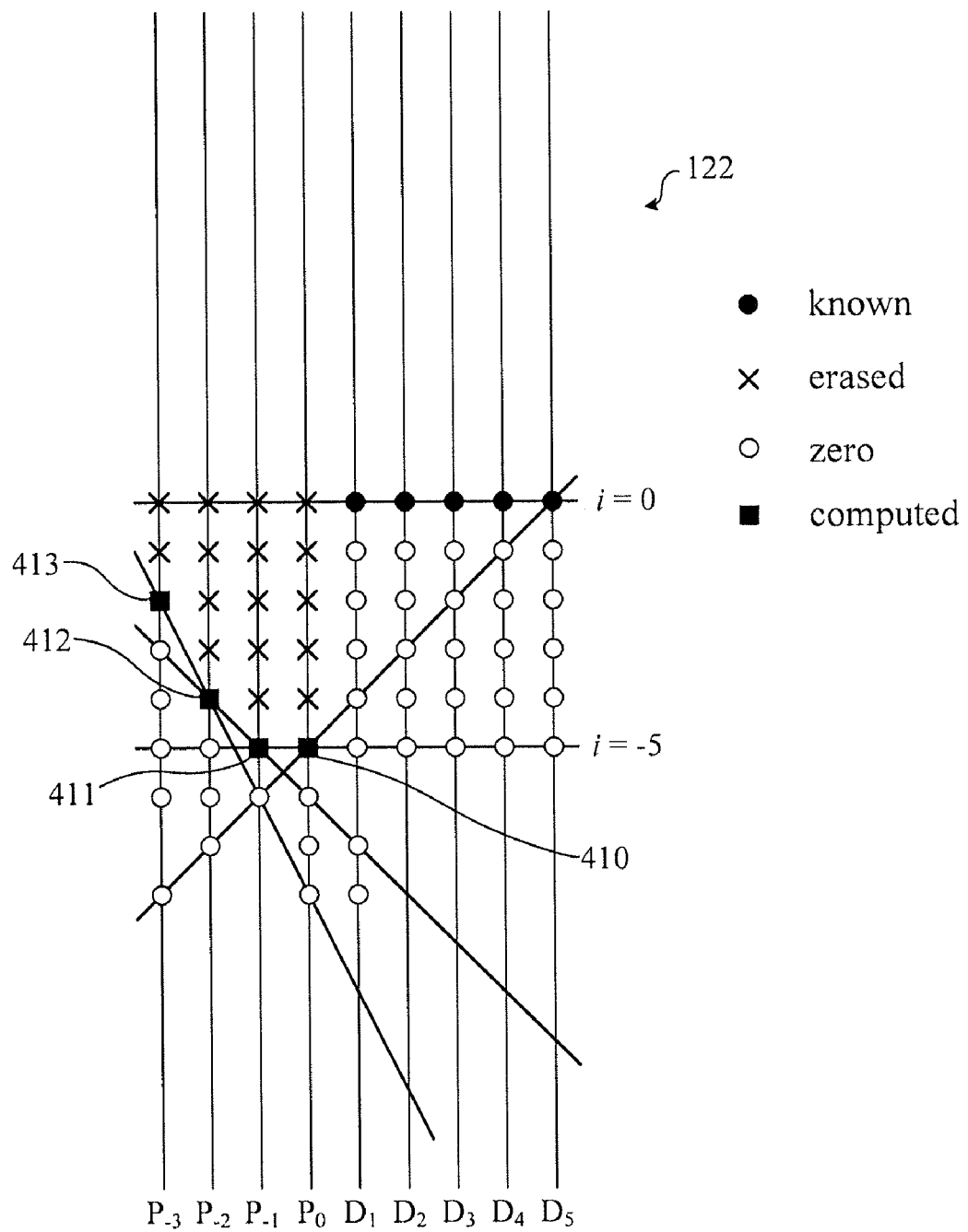
FIGS. 4A-B are diagrams of a data array that illustrate a decoding example.
Figure 4B:
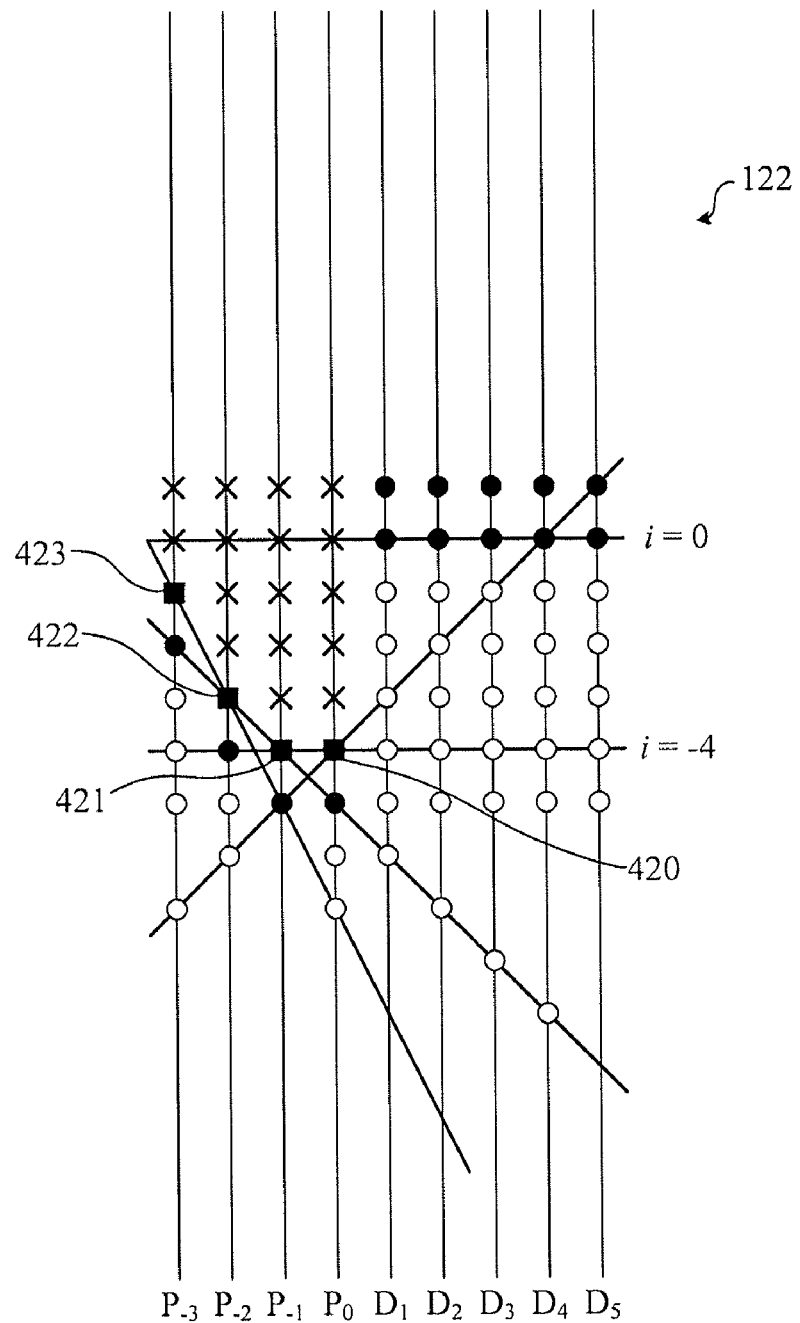

Referring to FIGS. 4A-B, in a first example of application of an edge decoder approach is in the case M=4, N=5, in which $e_0, \ldots, e_{(M-1)}$=−3, −2, −1, and 0. Note that all the data columns are error-free, and therefore this example also effectively demonstrates an approach to the initial generation of the parity columns.

Referring to FIG. 4A, the approach begins with rebuilding of the parity value $P_{0,-5}$ 410 based on a parity line $L_3$ of slope +1 passing through the known data value $D_{5,0}$ and other assumed zero values. Then $P_{-1,-5}$ 411 is rebuilt using $L_2$ of slope 0 passing through the rebuilt $P_{0,-5}$ value. Then $P_{-2,-4}$ 412 is rebuilt using line $L_1$ of slope −1, and finally $P_{-3,-2}$ 413 is rebuilt using a line $L_0$ of slope −2. In each case, the parity bit being rebuilt is the only unknown value on the parity line allowing it to be determined from the corresponding parity equation.

Referring to FIG. 4B, having rebuilt one value in each of the erased parity columns, the approach continues with a next iteration of rebuilding one value from each of the erased columns with rebuilding $P_{0,-4}$ 420, which is based on two data values $D_{4,0}$ and $D_{5,1}$ as well as the rebuilt parity value $P_{-1,-5}$. Then values $P_{-1,-4}$ 421, $P_{-2,-3}$ 422, and $P_{-3,-1}$ 423 are rebuilt in turn.

The iterations are continued until the last iteration in which the lastbit of each parity column is rebuilt.

2.2 Example (M=4, N=5, and the Rightmost 4 Data are Erased)

Figure 5:
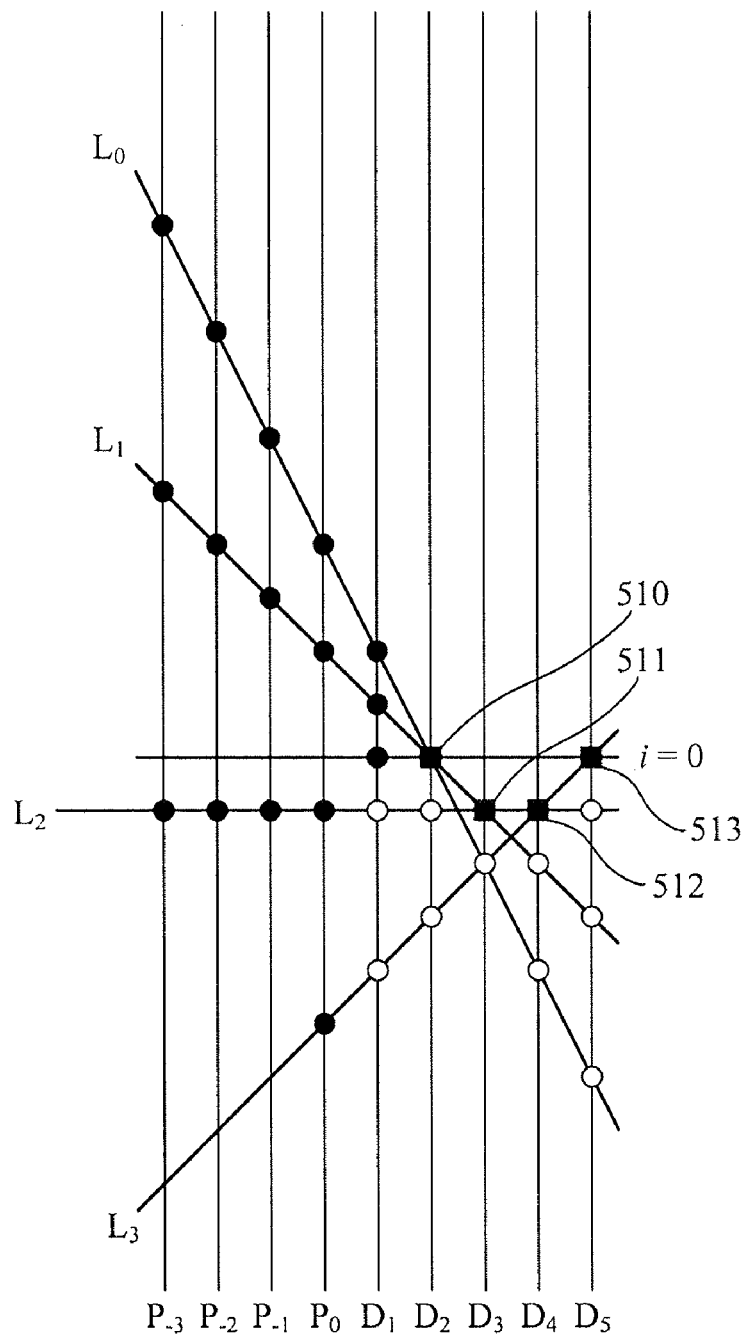
FIG. 5 is a diagram of a data array that illustrates a decoding example.

In a second example of application of an edge decoder, $e_0 \ldots e_{(M-1)}$=2, 3, 4, and 5. That is, the rightmost 4 data columns are erased. Referring to FIG. 5, lines $L_0$ through $L_3$ are used to rebuild values in columns $D_2$ through $D_5$, respectively. In the first iteration, $D_{2,0}$ 510 is rebuilt using known values in columns $P_{-3}$ through $D_1$. Next, using line $L_1$ of slope $-1$, $D_{3,-1}$ 511 is rebuilt using the newly rebuilt value of $D_{2,0}$. Next $D_{4,-1}$ 512 is rebuilt and finally $D_{5,0}$ 513 is rebuilt. At the next iteration, the next bit position in each column is computed in the same column order. Note that $D_{3,-1}$ 511 at the first iteration is known to be zero, so this initial re building is redundant, as is the rebuilding of $D_{4,-1}$ 512.

2.3 Example (M=4, N=5, and Some of Both Parity and Data are Erased)

Figure 6:
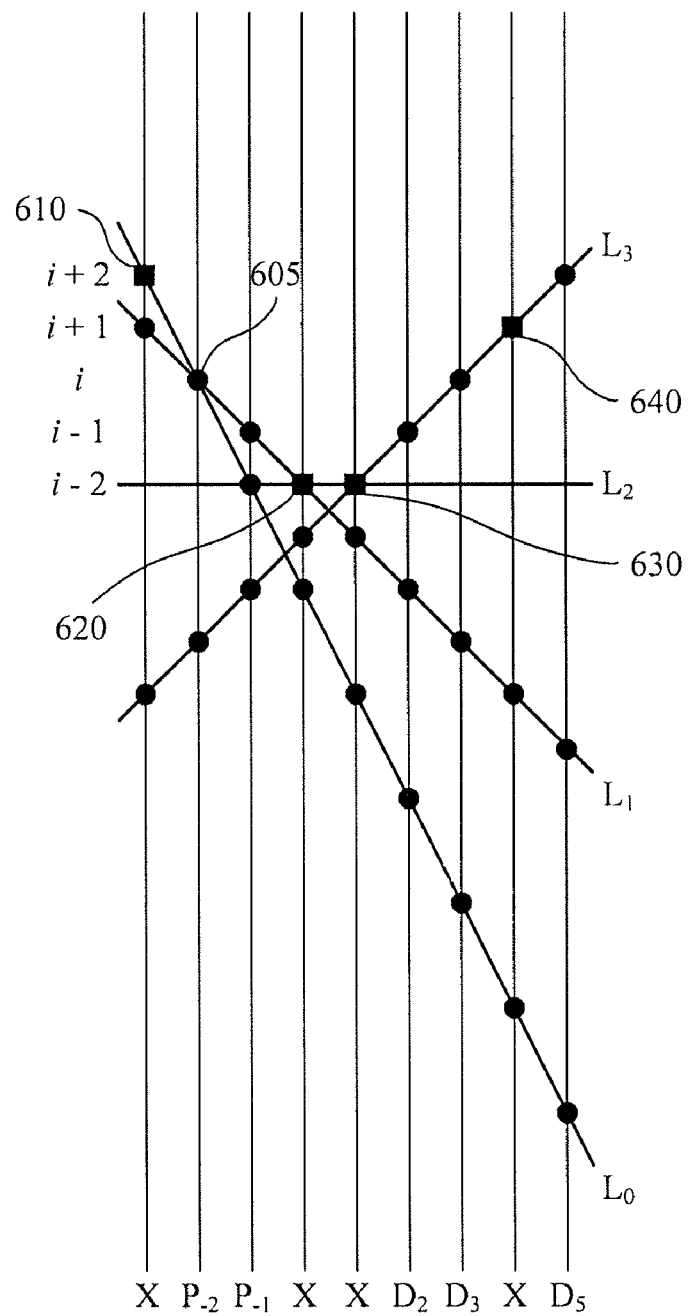
FIG. 6 is a diagram of a data array that illustrates a decoding example.

Referring to FIG. 6, in another example, the erased columns are defined by $e_0, \ldots, e_{(M-1)}$=−3, 0, 1, and 4. That is, both some parity columns and some data columns are erased. FIG. 6 shows an iteration which is rebuilding at some middle row of the data. The $P_{-2}$ column is the leftmost good column, with one erased column to the left, so $P_{-3}$ is rebuilt first, using $L_0$; $P_0$, $D_1$, and $D_4$ are then rebuilt, in that order, using lines $L_1$ to $L_3$, respectively. In all cases, only one bit along the line is erased, the others are either given, known good, or already rebuilt.

2.4 Implementation

A pseudocode implementation for a version of a parity edge decoder is provided in PROCS. 2.1-2.5. PROC. 2.1 determines the leftmostgoodcolumn. For example, in the example illustrated in FIGS. 4A-B, leftmostgoodcolumn=1, while in the example of FIG. 5, leftmostgoodcolumn=−3. Lefterrors is set to the number of erased columns to the left of the leftmostgoodcolumn. PROC. 2.2 is used to determine the firstbit for a number of the columns. For the parity columns, firstbit$_n$ is computed as in PROC. 1.1. The firstbit$_1$ value for the first data column $D_1$ may also be needed, and is defined based on the firstbit$_0$ value for the rightmost parity column and the slope $K_{M-1}$ of the most positive line $L_{M-1}$. For example, for the examples in FIGS. 4A-6, $K_3$=+1, firstbit$_0$=−5 and therefore firstbit$_1$=−4. Lastbit$_n$ for data columns n=1, . . . , N is defined to be the end of valid data at row I−1.

PROC. 2.3 defines the starting point for the iteration. The first bit of the leftmost good column defines this starting point. The starting rows for each of the erased columns $e_m$ are defined by this firstbit and the slopes of the parity lines in PROC. 2.4. In PROC. 2.4, erased columns to the left of the leftmost good column are handled separately from those on the right because the order of rebuilding is "outward" from the leftmost good column.

For instance, in the example in FIGS. 4A-B, all the parity columns are erased and lefterrors=4. The order of the rebuilding in this example is $r_0$=0, $r_1$=−1, $r_2$=−2, $r_3$=−4 with the first rebuilt row in each column being the firstbit of the column.

In the example of FIG. 5, the erased columns are the four rightmost data columns. In this example according to PROC. 2.4, the order of rebuilding is $r_0$=2, $r_1$=3, $r_2$=4, $r_3$=5. The first reconstructed column, $D_2$, has a first reconstructed row that is at slope $K_0$=−2 from the firstbit of the leftmost good column, which in this example is $P_{-3,-2}$. That is, $D_{2,-12}$ is the firstbit position to be rebuilt. The firstbit to be rebuilt in column $D_3$ is at slope $K_1$=−1 from $D_{2,-12}$, or at $D_{3,-13}$. Similarly the first rebuilt bits of the remaining columns are $D_{4,-13}$ and $D_{5,-12}$. Note that these starting rows are somewhat conservative because a first number of iterations "rebuilds" assumed zero entities, and it is not until the iteration shown in FIG. 5 that the first real data is reconstructed.

PROC. 2.5 represents the rebuilding loop. For precision of presentation, the variables P, D, and PD refer to the original uncorrupted quantities in the good columns and the incorrect or erased (taken to have value zero) and not yet rebuilt values in the remaining columns. The variable X refers to a rebuilt value and is defined only for the columns being rebuilt, and the variable XPD refers to the rebuilt value X or the original good value PD depending on the column.

In PROC. 2.5, each iteration updates the M erased columns. The procedure implements EQ. 2.5, which corresponds to the parity equation used to rebuild one entry. The iterations are continued until the lastbit of each of the erased columns are rebuilt.

3 Syndrome Edge Decoder

Implementations of the Parity Edge Decoder described in the previous section can require a memory window buffer for columns of the parity and data, where the window width W is equal to the number of rows needed for the steepest equation across all columns. This is at least 1×(N+M), and is typically (M/2)×(M+N). The buffer stores all of the data and parity bits (M+N) in the window, so the total storage is (M+N)×W, or typically (M/2)×(M+N)×(M+N) bits to hold all of the good and rebuilt data and parities.

Figure 7:
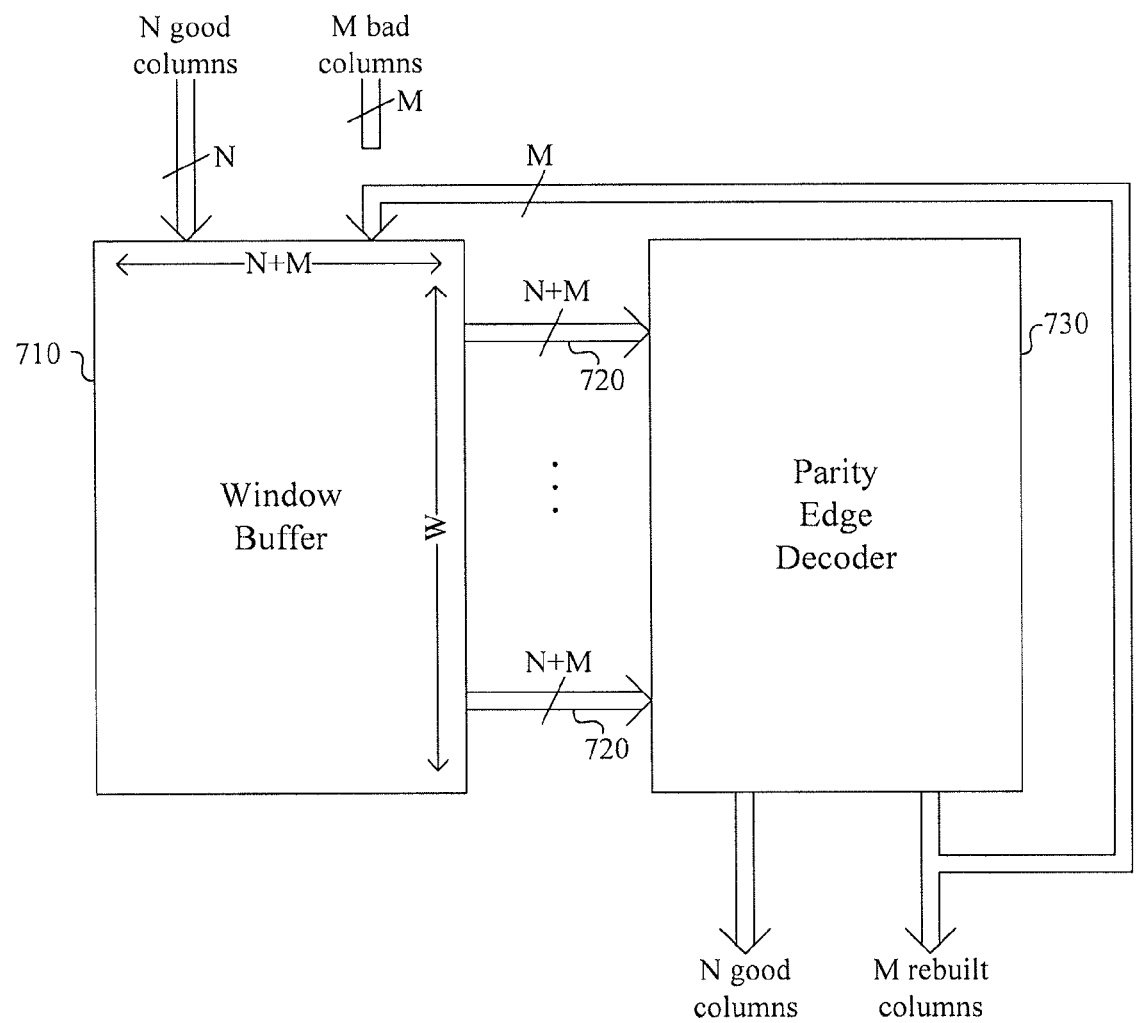
FIG. 7 is a diagram of a Parity Edge Decoder.

Referring to FIG. 7, a parity edge decoder 730 make use of a window buffer 710 that provides W delayed samples 720 of N+M good or rebuilt values to the decoder. The good parities can be precalculated by generating "enhanced syndromes," which are conventional syndromes with the bad (erased) columns removed (i.e., not included in the parity sum). By precalculating and storing the enhanced syndromes, only M syndrome bits and the M rebuilt bits are stored across the window, so the storage requirement is reduced to 2×M×W.

The conventional syndrome is defined as the right hand side of equation EQ 1.3 XOR'd with the left hand side (the parity result). This results in a syndrome value of 0 when all parity and data bits are correct. The location of the syndrome bit for a particular parity equation is arbitrarily defined to be at the row and column indexes of the parity value for the corresponding parity line.

Referring to PROC. 3.1, the conventional syndrome bits $S_{pcolL_{m,j}}$ are computed in a similar iteration as used to compute the parity values during encoding. Referring to PROC. 3.2, an enhanced syndrome, ES, is computed as is the conventional syndrome with the erased columns removed; i.e., it does not include columns $e_0 < e_1 < \ldots e_{(M-1)}$.

Figure 8:
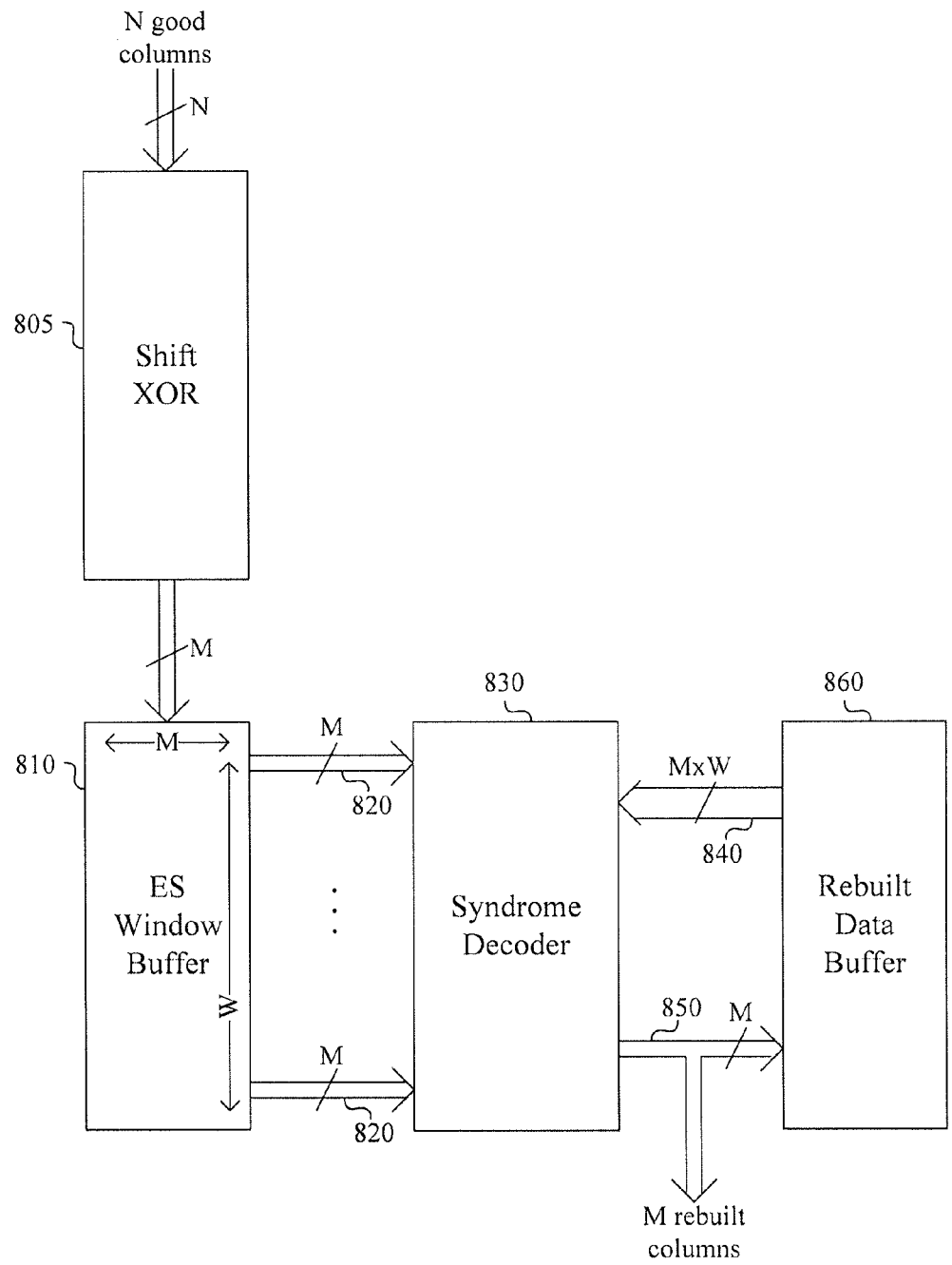
FIG. 8 is a diagram of a Syndrome Edge Decoder.

Referring to FIG. 8, in an implementation of a syndrome edge decoder, N good columns are passed through a shift XOR module 805 which outputs a stream of M enhanced syndromes per time step. The enhanced syndromes are buffered in a window buffer 810, which passes W delayed versions of M enhanced syndromes to the syndrome edge decoder 830. As the decoder rebuilds the erased columns they are passed to a rebuilt data buffer 860, from which the syndrome edge decoder 830 retrieves the rebuilt data as needed.

To rebuild up to M erasures on columns $e_0 < e_1 < e_2 < \ldots e_{(M-1)}$, the syndrome edge decoder uses essentially the same procedure as parity edge decoder, but uses the enhanced syndromes in place of the good columns as shown in PROC. 3.3.

4 Parity Error Canceling Decoder

In general, the Parity Edge Decoder and Syndrome Edge Decoders described above rebuild one bit from each bad column before moving on to a next iteration step to rebuild the next bit in each column. For at least some values of M, which are described in more detail below for M=2 through 5, a Parity Error Canceling Decoder can ignore all but one of the bad columns while rebuilding the remaining bad columns, thereby enabling possible parallel implementations in which different erased columns are rebuilt in parallel. A general approach for handling any value of M is also presented below.

In general, the Parity Error Canceling Decoder approach combines a particular set of parity equations to create crossing points on the columns to be ignored, such that at each of the crossing points an even number of lines intersect. This results in the bit from those intersecting positions are XOR'd twice (or a multiple of two times) into the result, which cancels it. The parity equations cross the column to be rebuilt in more than one place; the highest (latest) crossing point is rebuilt in terms of the lower (earlier) ones, which were rebuilt on previous passes of the iteration. The iteration starts on the firstbit of the column to be rebuilt, so that all previous bits are given, and finish when we have rebuilt the lastbit of the column.

For the M=3 case, the approach can be demonstrated under a restriction on the values of the slopes k of the lines, such that the parity line slopes satisfy $k_1 = (k_2 + k_0)/2$. Note that this does not imply that $k_1$ must be 0, or that $k_0$ and $k_2$ must have opposite sign. The geometry can be warped in many ways as long as the slope of $L_1$ equals the average slope of $L_0$ and $L_2$.

4.1 Example with Two Bad Columns with M=2, N=4

Figure 9A:
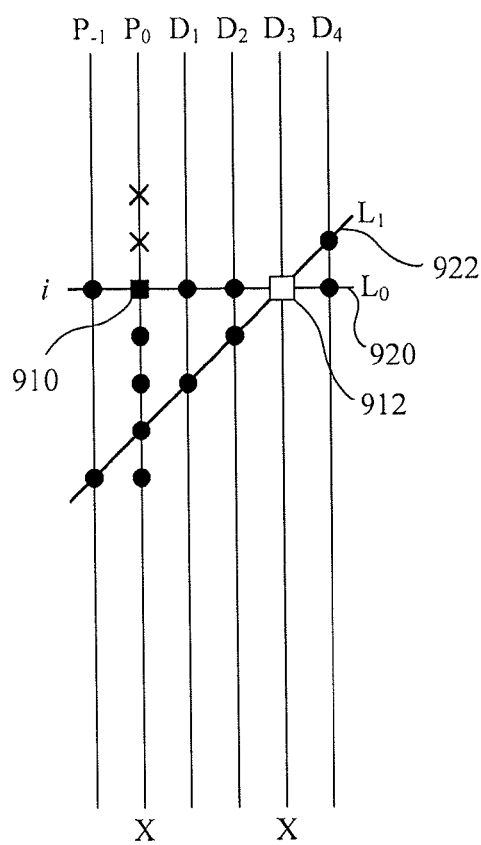
FIGS. 9A-B are diagrams of a data array that illustrate a decoding example.
Figure 9B:
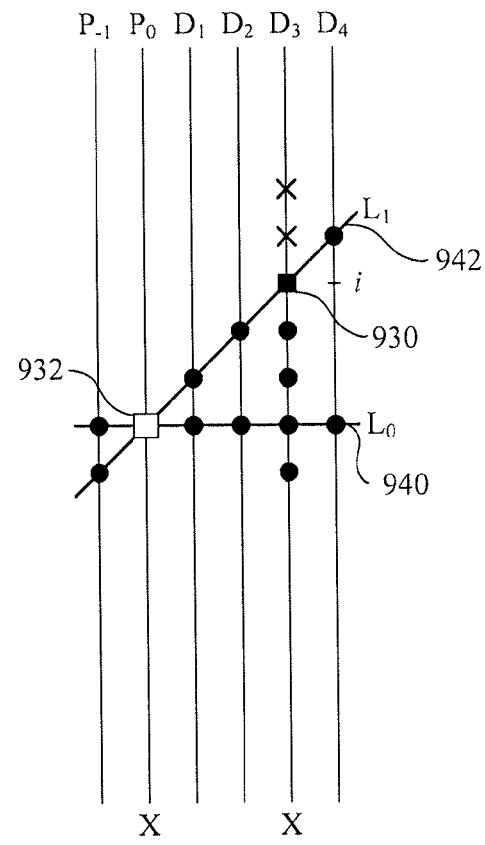

Referring to FIGS. 9A-B, in an example with M=2 and N=4, columns $P_0$ and $D_3$ are erased and the remaining columns are good. Referring to FIG. 9A, rebuilding column $P_0$ is performed for each row in sequence such that when rebuilding $P_{0,i}$ 910, prior values of $P_0$ have already been rebuilt while following values remain to be rebuilt. Two parity equations are added together, one with parity line $L_0$ 920 and one with line $L_1$ 922, such that an erased value $D_{3,i}$ 912 is cancelled and does not contribute to the sum. Referring to FIG. 9B, similarly, a value $D_{3,i}$ 930 is rebuilt by adding the two parity equations on lines $L_0$ 940 and $L_1$ 942 such that $P_{0,i-3}$ 932 is cancelled. By forming the combinations of parity equations $L_0$ and $L_1$ with suitable offsets, each erased column $P_0$ and $D_3$, can be rebuilt independently, for example in parallel.

4.2 Example with Three Bad Columns with M=3, N=3

Figures 10A, 10B, 10C:
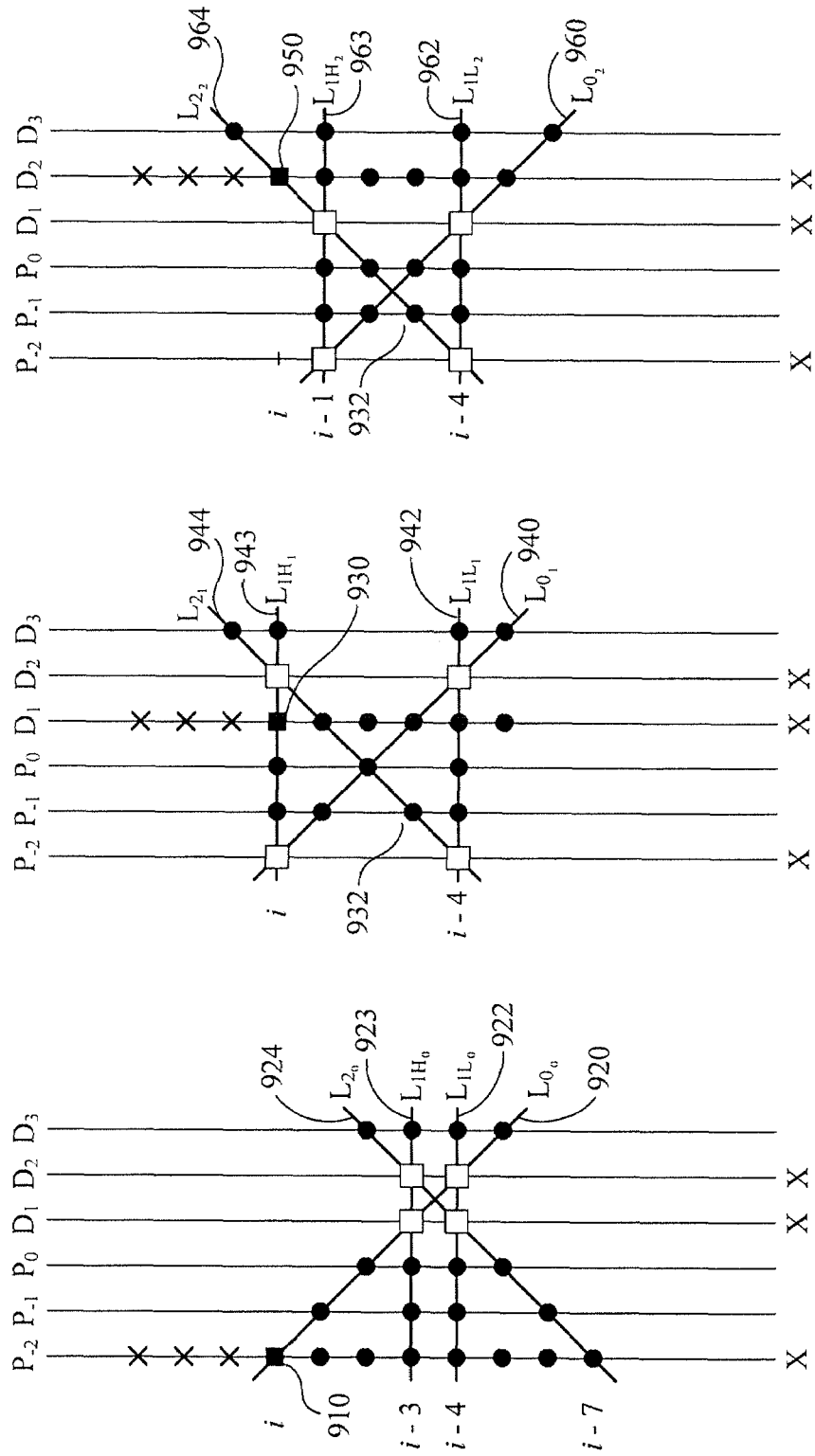
FIGS. 10A-C are diagrams of a data array that illustrate a decoding example.

Referring to FIGS. 10A-C, the approach illustrated in FIGS. 9A-B is extended to forming linear combinations of three parity equations in order to cancel values in two of three erased columns at a time. In this example, columns $P_{-2}$, $D_1$, and $D_2$ are erased and have to be rebuilt.

Referring to FIG. 10A, in order to rebuild $P_{-2,i}$ 910, three parity lines are combined: $L_0$ 920, $L_1$ 922, $L_1$ 923 (i.e., a second line $L_1$ with a different row offset), and $L_2$ 924. This combination of parity lines results in canceling the terms on those parity lines in erased columns $D_1$ and $D_2$. That is, the data values $D_{1,i-3}$, $D_{2,i-3}$, $D_{1,i-4}$, $D_{2,i-4}$, are all cancelled out when rebuilding $P_{-2,i}$ 910. Referring to FIG. 10B, $D_{1,i}$ 930 is rebuilt with lines $L_0$ 940, $L_1$ 942, $L_1$ 943, and $L_2$ 944, thereby canceling the entries on the parity lines in columns $P_{-2}$ and $D_2$. Referring to FIG. 10C, entry $D_{2,i}$ 950 is similarly rebuilt using lines $L_0$ 960, $L_1$ 962, $L_1$ 963, and $L_2$ 964. Referring back to FIG. 10A, note that in rebuilding $P_{-2,i}$, three previously rebuilt values in column $P_{-2}$ are used: $P_{-2,i-3}$, $P_{-2,i-4}$, and $P_{-2,i-7}$.

4.3 Offsets of Parity Equations

As in the definition of an enhanced syndrome offset, the base row index (also referred to as the "base offset") of a line L is defined as the row index of the parity bit calculated along line L. In these approaches, the base offset of a line is found by calculating the offsets from the error point along lines; then moving to the base of a line, then to the crossing point of that line with the next line, then to the base of that next line, then to another crossing point, etc., until the base of the desired line is found. In the three-line paths, there are two ways to get to the end depending on the order of lines used, shown below as a choice of equations.

PROCS. 4.1-4.3 provide approaches to determine the parity line offsets for the M=3 erasure case.

4.4 Rebuild Error Bit $X_{e_{m,i}}$

Recall that syndrome $S_{pcolL_{m,i}}$ contains all of the points along the line $L_m$ with slope $k_m$, and containing point $P_{pcolL_{m,i}}$ (the base of the line) as defined in EQ. 3.1:

We define syndromes with rebuilt bits $XS_{pcolL_{m,i}}$ as the points on line $L_m$ with slope $k_m$, based at offset i and using XPD to including rebuilt bits as defined in EQ. 4.1. Note that the rebuilt bits referred to in EQ. 4.1 are those rebuilt thus far, therefore will include erased bits if they are later than have been rebuilt at the point that the syndrome is calculated.

For M=2, we can rebuild error bits $X_{e_{m,i}}$ in columns $e_m$, where m=0 or 1, using the points (as contained in the rebuilt syndrome) on lines $L_m$ with the proper bases for each error m, according to PROC. 4.4A. For M=3, we can rebuild error bits $X_{e_{m,i}}$ in columns $e_m$, where m=0, 1, or 2, using the points (as contained in the rebuilt syndrome) on lines $L_m$ with the proper bases for each error m according to PROC 4.4B.

Note that using the $XS_{pcolL}$ terms is a shorthand for the XOR of all of the points on the line, and must be calculated on each iteration since it includes recently rebuilt bits. The bit being rebuilt is XOR'd into the final answer to cancel its presence in one of the XS terms; this could be optimized by removing the bit from the XS term first and not XORing it afterwards.

4.5 General Cancellation Approach

Figure 23A:
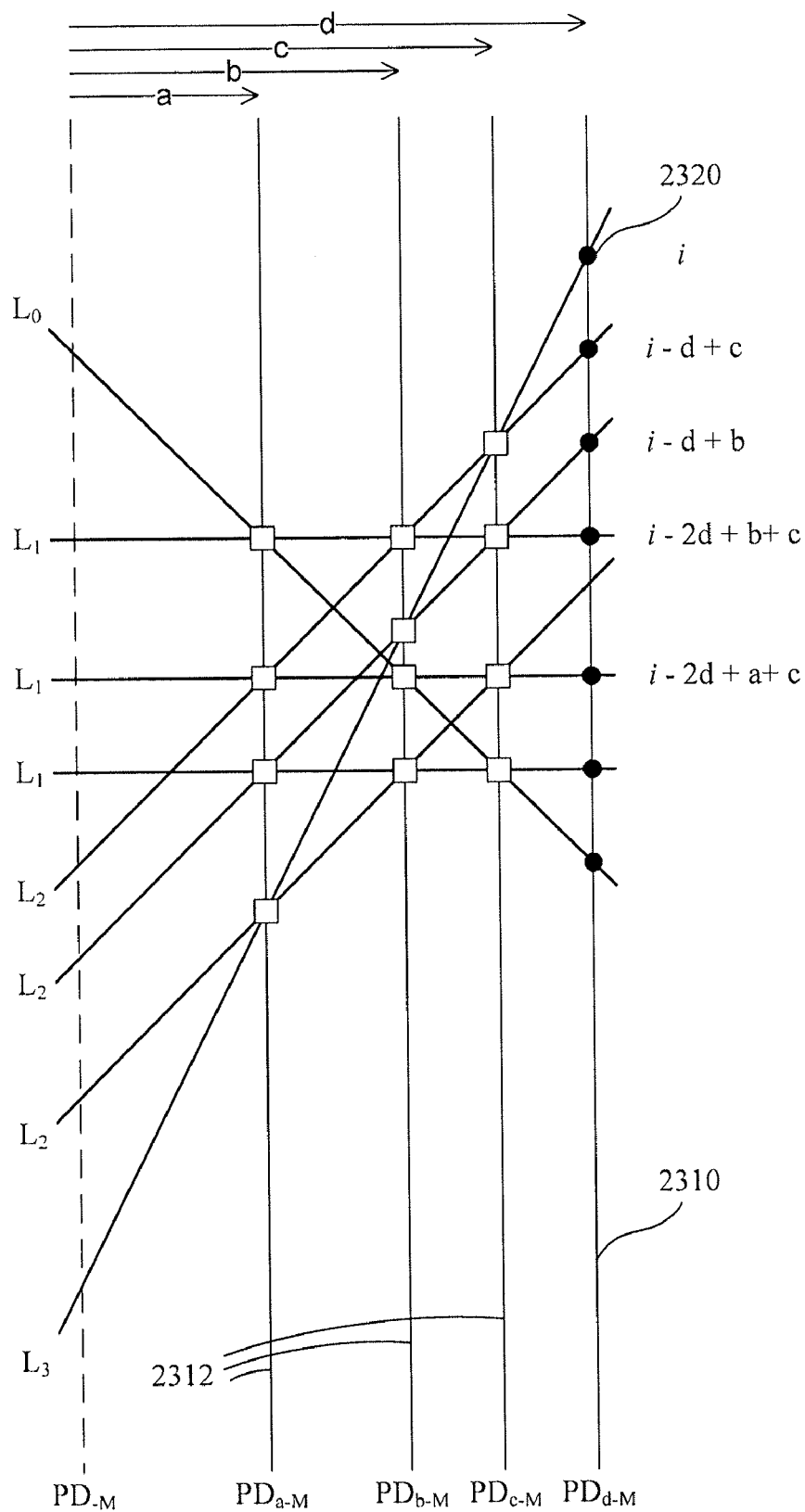
FIG. 23A is a diagram of a data array that illustrates a decoding example.
Figure 23B:
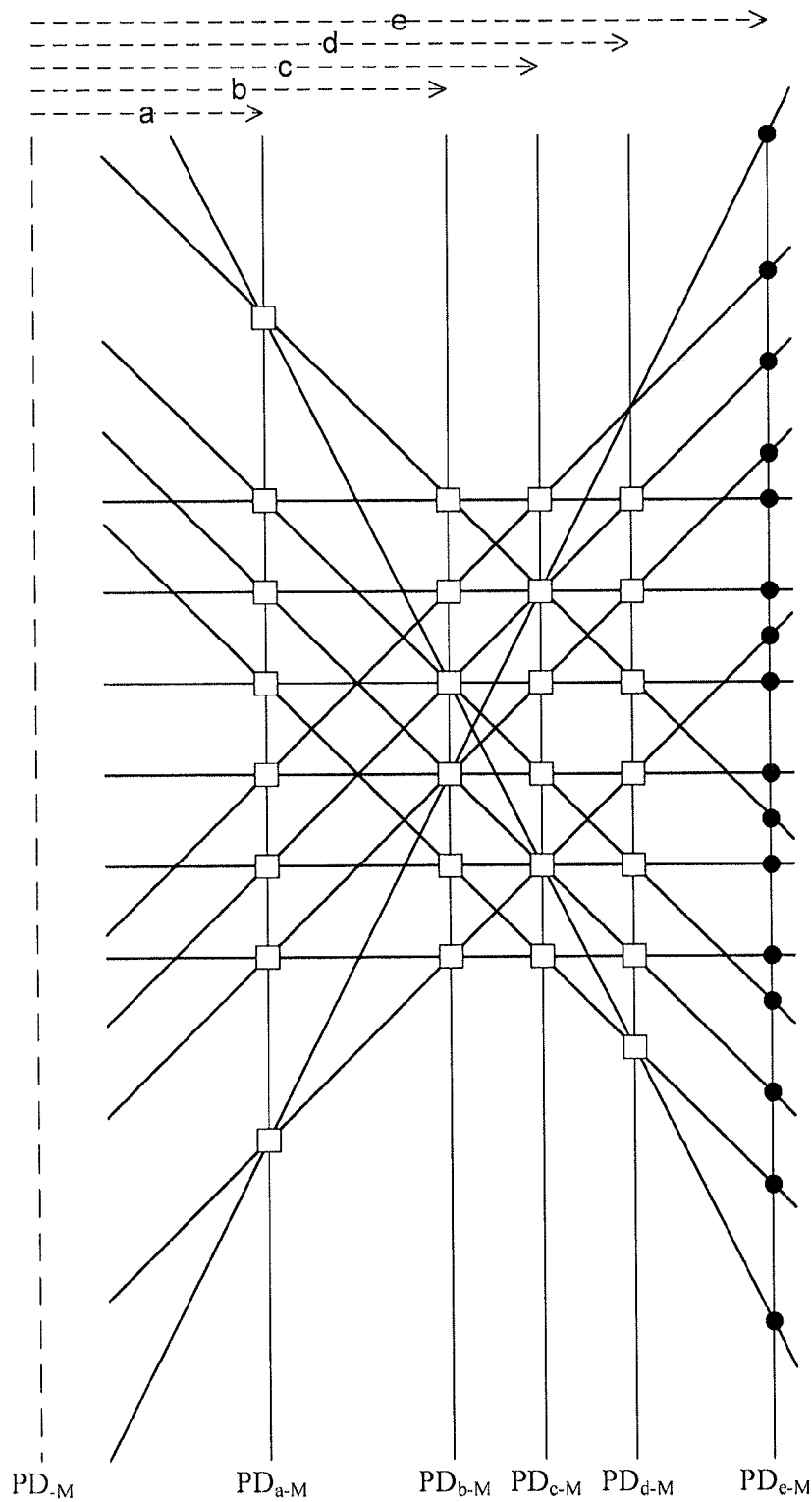
FIG. 23B is a diagram of a data array that illustrates a decoding example.

Approaches to cancellation of M−1 columns while reconstructing an $M^{th}$ column for the cases of M=4 and M=5 are illustrated in FIGS. 23A and 23B, respectively. In the example illustrated in FIG. 23A, the columns being cancelled 2312 are offset from the leftmost column by a, b, and c columns (i.e., columns $PD_{a-M}$, $PD_{b-M}$ and $PD_{c-M}$ according to the previously introduced notation), while the column 2310 being reconstructed is offset by d columns (i.e., $PD_{d-M}$). In this example, an entry 2320 is reconstructed based on parity equations, each of which includes each of the M columns that are being cancelled or reconstructed. Note that by suitable choice of offsets of lines $L_0$ through $L_3$ of slopes −1 through +2 respectively, the sum of the illustrated parity equations cancels all entries in those equations in columns at offsets a-c, and includes entries in the column at offset d that have been previously reconstructed (or are known to be zero).

One approach to determining the parity lines to combine makes use of a geometric construction. For example, a line $L_3$ is first chosen to pass though the entry 2320 to be reconstructed. Then a line $L_2$ is chosen to cancel the entry in the column at offset c. Lines are successively chosen to implement the cancellation until all entries in the columns at offsets a-c are cancelled.

Referring to FIG. 23B, an example for M=5 also makes use of a geometric construction to select the appropriate combination of parity equations. Note that some entries in the columns being cancelled include four parity equations, resulting in cancellation of those entries.

Other related approaches can be used, for example, based on guided or brute-force iterative searches for suitable sets of parity equations, and selection of a best set of equations, for example, to optimize an amount of resulting delay or buffering. As another approach, a basis for combinations of parity equations that cancel particular subsets of columns can be determined based on matrix algebraic techniques (over the field of numbers modulo 2) to identify the sets of parity equations that sum to zero (modulo 2) in the selected columns. The selection of parity equations for particular subsets of columns to cancel can be precomputed and stored in the system, so that an appropriate combination of parity equations can be selected based on the columns that need to be cancelled without requiring computation to determine the combination at runtime.

5 Syndrome Error Canceling Decoder

Like the Parity Edge Decoder, the Parity Error Canceling Decoder can be implemented using a buffer of (N+M) times the window width to hold all of the good and rebuilt data and parities. Since new bits are calculated using earlier bits, the syndromes must be recalculated as each new bit is calculated. Like the Syndrome Edge Decoder, a more efficient method, the Syndrome Error Canceling Decoder, can be implemented using syndromes. There are several differences, however. Since we will eventually cancel the bad columns, we can use conventional syndromes (defined by EQ. 3.1) which include all of the data columns, and don't have to calculate special enhanced syndromes based on the error columns.

But, since we will correct all of the bits in one column before going on to the next, we will calculate all of the syndromes before rebuilding any bits; this means that the syndromes will contain bad data from earlier (predecessor) bits, where the syndrome equations cross the column we are rebuilding. Therefore, those bad bits are cancelled, and the corrected bits are added in to make the rebuilt bit correct.

Figure 11A:
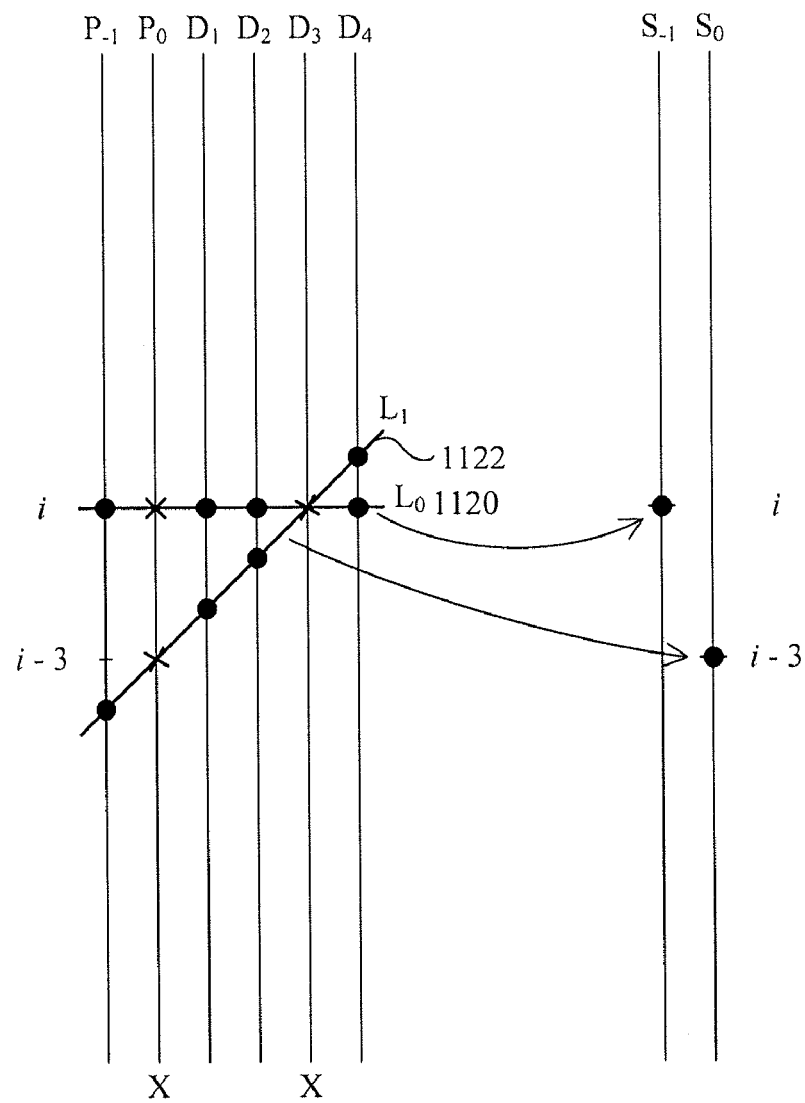
FIGS. 11A-B are diagrams of a data array that illustrate syndrome calculation.
Figure 11B:
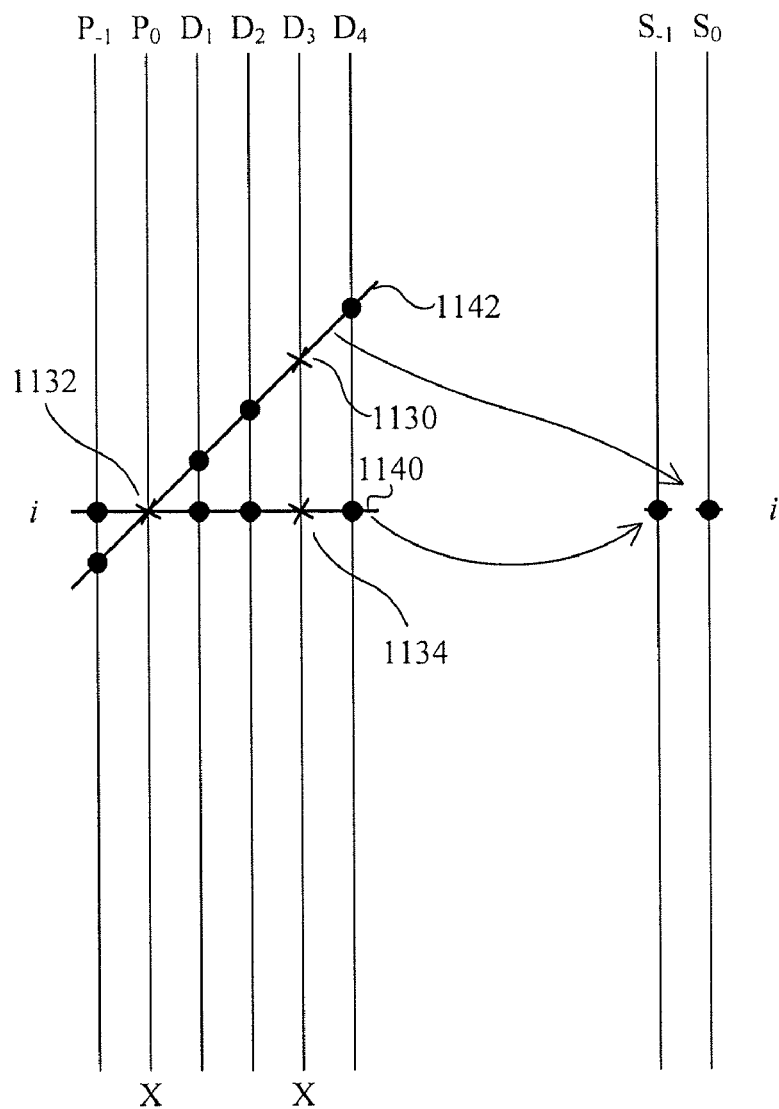

Referring back to FIG. 9A, to rebuild a value $P_{0,i}$ 910, values on two lines $L_0$ 920 and $L_1$ 922 are used to rebuild the value. Referring to FIG. 11A, which corresponds to FIG. 9A, syndromes $S_{-1,i}$ and $S_{0,i-3}$ are equal to the sums (XORs) of the entries along the lines $L_0$ 1120 and $L_1$ 1122, respectively. Note that the sum (XOR) of the entries on line $L_1$ 922 in FIG. 9A differs from the sum of entries on line $L_1$ 1122 in FIG. 11A in that the corrected value $XP_{0,i-3}$ is used in FIG. 9A while the errorful $P_{0,i-3}$ is used in FIG. 11A.

Therefore, to obtain the sum along line $L_1$ 922, $P_{0,i-3}$ is added to $S_{0,i-3}$ to cancel that value, and the rebuilt $X_{0,i-3}$ is added to introduce the desired value. The row offsets of these predecessor values are computed for the case M=3 according to PROC. 5.1-5.3.

5.1 Rebuilding a Bit $X_{n,i}$ at Offset i on One of 2 Bad Columns with M=2

For the M=2, we rebuild error bits $X_{e_{m,j}}$ in columns $e_m$, where m=0 or 1, using two syndromes $S_{pcolL_0}$ and $S_{pcolL_1}$ with the proper bases, the bad predecessor bits PD (that are already in the syndromes), the rebuilt predecessor bits X, and the bad error bit $PD_{e_m}$ for the error m using PROC. 5.4 and 5.5.

For M=3, we rebuild error bits $X_{e_{m,j}}$ in columns $e_m$, where m=0, 1, or 2, using four syndromes $SpcolL_{0_m}$, $SpcolL_{1H_m}$, $SpcolL_{1L_m}$, and $SpcolL_{2_m}$ with the proper bases, the bad predecessor bits PD (that are already in the syndromes), the rebuilt predecessor bits X, and the bad error bit $PD_{e_m}$ for the error m using PROC. 5.5A-C.

Figure 12:
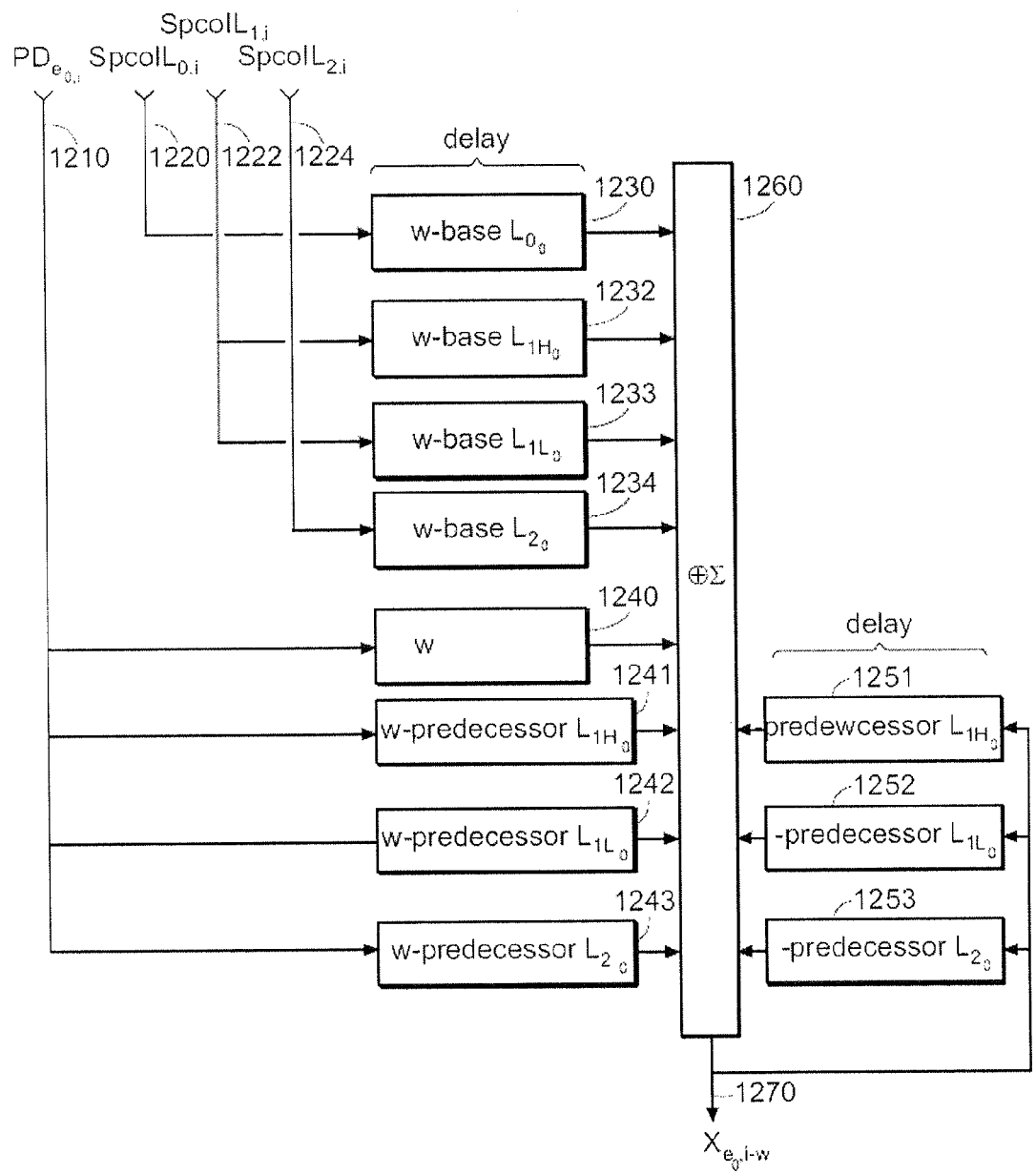
FIG. 12 is a block diagram of a decoder.

An example implementation for the $X_{e0}$ output (EQ. 5.3) of a syndrome canceling decoder is shown in FIG. 12. The boxes are shift registers, which create a delay (or negative offset) for each register bit. The three syndrome fields 1220, 1222, and 1224 and the actual value of the $PD_{e0}$ field 1210 are inputs, but are delayed in the shift registers before being XOR'd together in block 1260. The corrected output $X_{e0}$ is fed back again through shift registers to be XOR'd also.

Since the predecessor values in EQ. 5.3 are already negative offsets, the delta values are set to the negative of the predecessor value, to create a positive delay, and thus the originally intended negative offset.

The base values are often negative offsets, but can be positive. Since a shift register cannot have a negative number of bits, a window size W is added to each syndrome shift register. To keep everything even, we have to add that same delay to all of the input shift registers. The window size W is used since the base of a line can be W ahead of the $X_{e0}$ bit at most. An option is to reduce this window, since the base in actuality will not quite get as far as W ahead of any $X_{e0}$.

6 Partial Cross-Convolutional Encoding

The decoding methods described above generally use the fully cross-convolved encoding as defined in EQ. 1.3. That is, all of the data and other parity bits along a parity line are included in the parity bit for that line. Therefore while up to M data columns can be rebuilt, all N+M data rows are read to rebuild any number of columns, even in the typical case where only one column is erased. The choice of value for M must be made before any parity bits are calculated, since all parity bits are included in all other parity bits' equations.

A further method, referred to as Partial Cross-Convolutional Encoding, allows limited reading of parity columns (the same number of parity columns as there are erased columns to be rebuilt), and which allows incremental addition of parity columns without re-encoding previous ones. These parity values are define in PROC 6.0, in which EQ. 6.1 replaces EQ. 1.3 in PROC 1.2.

Figure 13:
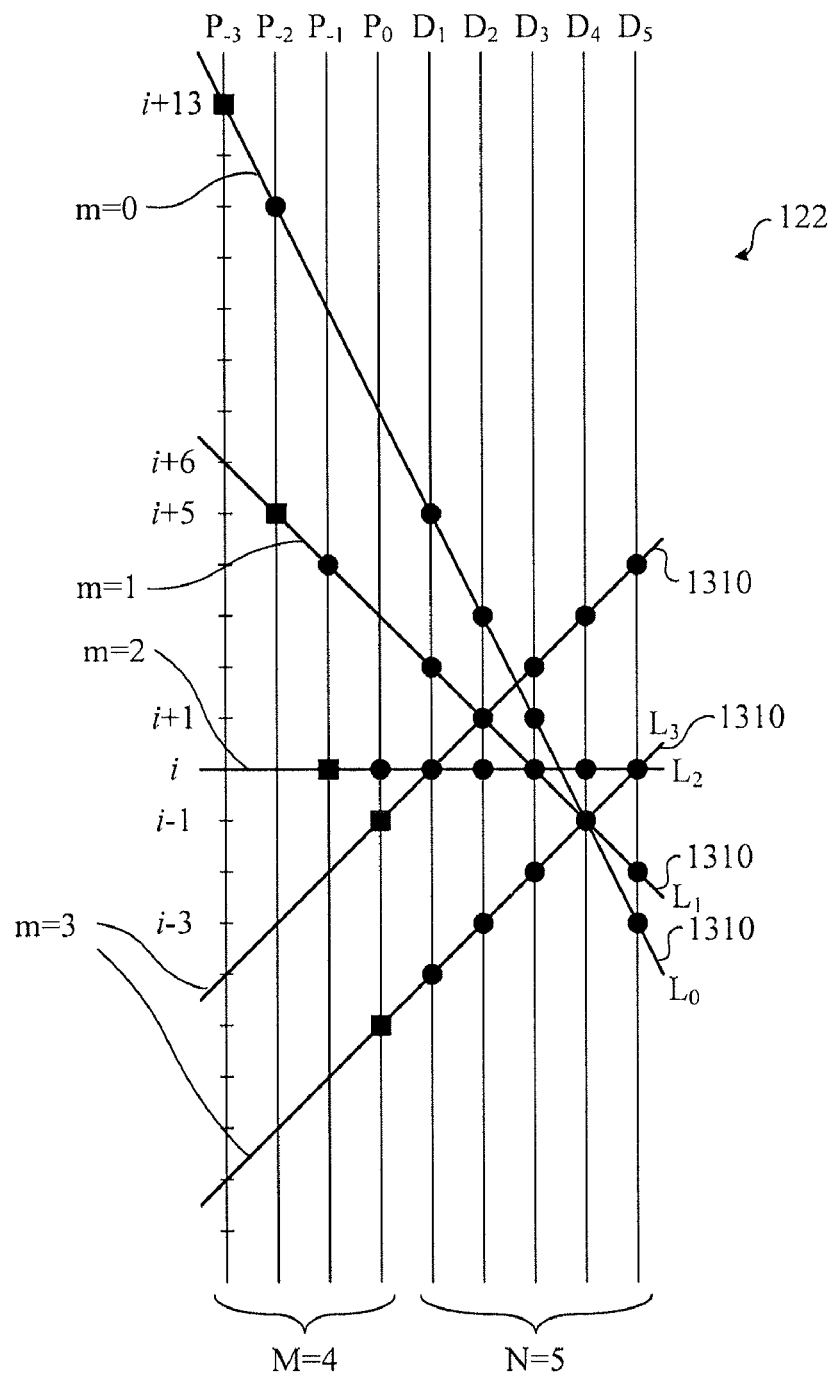
FIG. 13 is a diagram of an encoded array.

Referring to FIG. 13, which should be compared to FIG. 2 for reference, an example with M=4 and N=5 is shown. Each parity value makes use of the parity column directly to its right (if any) and does not use the other parity columns. For example, $P_{-3}$ makes use of $P_{-2}$ but not $P_{-1}$ or $P_0$. Parity column $P_0$, which has no parity column to the right, only includes data columns.

Note that any parity $P_n$ can be generated from data and parity $P_{n+1}$ (if there is one), without regard to any other parities, in particular, without regard to any parity to the left.) This allows parities to be added one at a time (leftward) using only previous parities, and allowing decoding to take place using only as many parities as are needed for the number of erased columns to rebuild.

Encoding according to this approach follows PROC. 1.2, with equation EQ. 1.3 replaced with EQ. 6.1. Since parity lines do not contain all parity bits, the parity edge decoder and enhanced syndrome edge decoder procedures are modified accordingly.

The firstbit and lastbit calculations remain the same, as in the previous approaches because the omitted parity bits are outside of valid bits defined in the previous approaches.

The choice of starting column and k slopes also remain the same: choose the firstbit of the leftmost good column, and select the proper line so that line $L_0$ at slope $k_0$ is used to rebuild the leftmost erased bit. Then move to the left, rebuilding one bit from each erased column. Since all leftward columns are erased, and the lines decrease in slope as the included pairs of P bits move leftward, the equations at this step will always include one good bit (parity or $D_1$) and one parity bit (immediately to the left) to be rebuilt. As the procedure progresses, good or rebuilt data bits will also be included in this operation, but no other parity bits.

Figure 14:
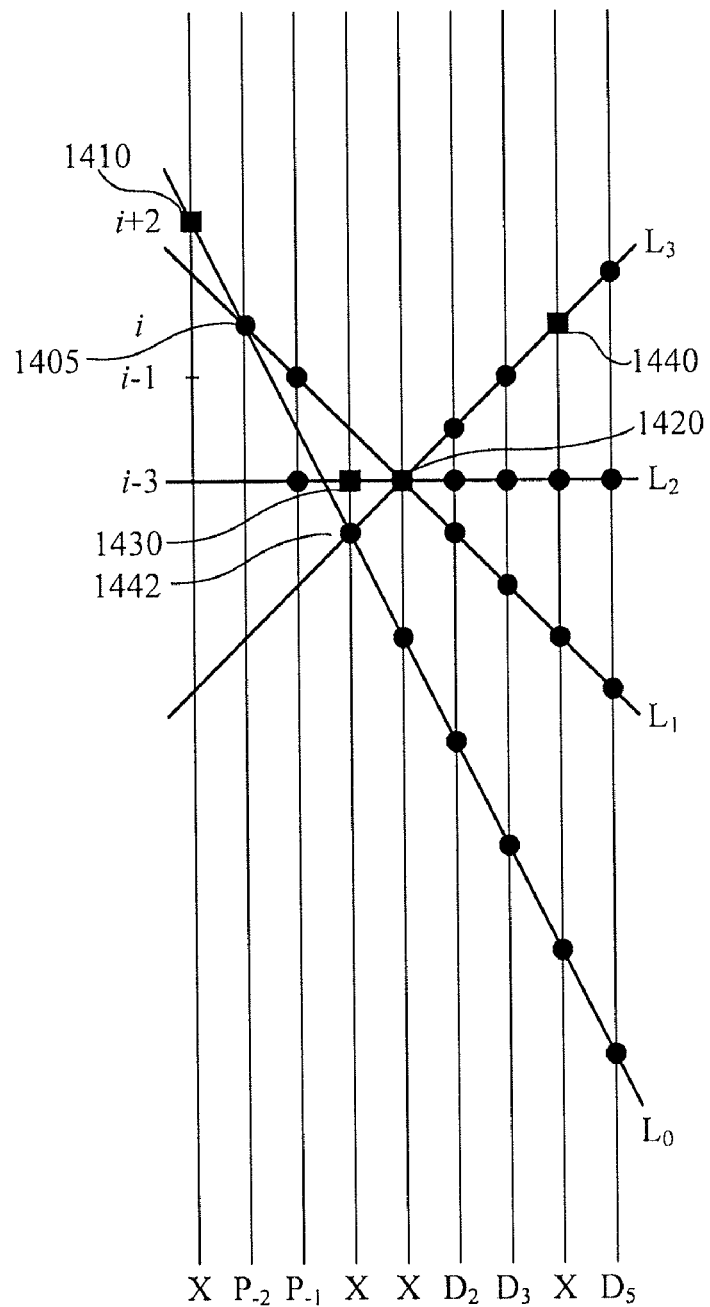
FIG. 14 is a diagram of a data array that illustrates a decoding example.

Referring to FIG. 14, which corresponds generally to FIG. 6, columns $P_{-3}$, $P_0$, $D_1$, and $D_5$ are erased. Column P–2 is the leftmost good column, therefore the only erased column to its left is $P_{-3}$. The starting bit is therefore at $P_{-2,i}$ 1405. The first reconstructed bit is therefore $P_{-3,i+2}$ 1410 using line $L_0$ of slope $k_0$.

Referring back to FIG. 6, to the right of the leftmost good column, the erasures are handled from left to right, with $P_{0,i-2}$ 620 being reconstructed next with line $L_1$, then $D_{1,i-2}$ 630 with line $L_2$, and finally $D_{5,i+5}$ with line $L_3$. In the approach illustrated in FIG. 14, the lines $L_1$, $L_2$, and $L_3$ are again applied in order, however the columns are not necessarily rebuilt from left to right.

In FIG. 14, when line $L_1$ of slope –1 is applied intersecting $P_{-2,i}$ 1405, the parity equations does not make use of $P_{0,i-2}$ as in FIG. 6. Here, the first intersecting erased element is $D_{1,i-3}$ 1420, which is the next entry that is rebuilt.

Starting at $D_{1,i-3}$ 1420, the line $L_2$ of slope zero is applied. By construction, it can be shown that this line will intersect at most one as-yet not rebuilt entry of the erased column, but this column may be to the left rather than to the right. In this case, entry $P_{0,i-3}$ 1430 is such an entry that is next rebuilt. For line $L_3$, the procedure starts again at $D_{1,i-3}$ 1420, which is used to rebuild $D_{4,i}$ 1440 using line $L_3$ of slope +1.

A procedure for determining the order of columns to be rebuilt, $r_0, \ldots, r_{M-1}$, is provided in PROCS. 6.1-6.3. Rebuilding entries follows PROC. 2.5, with equation EQ. 2.5 being replaced by EQ. 6.6 to account for the definitions of the parity equations in this version of the approach.

To use enhanced syndrome edge decoding instead of parity edge decoding, everything is the same as for full cross convolution, except for the definition of the enhanced syndrome, and the application of it to rebuild erasures.

To generate enhanced syndrome bits $ES_{pcolL_m,i}$ using partial cross convolution, PROC. 6.5 is used. To rebuild erasures using enhanced syndromes and partial cross convolution, PROC 6.6 is used.

6.1 Parity and Syndrome Error Canceling Decoder using Partial Cross Convolution

To use parity and syndrome error canceling with partially encoded convolution requires special handling of cases where one or more parity bits are erased, because crossing parity lines do not necessarily cancel a parity bit, since the bit may not appear on both lines. The following describes the process for determining line topology to cancel various columns. The actual calculation of the line bases and predecessor bits is the same as for full encoding, i.e., move from the rebuilding bit to line crossings, bases, and predecessor bits. The difference is that the new line topologies must be used to determine the lines and crossing points, and since lines do not contain all columns, where the rebuilt bit is and how many predecessor bits there are (if any).

Figure 15A:
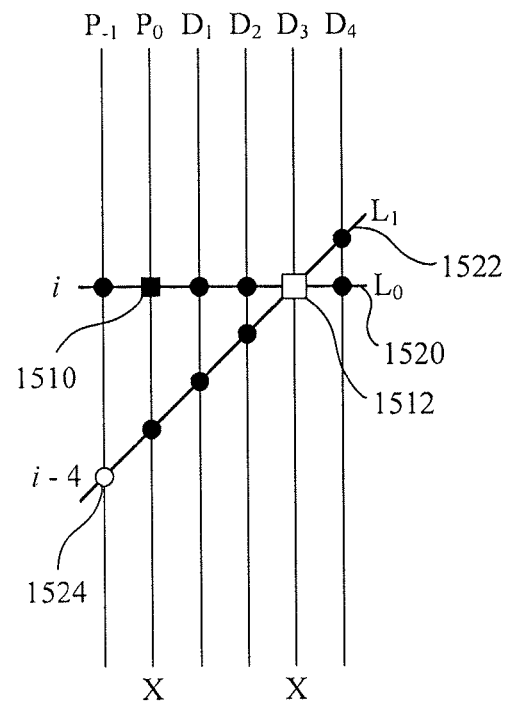
FIGS. 15A-D are diagrams of a data array that illustrate a decoding example.
Figure 15B:
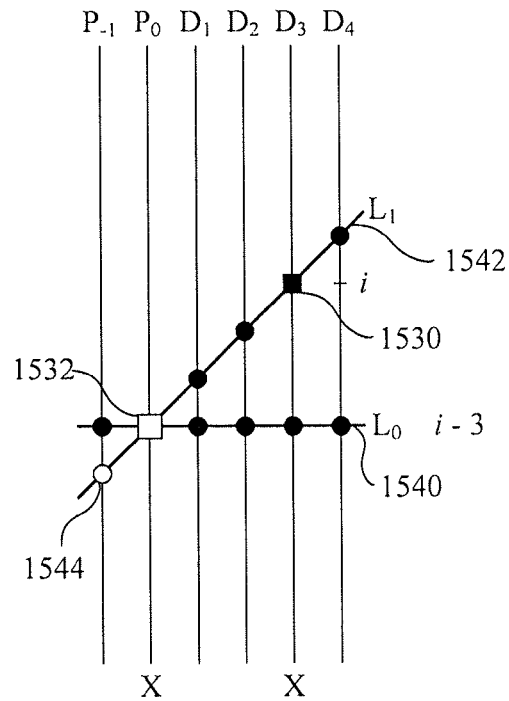

An example with M=2 and N=4 is used to illustrated the procedure. Referring to FIGS. 15A-B, consider first a situation in which $P_0$ and $D_3$ are erased. These figures should be contrasted with FIGS. 9A-B in which full parity equations are used to cancel columns. Referring to FIG. 15A, when $P_{0,i}$ 1510 is rebuilt, lines $L_0$ 1520 and $L_1$ 1522 are used to cancel $D_3$,i 1512. Note that line $L_1$ 1522 differs from line $L_1$ 922 in FIG. 9A in that $P_{-1,i-4}$ 1524 is not part of the parity equation for line $L_1$ 1522 while it is for line $L_1$ 922. However, the rebuilding procedure is used without modification. Referring to FIG. 15B, when $D_{3,i}$ 1530 is rebuilt, lines $L_0$ 1540 and $L_1$ 1542 are used to cancel $P_{0,i-3}$ 1532, with line $L_1$ 1542 not including entry $P_{-1,i-4}$ 1544.

Figure 15C:
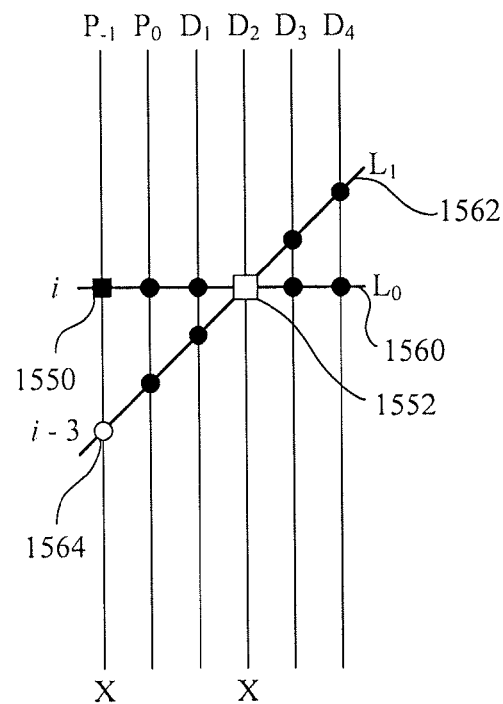
Figure 15D:
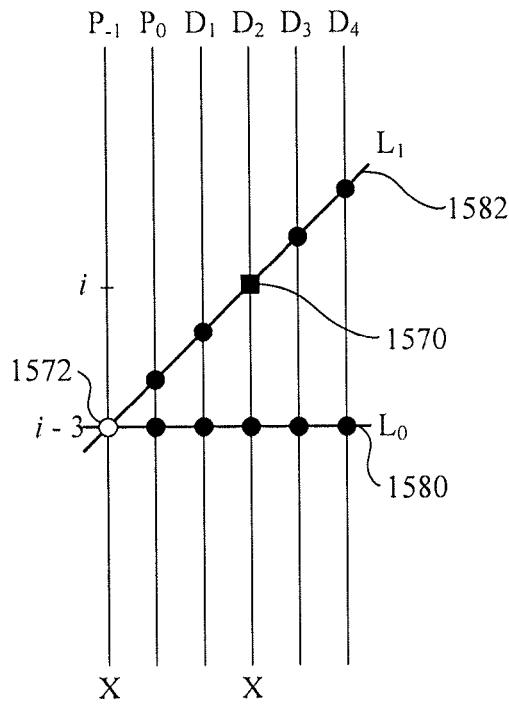

Referring to FIGS. 15C-D, in a second situation columns $P_{-1}$ and $D_2$ are erased. In reconstructing $P_{-1,i}$ 1550, lines $L_1$ 1562 and $L_0$ 1560 are used to cancel $D_{2,i}$ 1552, in a manner similar to that illustrated in FIG. 15A. Referring to FIG. 15D, in reconstructing $D_{2,i}$ 1570, line $L_1$ 1582 does not include the erased entry $P_{-1,i-3}$ 1572, and therefore line $L_0$ 1580 is not included to cancel $P_{-1,i-3}$ 1572 as in FIG. 15B.

In this case with M=2, use of a single parity equation occurs whenever one of the erased columns is $P_{-1}$, and any of $P_0$ through $D_4$ are being rebuilt.

In the case of a syndrome decoder version of this approach, the syndromes that are calculated according to the partial encoding use PROC. 6.7.

There are 4 cases in the M=2 configuration, corresponding to combinations of erasures in the two parity bits; we can represent the cases as a 2-bit binary number, with bits for erasure in column $P_{-1}$, $P_0$. Thus 00 represents the case where no parity bit is erased. A general procedure is provided in PROC. 6.8.

The case for M=3 follows the same approach as M=2, but there are more cases of patterns of erased parity to consider. There are 8 cases in the M=3 configuration, corresponding to combinations of erasures in the three parity bits. Recall that in this case, parity line $L_0$ includes $P_{-2}$ and $P_{-1}$, line $L_1$ includes $P_{-1}$ and $P_0$, and line $L_2$ includes $P_0$ alone.

Figure 16C:
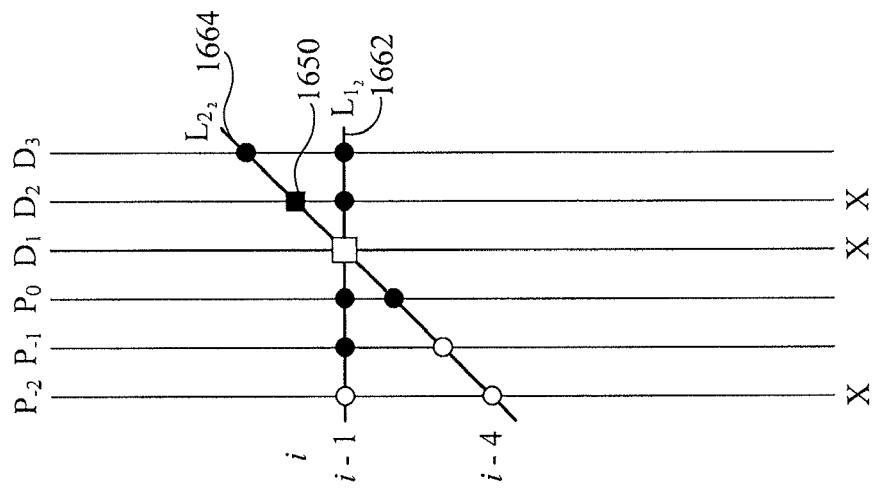
FIGS. 16A-C are diagrams of a data array that illustrate a decoding example.
Figure 16B:
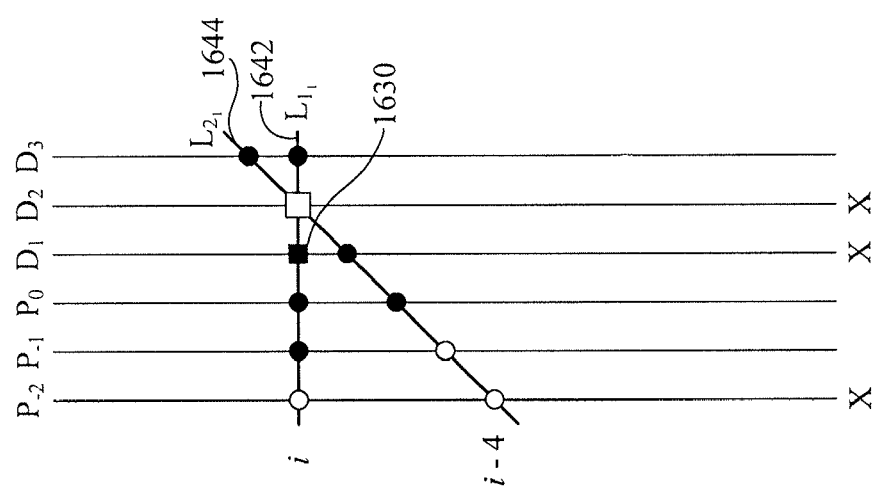
Figure 16A:
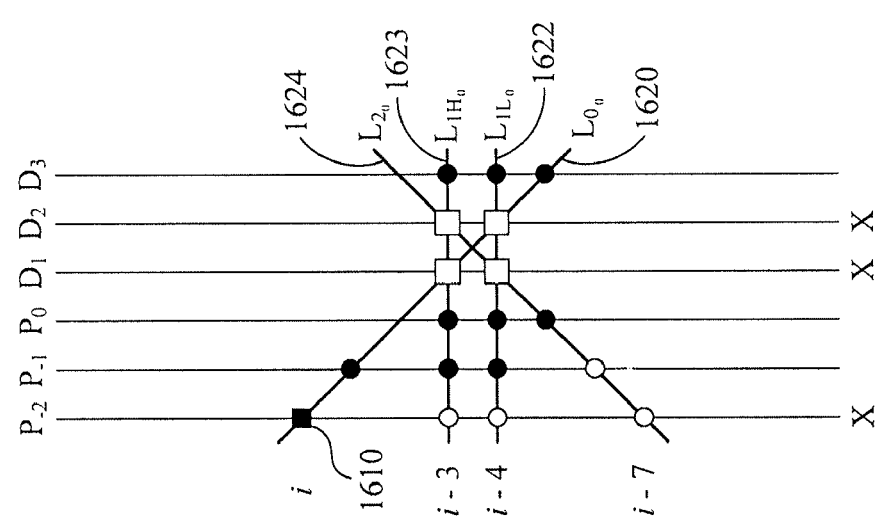

Referring to FIGS. 16A-C, which should be compared to FIGS. 10A-C, columns $P_{-2}$, $D_1$ and $D_2$ are erased. Referring to FIG. 16A, $P_{-2,i}$ 1610 is rebuilt, with four lines canceling the other erased columns: $L_{0_0}$ 1620, $L_{1L_0}$ 1622, $L_{1H_1}$ 1623, and $L_{2_0}$ 1624. This situation is analogous to that illustrated in FIG. 10A. Referring to FIG. 16B, when $D_{1,i}$ 1630 is rebuilt, line $L_{1_1}$ 1642 is used, but unlike line $L_{1H_1}$ 943 in FIG. 10B, erased entry $P_{-2},i$ is not included and therefore does not have to be cancelled. Line $L_{2_1}$ 1644 is used to cancel $D_{2,i}$, but that line also does not include erased parity $P_{-2}$. Therefore, only two parity equations rather than four are required to rebuild $D_{1,i}$. Referring to FIG. 16C, the situation is similar with only two lines, $L_{1_2}$ 1662 and $L_{2_2}$ 1664 being needed to reconstruct $D_{2,i}$ 1650.

A general procedure for determining which lines to include in reconstructing a column is provided in PROC. 6.9.

7 Alternatives, Enhancements and Variants

7.1 Flat Parity Slope Encoding

The lines for the parity equations do not necessarily have to be straight across all the columns of the parity and data. A possible advantage of using other than straight lines is the fewer extra bits may be needed beyond the first and last rows of the original data.

Figure 17:
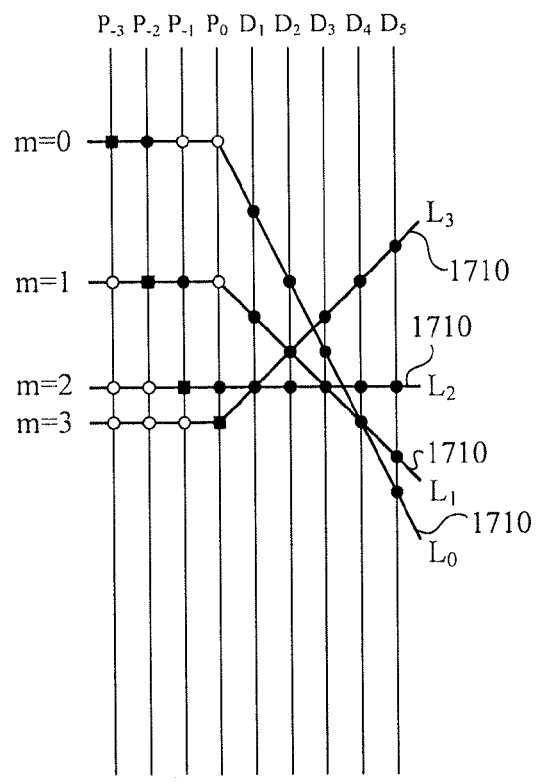
FIG. 17 is a diagram of an encoded array.

Referring to FIG. 17, which should be compared to FIG. 13, a particular variant of the Partial Cross-Convolutional Encoding method sets the slope of the parity equation line to zero from parity column $P_0$ leftward; thus there is a bend in the line at parity column $P_0$, unless the whole line is horizontal. In particular, line $L_0$ 1710 (parity index m=0) has slope $K_0=-2$ as in FIG. 13, and includes parity columns $P_{-3}$ and $P_{-2}$. Similarly, line $L_1$ has slope $K_1=-1$ and includes $P_{-2}$ and line $L_2$ has slope $k_2=0$ and includes $P_{-1}$ and $P_0$, and line $L_3$ has slope $k_3=+1$ and includes $P_0$.

The effect of this is to reduce the number of additional parity bits required at the ends of the columns, since parity columns have to extend past the previous parity column by the slope of their equation line, which is now zero. Note that in methods in which more than two parity values are used in the parity equations, setting the slope of all parity equations to 0 in the parity column area would cause the equations to be dependent, since they would share more than one point along the horizontal portion of the line. However, since partial encoding has at most two parities on any line, and they are a different pair of parities than any other line, there is never an overlap of more than one point, so the equations remain independent.

Figure 18:
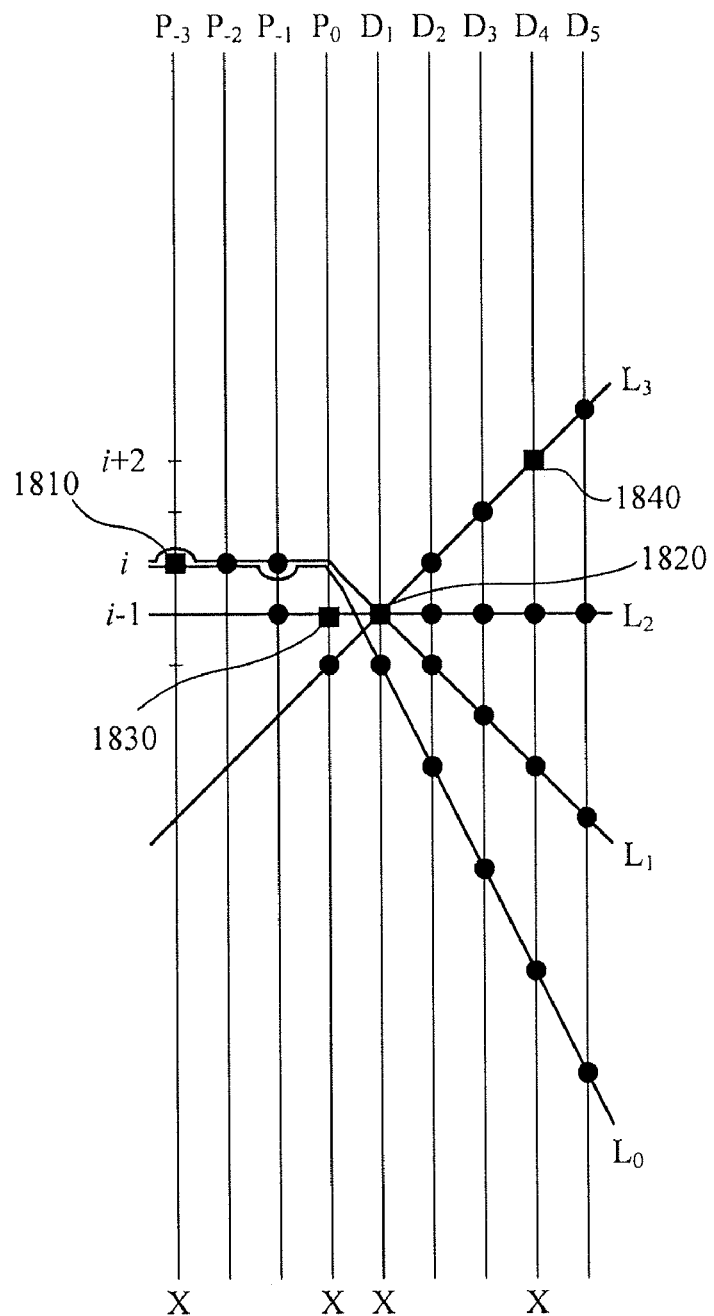
FIG. 18 is a diagram of a data array that illustrates a decoding example.

Referring to FIG. 18, which may be compared to FIG. 14, illustrates one iteration of reconstruction in a case of M=4, N=5, with erasures at $P_{-3}$, $P_0$, $D_1$, and $D_4$. The leftmostgoodbit is found in column $P_{-2}$. $P_{-3,i}$ 1810 is first rebuilt using line $L_0$, which uses $P_{-2,i}$ but not $P_{-1,i}$ or $P_{0,i}$. Next, $D_{1,i}$ 1820 is rebuilt using $P_{-2,i}$ and $P_{-1,i}$. Next $P_{0,i-1}$ 1830 is rebuilt using $L_2$, which uses the rebuilt $D_{1,i-1}$ 1820. Finally, $D_{4,i+2}$ 1840 is rebuilt using the rebuilt $D_{1,i-1}$ and $P_{0,i-2}$.

A procedure for determining the firstbits and lastbits for the parity columns, as well as modifications of the procedures and equations for the parity and syndrome edge decoders are PROC. 7.1.

7.2 Standard Parity Base

Figure 19:
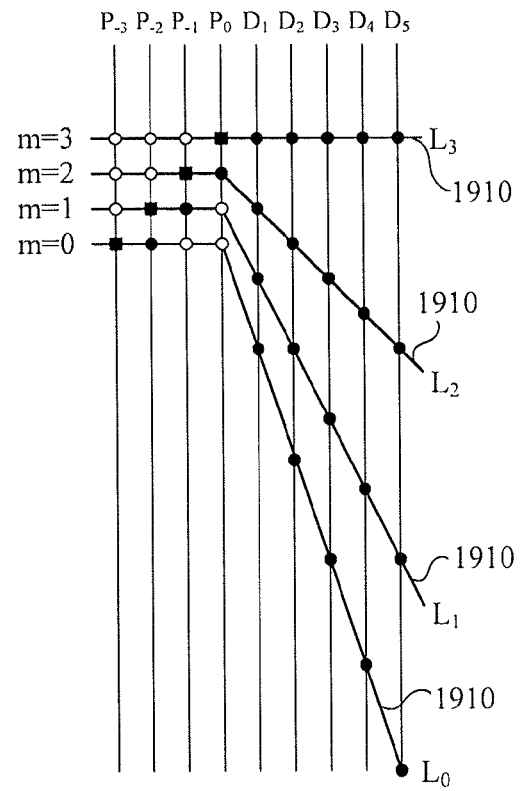
FIG. 19 is a diagram of an encoded array.

Referring to FIG. 19, which may be compared to FIG. 17, the slopes of the "flat parity" lines can be chosen such that line $L_3$ 1910 has zero slope, and the remaining lines have negative slope as shown in the figure. Note that $P_0$ in this example corresponds to a simple parity along one data row, as may be used in a RAID storage system. For example, an erasure of a single data column could be handled using $P_0$ alone, for example, using components of the RAID storage system.

The additional parity columns, $P_{-3}$ through $P_{-1}$, provide the capability of reconstructing up to four concurrent erasures should they occur.

7.3 Optimized Extra Parity Bit Techniques

One or more approaches to calculation of lastbitm are presented above. Although these method may be convenient for calculation and simplicity of the decoding algorithms, an optimization to reduce extra parity bits is possible. The optimization takes advantage of the fact that even if all errors are located in the rightmost data columns, the slope of the $L_0$ does not have to reach all the way to cover lastbit$_N$, some remaining lines $L_1$ to $L_{(M-1)}$ will cover the remaining data bits. For each parity bit, the proper lastbit must be calculated by tracing the spline of the L lines in the worst case (rightmost data bit covered directly by that parity bit's line), and making sure that the minimum value along this line is equal to I−1, the lastbit of the data. The shape of this curve can vary considerably depending on the line slopes chosen. In cases where $k_0$ and/or M are large, this can result in considerable savings of extra parity bits.

To decode this configuration, all algorithms for determining the next error column to rebuild use lines as if there are M errors even if there are fewer than M, so that $L_0$ is not used to try to rebuild $D_N$.

7.4 Non-Sequential Slopes

A modified method calculates higher order parity columns (−1 to −(M−1)) using line slopes in a re-arranged order (not $k_{M-2}$ to $k_0$). An example is where $P_0$ is calculated along k=0, $P_{-1}$ is calculated along k=+1, and $P_{-2}$ is calculated along k=−1. The effect of this method is to simplify calculations in the parity and syndrome error cancellation decoding methods, since slopes are either +1, −1, or 0, changing multiplication of offsets by slopes into addition, subtraction, or disregard of offsets.

In an example of use of non-sequential slopes, slopes of alternating signs (0, +1, −1, +2, −2, . . . ) are used in conjunction with a version of the approach in which parity columns are added both to the left and to the right of the data columns, and successive parity equations make use of successively more of the parity columns.

Some other choices of non-sequential slopes may disrupt the "spline curve" during reconstruction, such that erased extra parity bits at i<0 are used to rebuild data bits before the parity bits themselves have been rebuilt. The extra parity bits are stored in an externally reliable mechanism so they are always available, even if the parity column is erased.

There are many further variations on this method, depending on the pairing of parity columns with lines.

7.5 Non-Zero Known Bits

In approaches described above, data bits for rows before row 0 are defined to be known zero values, thereby allowing diagonal parity equations to be calculated when only some of the entries in the parity equation are at row 0 or later. In an alternative approach, these known entries are defined in encoding to have a pattern of values that is not necessarily all zero. This pattern of values serves as a scrambling key that is needed by the decoder in order to start the decoding process. That is, if the encoder uses a pattern of non-zero values, and M data columns are erased before sending the data from the encoder, then the decoder will not produce correct output if it uses zeros or an incorrect pattern of values to rebuild the missing M data columns. These extra data bits can be handled separately, and treated as a key that is needed to decode the data.

7.6 Hierarchical Parity

Parity equations do not necessarily use all the data columns as arguments. For example, a hierarchical approach may be used. In an example of a hierarchical approach, N=16, an a first parity column uses data columns $D_1$ through $D_8$ while a second parity column uses data columns $D_9$ through $D_{16}$. A third parity uses all columns $D_1$ through $D_{16}$. This approach can be extended to more hierarchical levels, with higher level parities covering progressively more columns. In one version of this approach, the parities covering the lowest level are implemented using a RAID approach, and the higher-level parities are used to recover multiple errors in a RAID bank that are not recoverable using RAID alone.

8 Corruption Detection

The discussion above concentrates on operations that relate to erasure errors. One approach to handling corruptions is to use the syndromes described above to detect columns of data that are corrupted, and then treat the corrupted column as having been erased, reconstructing that column using one of the techniques described above.

Any one parity equation or its related syndrome cannot in general be relied upon to detect errors in a column because of the possibility of concurrent errors in different columns masking the errors. However, with errors isolated in M or fewer columns, at least some syndrome will be non-zero at some row.

One approach to detection of columns with errors involves computing syndromes in which different subsets of 1 up to m columns, for m less than the number of parity columns M, are cancelled using the approaches described above for syndrome-cancellation based decoding. If without cancellation the syndromes are non-zero, and with cancellation of a particular subset they are zero, then the cancelled columns are assumed to have errors and are rebuilt completely.

An implementation of this approach makes two (or more) passes through the computed syndromes if they are not all zero. For example, a first pass through the data may examine the syndromes to determine whether there are any non-zero values, which indicate that there is some error. The cancellation of columns can then be performed iteratively, for example, first canceling one column at a time, then canceling pairs of columns at a time, and so forth until, in the rare situation in which there truly are M−1 columns with errors, combinations of M−1 columns are cancelled.

As another implementation, a single pass through the data in which all the various subsets of column cancellations are computed together is used to identify the subset of columns that is to be treated as erased and then rebuilt.

As yet another implementation, a single streaming pass is used to both detect the subset of columns to reconstruct and with a suitable delay reconstruct the columns in error. For example, in a case in which a particular column has a limited run of errors, the single-pass error detection logic can mark that column as "erased" for a lagging decoder to reconstruct.

Note that the discussion above has concentrated on reconstructing an entire column for all rows. In certain situations, errors may occur in relatively limited runs, with lengths of error-free rows separating the regions of rows with errors. The error detection approach described above can identify different subsets of M−1 columns that have errors in each of the regions, and the reconstruction can change which columns are to be reconstructed for each region. In this way, over the whole series of I rows, more than M−1 columns can have errors or runs of errors, as long as within any region of maximum number of rows (that is a function of the definitions of the parity equations), at most M−1 columns have errors.

Other independent approaches can also or alternatively be used to detect corruptions in particular channels. For example, a hash code or message digest (e.g., MD5) can be calculated and appended to each channel, and if the hash code or message digest does not match when recomputed at the decoder, the decoder treats the channel as "erased."

9 Implementations

Figure 20:
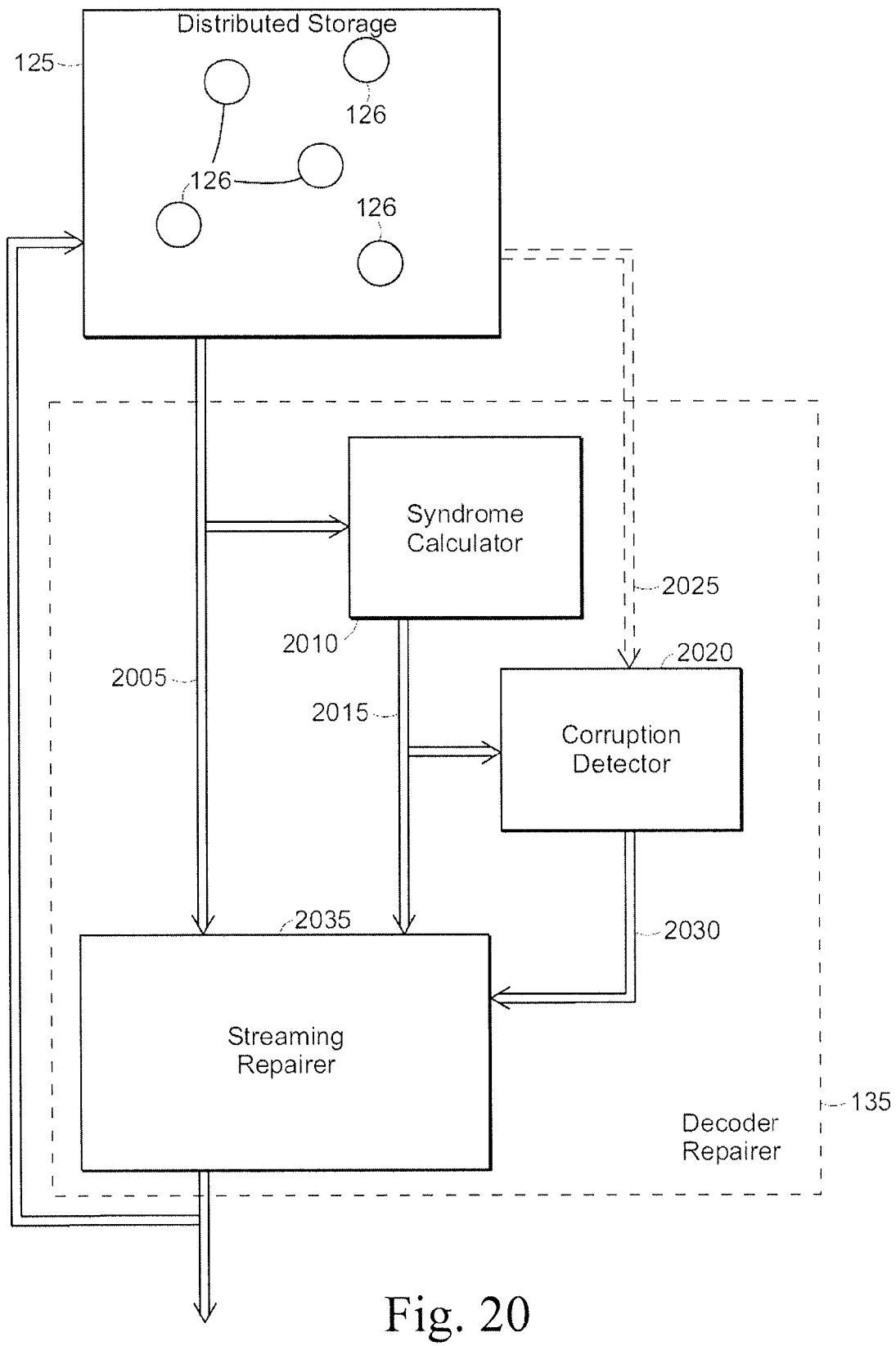
FIG. 20 is a block diagram of an implementation of a storage system.

Referring to FIG. 20, one implementation of a syndrome-based decoder/repairer 135 accepts data from a distributed storage 125, which includes multiple separate storages 126, each associated with a different channel (column) of data. The N+M channels of data are passed from the storage 125 to a streaming repairer 2035. The data is also passed to a syndrome calculator 2010, which provides syndromes 2015 to the streaming repairer 2035.

The streaming repairer 2035 uses parameters 2030 that define which columns to rebuild. It uses these columns to configure a streaming reconstruction component. For example, the streaming repairer implements one or more configurable delay lines and summers of a type shown in FIG. 12. The configuration information determines the amount of delay in each of the delay lines 1230-1243, and the selection of inputs to the delay lines.

A corruption detector 2020 also makes use of the syndromes 2015 to determine which columns need to be rebuilt, and passes this information to the streaming repairer 2035. The corruption detector 2020 may also make use of other information 2025, for example, from the distributed storage 125 that identifies columns that need to be rebuilt. For example, if the corruption detector 2020 is informed or determined that a particular storage 126 is unavailable, it can identify that column as erased in addition to other columns in which errors are detected based on the syndrome calculations. In one example, each storage 126 may include a error detection capability, based for example on a parity or ECC, and if it detects one or more errors, for example, in a requested block of I rows of data, it sends that information in such a way that the corruption detector and/or the streaming repairer can use to information to reconstruct the data.

In implementations that require multiple passes through the data, the decoder repairer 135 may include sufficient storage to buffer the required data. Alternatively, in the case of errors that are detected by the corruption detector 2020, the data may be read multiple times from, and reconstructed data sent back to, the distributed storage 125.

The approaches described above may be implemented in software, which is stored on computer readable media or distributed on signals, for example, propagating in a data network. The software can include instructions (e.g., computer processor instructions, processor microcode, virtual machine instructions, interpreter statements or byte codes, etc.), that cause various of the system components described above to perform the functions described. The approaches may also be implemented in hardware, for example, using special purpose circuitry, programmable logic, programmed processors and controllers. The approaches may also be implemented using combinations of software and hardware. In versions of the system that make use of storages 126, each storage may be implemented using a variety of types of devices, include multi-computer systems (e.g., disk server "farms"), general purpose computers (e.g., "disk servers"), special purpose storage subsystems, disk drives, portions (e.g., platters) of individual disk drives. The data interconnection can use a variety of data network or communication technologies, for example, including Internet Protocol (IP) communication, ATM, Ethernet, Fiberchannel, SCSI, ATA, etc.

10 Applications 10.1 Distributed Storage

A first application of the approaches described above is in distributed storage. Each channel is stored separately (i.e., in a storage 126), in a manner that reduces the correlation of errors between different channels. For example, the channel may be geographically or spatially distributed at some level (e.g., at data centers different continents, in different countries, in a different city, in a different building, in a different computer room, in a separate rack, in a separate chassis in a rack, on a separate board or blade in a chassis). When data is read into the system, it is divided into N separate channels (if not already naturally divided) and an encoder computes the additional parity values for storage.

In such an application, each storage 126 may have some error correction and detection capability. For example, in a geographically distributed application, each storage 126 may itself include a RAID disk system that is able to correct at least some errors, for example, if it detects that a drive in the array is bad. In the case of such a RAID system, for example, in a RAID-5 system, the data is protected by a parity, which is used when the RAID system detects that a disk is not available. This same parity can be used to detect the presence of an error that cannot necessarily be repaired by the RAID system. When such an error is detected but not repaired, the storage 126 informs the decoder repairer that its data is corrupted, optionally indicating the range of rows in a block of I rows in which the error appears.

In some implementations, the individual storages 126 continually read their data and use their own internal error detection capabilities to detect errors, and if errors are detected but cannot be independently repaired by the storage 126, data at other of the storages 126 is used to reconstruct the data. In some implementations, each or at least some of the storages 126 include the decoder repairer functionality, and therefore such a storage can request the data it needs from the other storages to reconstruct its errorful data. In other implementations, a storage that detects an error can request a remote decoder repairer to reconstruct its data.

10.2 Memory Systems

Figure 21:
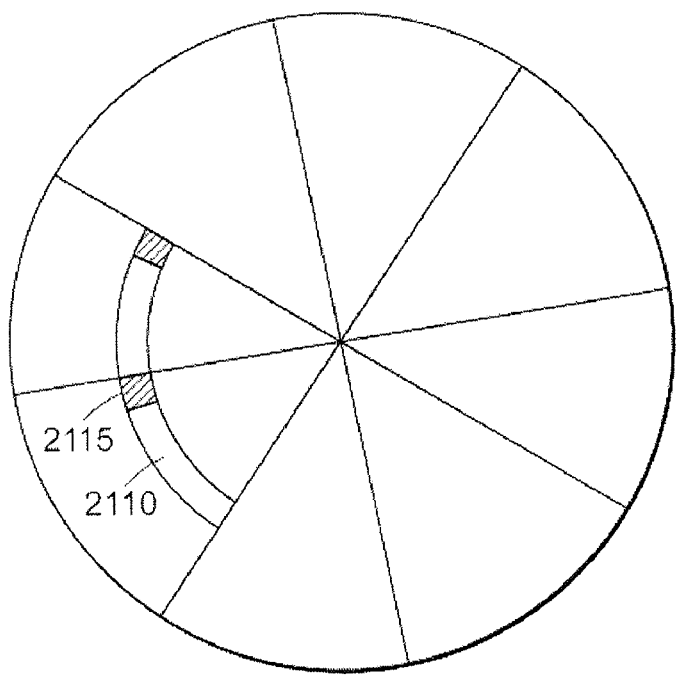
FIG. 21 is a diagram of a storage device.
Figure 22:
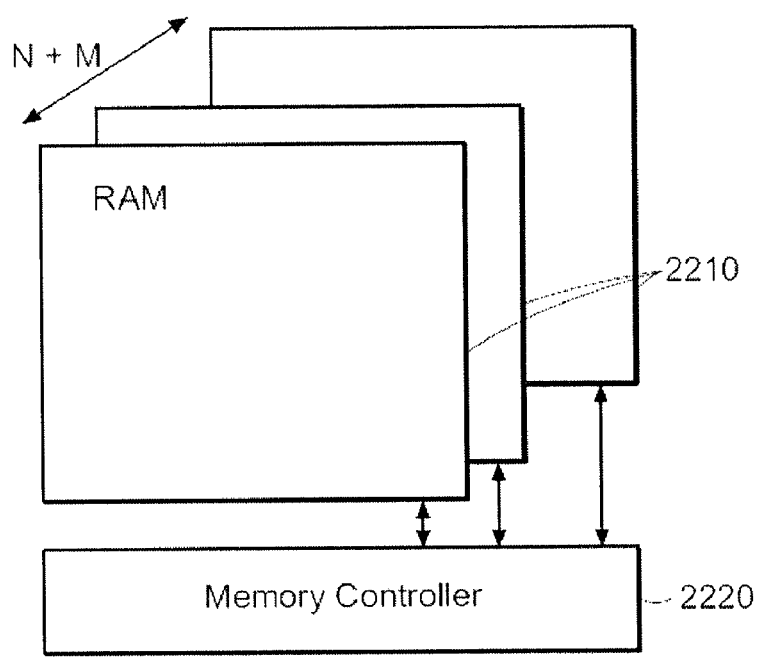
FIG. 22 is a block diagram of an implementation of a storage system.

In another application, each channel is associated with a different disk storage device. For example, each block is I=512K long, with each channel of the block being stored on a different storage device. Referring to FIG. 21, a representative channel of a block may be stored in a representative disk block that includes a section 2110 that stores 512 Kb as well as a section 2115 that stores any required extra bits (i.e., before row 0 and after row I−1) for that channel.

A particular application of this approach makes use of a very large number of relatively error-prone but inexpensive disk drives. Such disk drives might have inadequate error rates on their own, but in combination with a subsystem controller that implements the encoding to distribute parity channels to various drives, and a decoder repairer to detect and correct errors, very low overall error rates are achieved at relatively low cost. In typical applications in which there are no errors, error detection is performed in a streaming manner that does not substantially delay reading of data. When an error is detected, the data is read and reconstructed using the parity data.

As with the distributed storage application, each disk may have its own error detection and/or error correction capability, and when an error is detected but not correctable by the drive, it can inform the subsystem controller of the error and the subsystem controller rebuilds the data, if necessary, migrating the data to another drive if the drive is no longer functional.

In another application, semiconductor memory (e.g., RAM) includes N+M banks of memory 2210, each coupled to a memory controller 2220. The memory controller includes an encoder that computes the parity channels and a decoder repairer for rebuilding banks that have errors or become unavailable. As with the disk storage application, each memory bank may include error detection and/or error correction capabilities, and may be able to provide error detection information, for example, localizing errors, so that the memory control can rebuild the errorful data.

In another version of the system, memory modules have 72-bit wide data storage. Other systems can use these 72 bits for 64 bits of data and 8 bits for ECC for correction within the module. In the version of the present approach, the 8 bits are used for 8 parity channels that are used for correction across memory modules, enabling for example, reconstruction of up to 8 erased bit positions across the memory modules.

10.3 Packet Transmissions

In another application, the separate channels of a block of data are each passed over separate data communication channels, or are passed over a same communication channel but at sufficiently different times or in different data packets such that errors in different of the columns of data are substantially uncorrelated. For example, each channel may be send over a different physical circuit (conductor or optical fiber), or a different frequency such that different frequencies are subject to relatively independent interference. Each channel may also be packaged into a separate packet for transmission over a packet-switched data network, and routed over the same or different paths through the network.

10.4 Software File System Protection

In another application, a software implementation of the approach is used to protect portions of a computer file system. The separate channels can correspond to different units of file storage, such as blocks or other segments of a file, separate files, separate directories, or other partitions of a file system.

11 Appendix

The procedures (PROCs) and equations (EQs) referenced above are provided in the attached appendix.

It is to be understood that the foregoing description is intended to illustrate and not to limit the scope of the invention, which is defined by the scope of the appended claims. Other embodiments are within the scope of the following claims.

CROSS-CONVOLUTIONAL PARITY

Appendix

Parity to column mapping

$$pcolL_m = m - (M-1) \qquad \text{EQ 1.1}$$

$$lpcol_n = n + (M-1) \qquad \text{EQ 1.2}$$

Determine firstbit and lastbits for parity

*To locate $firstbit_n$ and $lastbit_n$ for parity columns n:*

```
for n = 0 down to -(M-1)                                              PROC 1.1
    {
    firstbit_n = min [ min [-k_lpcol_n (N-n),                   // for slope >= 0
                            -k_lpcol_n (1-n)],                  // for slope <= 0
                       firstbit_(n+1) - k_lpcol_n  (if n + 1 <= 0) ]  // to get next parity firstbit
    lastbit_n  = max [ 1 - 1 + max [-k_lpcol_n (N-n),           // for slope <= 0
                                    -k_lpcol_n (1-n)],          // for slope >= 0
                       firstbit_(n+1) - k_lpcol_n  (if n + 1 <= 0) ]  // to get next parity firstbit

}
```

Define parity bit values

*To define parity bits $P_{pcolL_m, firstbit_{pcolL_m}}$ to $lastbit_{pcolL_m}$; where m = 0 to (M-1)*

```
for m = 0 to (M-1)                                                    PROC 1.2
    {
    for i = firstbit_pcolL_m  to  lastbit_pcolL_m
        {
```

$$P_{pcolL_m, i} = \oplus \sum_{n=-(M-1) \text{ except } n=pcolL_m}^{N} PD_{n, [i + k_m(n - pcolL_m)]} \qquad \text{EQ 1.3}$$

```
        }
    }
```

Pseudo-code to implement the parity edge decoder

*To select leftmost good column*                                                                              PROC 2.1

```
    lefterrors = 0
    found = 0
    m = -(M-1)
    while (not found)
        {
        if e_lefterrors = m              // if this is an erased column,
            {
            lefterrors = lefterrors + 1  // go look at next one
            m = m+1
            }
        else
            {
            found = 1                    // else this is the first good,
            leftgoodcolumn = m           // so note it and stop here
            }
        }
```

*To determine firstbit and lastbit for data columns*                        PROC 2.2
*(parity columns are same as in Proc 1.1)*
*(If all parities are erased, column $D_1$ is leftgoodcolumn and we need to know the firstbit)*

```
    firstbit_1 = firstbit_0 + k_(M-1)
    for n = 1 to N
        {
        lastbit_n = 1 - 1
        }
```

*To determine currentbit for leftgoodcolumn*                                PROC 2.3

```
    currentbit_leftgoodcolumn = firstbit_leftgoodcolumn
```

*Determine currentbit and rebuild sequence for error columns*            PROC 2.4
*Define columns to be rebuilt $n = r_m$ in order as $m = 0$ to $(M-1)$*
*Define slope of line to use in rebuilding column $r_m$ as $kr_m$*

```
    if lefterrors > 0                        // if erasures to left of leftgoodcolumn
        {
        for m = (lefterrors - 1) down to 0   // they must all be parities
            {                                // and for leftmost bad parities,
            currentbit_e_m = firstbit_e_m    // firstbit is same as encode, and
            r_m = e_(lefterrors -1) - m      // rebuild is opposite order from error
            kr_m = k_(lefterrors -1) - m     // line slope matches e order
            }
        }
```

```
m = lefterrors
currentcolumn = leftgoodcolumn
currentfirstbit = currentbit_leftgoodcolumn
while (m < M):
    {
    r_m = e_m                                           // going right rebuild in e order
    kr_m = k_m                                          // line slope matches e order and r order
    currentbit_{e_m} = currentfirstbit + kr_m (e_m - currentcolumn)
    currentfirstbit = currentbit_{e_m}
    currentcolumn = e_m
    m=m+1
    }                                                   // end of while loop
```

*Rebuild erasures at current edge, increment current edge, until all bits rebuilt*       PROC 2.5

```
done = 0
for m = 0 to (M-1)
    {
```

$$X_{r_m, \text{currentbit}_{r_m}} = {}^{\oplus}\sum_{n=-(M-1) \text{ except } n=r_m}^{N} XPD_{n, [\text{currentbit}_{r_m} + kr_m (n-r_m)]}$$       Eq 2.5

```
    }
for m = 0 to (M-1)
    {
    currentbit_{r_m} = currentbit_{r_m} + 1             // then increment all currentbits
    if currentbit_{r_m} ≤ currentbit_{r_m}              // clear done if more to do in any column
        {
        done = 0
        }
    }
```

Conventional syndrome
*To generate conventional syndrome bits $S_{pcolL_m,i}$*     PROC 3.1
    for m = 0 to (M-1)
    {
        for i = firstbit$_{pcolL_m}$ to lastbit$_{pcolL_m}$
        {

$$S_{pcolL_m,i} = {}^{\oplus}\sum_{n=-(M-1)}^{N} PD_{n,\,[i + k_m(n - pcolL_m)]} \quad\quad \text{EQ 3.1}$$

}
    }

Enhanced syndrome
*To generate enhanced syndrome bits $ES_{pcolL_m,i}$*     PROC 3.2
    for m = 0 to (M-1)
    {
        for i = firstbit$_{pcolL_m}$ to lastbit$_{pcolL_m}$
        {

$$ES_{pcolL_m,i} = {}^{\oplus}\sum_{\substack{n=-(M-1) \\ \text{except } n= e_0, e_1, \ldots, e_{(M-1)}}}^{N} PD_{n,\,[i + k_m(n - pcolL_m)]} \quad\quad \text{EQ 3.2}$$

}
    }

Rebuilding erasures using enhanced syndromes

*Define parity column of line to use in rebuilding column $r_m$ as $pcolLr_m$*     PROC 3.3

Use PROC 2.5, but
Replace:

$$X_{r_m,\,currentbit_{r_m}} = {}^{\oplus}\sum_{\substack{n=-(M-1) \\ \text{except } n=r_m}}^{N} XPD_{n,\,[currentbit_{r_m} + kr_m (n - r_m)]} \quad\quad \text{Eq 2.5}$$

With:

$$X_{r_m,\,currentbit_{r_m}} = ES_{pcolL_m,\,[currentbit_{r_m} + kr_m (pcolLr_m - r_m)]}$$
$$\oplus\ {}^{\oplus}\sum_{\substack{n = r_0, r_1, \ldots, r_{(M-1)} \\ \text{except } n = r_m}} XPD_{n,\,[currentbit_{r_m} + kr_m (n - r_m)]} \quad\quad \text{EQ 3.3}$$

Find the base i offset of all needed parity equation lines

*Line base offsets from i for error bit $X_{e_0,i}$*
    *(ie., bit in leftmost error column $e_0$ at offset i):*                                                                 PROC 4.1

$baseL_{0_0}$ = $-k_0(e_0 - pcolL_0)$
$baseL_{1_0}$ =
$baseL_{1H_0}$ = $-k_0(e_0 - pcolL_0) + k_0(e_1 - pcolL_0) - k_1(e_1 - pcolL_1)$
$baseL_{1L_0}$ = $-k_0(e_0 - pcolL_0) + k_0(e_2 - pcolL_0) - k_1(e_2 - pcolL_1)$
$baseL_{2_0}$ = $-k_0(e_0 - pcolL_0) + k_0(e_1 - pcolL_0) - k_1(e_1 - pcolL_1) + k_1(e_2 - pcolL_1) - k_2(e_2 - pcolL_2)$
  or, use   $-k_0(e_0 - pcolL_0) + k_0(e_2 - pcolL_0) - k_1(e_2 - pcolL_1) + k_1(e_1 - pcolL_1) - k_2(e_1 - pcolL_2)$

*Line base offsets from i for error bit $X_{e_1,i}$*
    *(ie., bit in $2^{nd}$ to leftmost error column $e_1$ at offset i)*                                                PROC 4.2

$baseL_{1_1}$ =
$baseL_{1H_1}$ = $-k_1(e_1 - pcolL_1)$
$baseL_{0_1}$ = $-k_1(e_1 - pcolL_1) + k_1(e_0 - pcolL_1) - k_0(e_0 - pcolL_0)$
$baseL_{2_1}$ = $-k_1(e_1 - pcolL_1) + k_1(e_2 - pcolL_1) - k_2(e_2 - pcolL_2)$
$baseL_{1L_1}$ = $-k_1(e_1 - pcolL_1) + k_1(e_2 - pcolL_1) - k_2(e_2 - pcolL_2) + k_2(e_0 - pcolL_2) - k_1(e_0 - pcolL_1)$
  or:      $-k_1(e_1 - pcolL_1) + k_1(e_0 - pcolL_1) - k_0(e_0 - pcolL_0) + k_0(e_2 - pcolL_0) - k_1(e_2 - pcolL_1)$

*Line base offsets from i for error bit $X_{e_2,i}$*
    *(ie., bit in rightmost error column $e_2$ at offset i) (only valid when M=3)*     PROC 4.3

$baseL_{2_2}$ = $-k_2(e_2 - pcolL_2)$
$baseL_{1H_2}$ = $-k_2(e_2 - pcolL_2) + k_2(e_1 - pcolL_2) - k_1(e_1 - pcolL_1)$
$baseL_{1L_2}$ = $-k_2(e_2 - pcolL_2) + k_2(e_0 - pcolL_2) - k_1(e_0 - pcolL_1)$
$baseL_{0_2}$ = $-k_2(e_2 - pcolL_2) + k_2(e_1 - pcolL_2) - k_1(e_1 - pcolL_1) + k_1(e_0 - pcolL_1) - k_0(e_0 - pcolL_0)$
  or, use   $-k_2(e_2 - pcolL_2) + k_2(e_0 - pcolL_2) - k_1(e_0 - pcolL_1) + k_1(e_1 - pcolL_1) - k_0(e_1 - pcolL_0)$

Rebuild error bit $X_{e_m,i}$

$$XS_{pcolL_m,i} = \oplus \sum_{n=-(M-1)}^{N} XPD_{n,\,[i + k_m(n - pcolL_m)]} \qquad \text{EQ 4.1}$$

for m = 0 to 1                                                        PROC 4.4
{
    for i = firstbit$_{e_m}$ to lastbit$_{e_m}$
    {
        $X_{e_m,i} = PD_{e_m,i}$                                              EQ 4.2
            $\oplus\; XS_{pcolL_0,\,(i + baseL_{0_m})}$
            $\oplus\; XS_{pcolL_1,\,(i + baseL_{1_m})}$
    }
} for m = 0 to 2                                                        PROC 4.4
{
    for i = firstbit$_{e_m}$ to lastbit$_{e_m}$
    {
        $X_{e_m,i} = PD_{e_m,i}$                                              EQ 4.3
            $\oplus\; XS_{pcolL_0,\,(i + baseL_{0_m})}$
            $\oplus\; XS_{pcolL_1,\,(i + baseL_{1H_m})}$
            $\oplus\; XS_{pcolL_1,\,(i + baseL_{1L_m})}$
            $\oplus\; XS_{pcolL_2,\,(i + baseL_{2_m})}$
    }
}

*Predecessor bit offsets from i for error bit $X_{e_0,i}$*

*(ie., bit in leftmost error column $e_0$ at offset i):*                                   PROC 5.1 predecessorL$_{1_0}$ = predecessorL$_{1H_0}$ = $-k_0(e_0 - pcolL_0) + k_0(e_1 - pcolL_0) - k_1(e_1 - e_0)$ predecessorL$_{1L_0}$ = $-k_0(e_0 - pcolL_0) + k_0(e_2 - pcolL_0) - k_1(e_2 - e_0)$ predecessorL$_{2_0}$ =

$-k_0(e_0 - pcolL_0) + k_0(e_1 - pcolL_0) - k_1(e_1 - pcolL_1) + k_1(e_2 - pcolL_1) - k_2(e_2 - e_0)$ or, use:

$-k_0(e_0 - pcolL_0) + k_0(e_2 - pcolL_0) - k_1(e_2 - pcolL_1) + k_1(e_1 - pcolL_1) - k_2(e_1 - e_0)$

*Predecessor bit offsets from i for error bit $X_{e_1,i}$*

*(ie., bit in $2^{nd}$ to leftmost error column $e_1$ at offset i)*                     PROC 5.2 predecessorL$_{0_1}$ =   $-k_1(e_1 - pcolL_1) + k_1(e_0 - pcolL_1) - k_0(e_0 - e_1)$ predecessorL$_{2_1}$ =   $-k_1(e_1 - pcolL_1) + k_1(e_2 - pcolL_1) - k_2(e_2 - e_1)$ predecessorL$_{1L_1}$ = $-k_1(e_1 - pcolL_1) + k_1(e_2 - pcolL_1) - k_2(e_2 - pcolL_2) + k_2(e_0 - pcolL_2) - k_1(e_0 - e_1)$ or, use:        $-k_1(e_1 - pcolL_1) + k_1(e_0 - pcolL_1) - k_0(e_0 - pcolL_0) + k_0(e_2 - pcolL_0) - k_1(e_2 - e_1)$

*Predecessor bit offsets from i for error bit $X_{e_2,i}$*

*(ie., bit in rightmost error column $e_2$ at offset i) (only valid when M=3)*     PROC 5.3 predecessorL$_{1H_2}$ =   $-k_2(e_2 - pcolL_2) + k_2(e_1 - pcolL_2) - k_1(e_1 - n_{e2})$ predecessorL$_{1L_2}$ =   $-k_2(e_2 - pcolL_2) + k_2(e_2 - pcolL_2) - k_1(e_0 - n_{e2})$ predecessorL$_{0_2}$ = $-k_2(e_2 - pcolL_2) + k_2(e_1 - pcolL_2) - k_1(e_1 - pcolL_1) + k_1(e_0 - pcolL_1) - k_0(e_0 - e_2)$ or, use       $-k_2(e_2 - pcolL_2) + k_2(e_2 - pcolL_2) - k_1(e_0 - pcolL_1) + k_1(e_1 - pcolL_1) - k_0(e_1 - e_2)$

Rebuild error bit $X_{e_m,i}$

*Rebuild error bit $X_{n_e,i}$ (when M = 2)* for i = firstbit$_{e_0}$ to lastbit$_{e_0}$  PROC 5.4
{
$X_{e_0,i} = PD_{e_0,i}$  EQ 5.1

$\oplus S_{pcolL_0,(i+baseL_{0_0})} \oplus S_{pcolL_1,(i+baseL_{1_0})}$ $\oplus PD_{e_0,(i+predecessorL_{1_0})}$ $\oplus X_{e_0,(i+predecessorL_{1_0})}$
} for i = firstbit$_{e_1}$ to lastbit$_{e_1}$  PROC 5.5
{
$X_{e_1,i} = PD_{e_1,i}$  EQ 5.2

$\oplus S_{pcolL_0,(i+baseL_{0_1})} \oplus S_{pcolL_1,(i+baseL_{1_1})}$ $\oplus PD_{e_0,(i+predecessorL_{0_1})}$ $\oplus X_{e_0,(i+predecessorL_{0_1})}$
}

*Rebuild error bit $X_{n_e,i}$ (when M = 3)* for i = firstbit$_{e_0}$ to lastbit$_{e_0}$  PROC 5.5
{
$X_{e_0,i} = PD_{e_0,i}$  EQ 5.3

$\oplus S_{pcolL_0,(i+baseL_{0_0})} \oplus S_{pcolL_1,(i+baseL_{1H_0})} \oplus S_{pcolL_1,(i+baseL_{1L_0})} \oplus S_{pcolL_2,(i+baseL_{2_0})}$ $\oplus PD_{e_0,(i+predecessorL_{1H_0})}$ $\oplus PD_{e_0,(i+predecessorL_{1L_0})}$ $\oplus PD_{e_0,(i+predecessorL_{2_0})}$ $\oplus X_{e_0,(i+predecessorL_{1H_0})}$ $\oplus X_{e_0,(i+predecessorL_{1L_0})}$ $\oplus X_{e_0,(i+predecessorL_{2_0})}$
}

```
for i = firstbit_{e_1} to lastbit_{e_1}                                          PROC 5.5
    {
    X_{e_1,i} = PD_{n_{e_1},i}                                                    EQ 5.4
```
$\oplus\ S_{pcolL_0,\,(i+baseL_{0_1})} \oplus S_{pcolL_1,\,(i+baseL_{1H_1})} \oplus S_{pcolL_1,\,(i+baseL_{1L_1})} \oplus S_{pcolL_2,\,(i+baseL_{2_1})}$ $\oplus\ PD_{e_0,\,(i+predecessorL_{0_1})}$ $\oplus\ PD_{e_0,\,(i+predecessorL_{1L_1})}$ $\oplus\ PD_{e_0,\,(i+predecessorL_{2_1})}$ $\oplus\ X_{e_0,\,(i+predecessorL_{0_1})}$ $\oplus\ X_{e_0,\,(i+predecessorL_{1L_1})}$ $\oplus\ X_{e_0,\,(i+predecessorL_{2_1})}$

}

```
for i = firstbit_{e_2} to lastbit_{e_2}                                          PROC 5.5
    {
    X_{e_2,i} = PD_{e_2,i}                                                        EQ 5.5
```
$\oplus\ S_{pcolL_0,\,(i+baseL_{0_2})} \oplus S_{pcolL_1,\,(i+baseL_{1H_2})} \oplus S_{pcolL_1,\,(i+baseL_{1L_2})} \oplus S_{pcolL_2,\,(i+baseL_{2_2})}$ $\oplus\ PD_{e_2,\,(i+predecessorL_{1H_2})}$ $\oplus\ PD_{e_2,\,(i+predecessorL_{1L_2})}$ $\oplus\ PD_{e_2,\,(i+predecessorL_{0_2})}$ $\oplus\ X_{e_2,\,(i+predecessorL_{1H_2})}$ $\oplus\ X_{e_2,\,(i+predecessorL_{1L_2})}$ $\oplus\ X_{e_2,\,(i+predecessorL_{0_2})}$

}

PROC 6.0

Use PROC 1.2, but:
Replace:

$$P_{pcolL_m,i} = {}^{\oplus}\sum_{n=-(M-1) \text{ except } n=pcolL_m}^{N} PD_{n,[i+k_m(n-pcolL_m)]} \qquad \text{EQ 1.3}$$

With:

$$P_{pcolL_m,i} = P_{(pcolL_m+1),(i+k_m)} \qquad \text{if } (pcolL_m + 1) <= 0$$
$$\oplus {}^{\oplus}\sum_{n=1}^{N} D_{n,[i+k_m(n-pcolL_m)]} \qquad \text{EQ 6.1}$$

To determine rebuild sequence for error columns

*Set nextdataerror to leftmost data error*      PROC 6.1

```
nextdataerror = 0
done = 0
while (not done) and (nextdataerror< M)
   {
   if e_nextdataerror > 0
      {
      done =1
      }
   else
      {
      nextdataerror = nextdataerror +1
      }
```

*Determine currentbit and rebuild sequence for error columns to left of leftgoodcolumn* PROC 6.2

*Remember columns to be rebuilt are $n = r_m$ in order as $m = 0$ to $(M-1)$*
*Remember slope of line to use in rebuilding column $r_m$ is $kr_m$*
*Remember parity column of line to use in rebuilding column $r_m$ is $pcolLr_m$*

| | |
|---|---|
| `if lefterrors > 0` | // if erasures to left of leftgoodcolumn |
|    `{` | |
|    `for m = (lefterrors - 1) down to 0` | // they must all be parities |
|       `{` | // and for leftmost bad parities, |
|       $currentbit_{e_m} = firstbit_{e_m}$ | // firstbit is same as encode, and    EQ 6.2 |
|       $r_m = e_{(lefterrors -1) - m}$ | // rebuild is opposite order from error |
|       $kr_m = k_{(lefterrors -1) - m}$ | // line slope matches e order |
|       $pcolLr_m = pcolL_{(lefterrors -1) - m}$ | // line parity column matches e order |
|       `}` | |
|    `}` | |

*Determine currentbit and rebuild sequence for error columns to right of leftgoodcolumn* PROC 6.3

```
m = lefterrors
currentcolumn = leftgoodcolumn
currentfirstbit = currentbit_leftgoodcolumn
stillinparity = 1
while (m < M) and stillinparity                    // do any parity immediately to right
    {
    if ((currentcolumn + 1) = = e_m) & ((currentcolumn + 1) <= 0)
        {
        r_m = e_m                                  // going right rebuild in e order
        kr_m = k_m                                 // line slope matches e order and r order
        pcolLr_m = pcolL_m                         // line parity column matches e order and r order
        currentcolumn = currentcolumn + 1
        currentbit_e_m = currentfirstbit + kr_m    // firstbit is here + slope * 1 column    EQ 6.3
        currentfirstbit = currentbit_e_m
        m=m+1
        }
    else
        (
        nexterror = m                              // set this in case there are still parity errors
        stillinparity = 0
        }
    }                                              // end of while still in parity loop
while (m < M):
    {                                              // do next right bit, or skip to data
    if e_nexterror = pcolL_m + 1                   // pcolL_m is base of line m, right is +1
        {
        r_m = e_nexterror                          // rebuild next parity error
        kr_m = k_m                                 // use current rebuild slope
        pcolLr_m = pcolL_m                         // use current rebuild line parity column
        currentbit_e_nexterror = currentfirstbit + kr_m (nexterror - currentcolumn)    EQ 6.4
        nexterror = nexterror +1
        m=m+1
        }
    else                                           // skip to data
        (
        r_m = e_nextdataerror                      // rebuild next data error
        kr_m = k_m                                 // use current rebuild slope
        pcolLr_m = pcolL_m                         // use current rebuild line parity column
        currentbit_e_nextdataerror = currentfirstbit + kr_m (nextdataerror - currentcolumn)   EQ 6.5
        currentfirstbit = currentbit_e_nextdataerror
        currentcolumn = e_nextdataerror
        nextdataerror = nextdataerror +1
        m=m+1
        }
```

} // end of while not done with all errors loop

*Rebuild erasures at current edge, increment current edge, until all bits rebuilt* PROC 6.4

Use PROC 2.5, but
Replace:

$$X_{r_m, currentbit_{r_m}} = \oplus \sum_{n=-(M-1) \text{ except } n=r_m}^{N} XPD_{n, [currentbit_{r_m} + kr_m (n-r_m)]}$$ Eq 2.5

With:

$$X_{r_m, currentbit_{r_m}} = \oplus \sum_{n=1 \text{ except } n=r_m}^{N} XPD_{n, [currentbit_{r_m} + kr_m (n-r_m)]}$$ Eq 6.6

$$\oplus\ XPD_{pcolLr_m, [currentbit_{r_m} + kr_m (pcolLr_m - r_m)]} \quad \text{if } pcolLr_m <> r_m$$

$$\oplus\ XPD_{(pcolLr_m + 1), [currentbit_{r_m} + kr_m (pcolLr_m + 1 - r_m)]} \quad \text{if } (pcolLr_m + 1) <= 0 \text{ and } <> r_m$$

Enhanced Syndrome Edge Decoding using Partial Cross Convolution

*To generate enhanced syndrome bits $ES_{pcolL_m,i}$ using partial cross convolution* PROC 6.5

Use PROC 3.2, but:
Replace:

$$ES_{pcolL_m, i} = \oplus \sum_{n=-(M-1) \text{ except } n= e_0, e_1, \ldots, e_{(M-1)}}^{N} PD_{n, [i + k_m(n - pcolL_m)]}$$ EQ 3.2

With:

$$ES_{pcolL_m, i} = P_{pcolL_m, i} \quad (\text{if } pcolL_m <> e_0, e_1, \ldots e_{(M-1)})$$ EQ 6.7

$$\oplus\ P_{(pcolL_m + 1), (i + k_m)} \quad (\text{if } (pcolL_m + 1) <> e_0, e_1, \ldots e_{(M-1)})$$

$$\oplus\ \oplus \sum_{n=1 \text{ except } n= e_0, e_1, \ldots, e_{(M-1)}}^{N} D_{n, [i + k_m(n - pcolL_m)]}$$

*Rebuild erasures using enhanced syndromes and partial cross convolution* PROC 6.6

Use PROC 3.3, but
Replace:

$$X_{r_m, currentbit_{r_m}} = ES_{pcolL_m, [currentbit_{r_m} + kr_m (pcolLr_m - r_m)]}$$

$$\oplus\ \oplus \sum_{n= r_0, r_1, \ldots, r_{(M-1)} \text{ except } n=r_m} XPD_{n, [currentbit_{r_m} + kr_m (n - r_m)]}$$ EQ 3.3

With:

$$X_{r_m, currentbit_{r_m}} = ES_{pcolLr_m, [currentbit_{r_m} + kr_m (pcolLr_m - r_m)]}$$ EQ 6.8

$$\oplus\ \oplus \sum_{n= r_0, r_1, \ldots, r_{(M-1)} \text{ except } n=r_m \text{ or } (n < pcolLr_m) \text{ or } [(n > pcolLr_m + 1) \& n < 1]} XPD_{n, [currentbit_{r_m} + kr_m (n - r_m)]}$$

Parity and Syndrome Error Canceling Decoder using Partial Cross Convolution

*Syndromes used in the cancelling equations must be calculated using partial encoding:* PROC 6.7

Use PROC 3.1, but
Replace:

$$S_{pcolL_m,i} = \oplus\sum_{n=-(M-1)}^{N} PD_{n,[i+k_m(n-pcolL_m)]} \quad \text{EQ 3.1}$$

With:

$$\begin{aligned}S_{pcolL_m,i} = & \; P_{pcolL_m,i} \\ & \oplus P_{(pcolL_m+1),(i+k_m)} \\ & \oplus \oplus\sum_{n=1}^{N} D_{n,[i+k_m(n-pcolL_m)]}\end{aligned} \quad \text{EQ 6.9}$$

Line Topology for M=2 using Partial Cross Convolution

The general rules are as follows: PROC 6.8
1. If a data column or $P_0$ is being cancelled, use the normal $L_0, L_1$ crossing topology, since these columns are contained on both lines. (10/11 $e_0$, 00/01 $e_0/e_1$)
2. If $P_{-1}$ is being cancelled, rebuild $e_1$ using the line that does not contain $P_{-1}$, which effectively cancels $P_{-1}$. (10/11 $e_1$)

Table 6.1 M=2 rules per error pattern and column to be rebuilt

| Rebuild Parity erasure | $e_0$ | $e_1$ |
|---|---|---|
| 00 | 1 | 1 |
| 01 | 1 | 1 |
| 10 | 1 | 2 |
| 11 | 1 | 2 |

Line Topology for M=3 using Partial Cross Convolution

The general rules are as follows: PROC 6.9
1. If no parities are being cancelled (ie., two data columns are being cancelled,) use the normal $L_0, L_{1H}, L_{1L}, L_2$ parallelogram topology, since all data is contained on all lines. This is true for the normal case of no bad parity, as well as for rebuilding $e_0$ (the parity bit) in cases where one parity is erased. (000 $e_0/e_1/e_2$, 100/010/001 $e_0$)
2. If $P_{-2}$ is being cancelled, ignore the line which does not contain $P_{-2}$ and rebuild $e_1$ and $e_2$ as if they were $e_0$ and $e_1$ in the M=2 case. (100/110/101/111 $e_1/e_2$)
3. If $P_{-2}$ is not being cancelled and $P_{-1}$ is being cancelled and $P_0$ is not being cancelled, cross the two lines that contain $P_{-1}$ on $P_{-1}$; these two lines will cross the other column to be cancelled at two points; cancel those points by crossing with two of the line that does not contain $P_{-1}$; no other cancelling is needed. (110 $e_0$, 010/011 $e_1/e_2$)

4. If $P_{-2}$ is not being cancelled and $P_{-1}$ and $P_0$ are being cancelled, cross the two lines that contain $P_{-1}$ on $P_{-1}$; one of these lines will cross $P_0$; cancel that point by crossing with the line that does not contain $P_{-1}$; no other cancelling is needed. (111 $e_0$)
5. If neither $P_{-2}$ or $P_{-1}$ is being cancelled and $P_0$ is being cancelled, cross the two lines that contain $P_0$ on $P_0$; these two lines will cross the other column to be cancelled at two points; cancel those points by crossing with two of the line that does not contain $P_0$; no other cancelling is needed. (101/011 $e_0$, 001 $e_1/e_2$)

Table 6.2 M=3 rules per error pattern and column to be rebuilt

| Rebuild Parity erasure | $e_0$ | $e_1$ | $e_2$ |
|---|---|---|---|
| 000 | 1 | 1 | 1 |
| 001 | 1 | 5 | 5 |
| 010 | 1 | 3 | 3 |
| 011 | 5 | 3 | 3 |
| 100 | 1 | 2 | 2 |
| 101 | 5 | 2 | 2 |
| 110 | 3 | 2 | 2 |
| 111 | 4 | 2 | 2 |

Determine firstbits and lastbits for parity

*Determine first parity firstbit$_0$ to left of data, is the same as normal encoding, but parities at column n<0 use same offset as parity to their right, since slope is 0 at that point.* for n = 0 down to -(M-1)  PROC 7.1
{
   firstbit$_n$ = min [ min [-k$_{lpcol_n}$(N-n),  // for slope >= 0
                 -k$_{lpcol_n}$(1-n)],  // for slope <= 0
            firstbit$_{(n+1)}$  (if n + 1 <= 0) ]  // to get next parity firstbit lastbit$_n$ = max [ I - 1 + max [-k$_{lpcol_n}$(N-n),  // for slope <= 0
                   -k$_{lpcol_n}$(1-n)],  // for slope >= 0
            firstbit$_{(n+1)}$  (if n + 1 <= 0) ]  // to get next parity firstbit
}

Define parity bit values

Use PROC 1.2, but:
Replace:

$$P_{pcolL_m, i} = {}^{\oplus}\sum_{n=-(M-1) \text{ except } n=pcolL_m}^{N} PD_{n,\,[i + k_m(n - pcolL_m)]} \quad \text{EQ 1.3}$$

With:

$$P_{pcolL_m, i} = P_{(pcolL_m + 1),\, i} \quad \text{if } (pcolL_m + 1) <= 0$$
$$\oplus\ {}^{\oplus}\sum_{n=1}^{N} D_{n,\,[i + k_m n]} \quad \text{EQ 7.1}$$

Define current bit values for parity and syndrome edge decoders

Use PROC 6.3, but:

*The first instance is setting the currentbit to firstbit for error columns to the left of the leftgoodcolumn, and since these have been set for flat slope already, that remains the same:*
Use as is:   currentbit$_{e_m}$ = firstbit$_{e_m}$  EQ 6.2

*The second instance is calculating the parity bit immediately to the right, so slope is 0, not kr$_m$:*
Replace:   currentbit$_{e_m}$ = currentfirstbit + kr$_m$  EQ 6.3
With:   currentbit$_{e_m}$ = currentfirstbit  EQ 7.2

*The next instance is calculating a parity from a data bit, so slope kr$_m$ only covers from currentcolumn (the data bit) to 0, slope from 0 to nexterror (the parity column) is 0:*

Replace:  currentbit$_{\text{nexterror}}$ = currentfirstbit + kr$_m$ (nexterror - currentcolumn)  EQ 6.4
With:  currentbit$_{\text{nexterror}}$ = currentfirstbit + kr$_m$ (- currentcolumn)  EQ 7.3

*The next instance is calculating a data bit from a parity or data bit, so the slope is kr$_m$ only from column 0 to the data bit; recall that $\underline{n}$ = n for n>= 0, and $\underline{n}$ = 0 for n< 0:*
Replace:  currentbit$_{\text{nextdataerror}}$ = currentfirstbit + kr$_m$ (nextdataerror - currentcolumn)  EQ 6.5
Replace:  currentbit$_{\text{nextdataerror}}$ = currentfirstbit + kr$_m$ (nextdataerror - <u>currentcolumn</u>)  EQ 7.4

Rebuild erasures in edge decoder using flat parity slopes

Use PROC 6.4, but:
Replace:

$$X_{r_m,\,\text{currentbit}_{r_m}} = {}^{\oplus}\!\sum_{n=1\,\text{except}\,n=r_m}^{N} \text{XPD}_{n,\,[\text{currentbit}_{r_m} + kr_m(n-r_m)]}$$
$$\oplus\; \text{XPD}_{\text{pcolLr}_m,\,[\text{currentbit}_{r_m} + kr_m(\text{pcolLr}_m - r_m)]} \quad \text{if pcolLr}_m \diamond r_m$$
$$\oplus\; \text{XPD}_{(\text{pcolLr}_m + 1),\,[\text{currentbit}_{r_m} + kr_m(\text{pcolLr}_m + 1 - r_m)]} \quad \text{if (pcolLr}_m + 1) <= 0 \text{ and } \diamond\, r_m$$

Eq 6.6

With:
if $r_m$ > 0 (rebuilding data)
{

$$X_{r_m,\,\text{currentbit}_{r_m}} = {}^{\oplus}\!\sum_{n=1\,\text{except}\,n=r_m}^{N} \text{XPD}_{n,\,[\text{currentbit}_{r_m} + kr_m(n-r_m)]}$$
$$\oplus\; \text{XPD}_{\text{pcolLr}_m,\,[\text{currentbit}_{r_m} + kr_m(-r_m)]}$$
$$\oplus\; \text{XPD}_{(\text{pcolLr}_m + 1),\,[\text{currentbit}_{r_m} + kr_m(-r_m)]} \quad \text{if (pcolLr}_m + 1) <= 0$$

Eq 7.5

}
else $r_m$ <= 0 (rebuilding parity)
{

$$X_{r_m,\,\text{currentbit}_{r_m}} = {}^{\oplus}\!\sum_{n=1}^{N} \text{XPD}_{n,\,[\text{currentbit}_{r_m} + kr_m\, n]}$$
$$\oplus\; \text{XPD}_{\text{pcolLr}_m,\,[\text{currentbit}_{r_m}]} \quad \text{if pcolLr}_m \diamond r_m$$
$$\oplus\; \text{XPD}_{(\text{pcolLr}_m + 1),\,[\text{currentbit}_{r_m}]} \quad \text{if (pcolLr}_m + 1) <= 0 \text{ and } \diamond\, r_m$$

Eq 7.6

}

Enhanced Syndrome Edge Decoding using flat parity slopes

Use PROC 6.5, but:
Replace:

$$\text{ES}_{\text{pcolL}_m,\,i} = P_{\text{pcolL}_m,\,i} \quad (\text{if pcolL}_m \diamond e_0, e_1, \ldots e_{(M-1)})$$
$$\oplus\; P_{(\text{pcolL}_m + 1),\,(i + k_m)} \quad (\text{if (pcolL}_m + 1) \diamond e_0, e_1, \ldots e_{(M-1)})$$
$$\oplus\; {}^{\oplus}\!\sum_{n=1\,\text{except}\,n=e_0, e_1, \ldots, e_{(M-1)}}^{N} D_{n,\,[i + k_m(n - \text{pcolL}_m)]}$$

EQ 6.7

With:

$$ES_{pcolL_m, i} = P_{pcolL_m, i} \quad \text{(if } pcolL_m \diamond e_0, e_1, \ldots e_{(M-1)}) \quad \text{EQ 7.7}$$
$$\oplus\, P_{(pcolL_m + 1), i} \quad \text{(if } (pcolL_m + 1) \diamond e_0, e_1, \ldots e_{(M-1)})$$
$$\oplus\, {}^{\oplus}\sum_{n=1, \text{ except } n= e_0, e_1, \ldots, e_{(M-1)}}^{N} D_{n, [i + k_m n]}$$

Use PROC 6.6, but:
Replace:

$$X_{r_m, currentbit_{r_m}} = ES_{pcolL_m, [currentbit_{r_m} + kr_m (pcolL_m - r_m)]} \quad \text{EQ 6.8}$$
$$\oplus\, {}^{\oplus}\sum_{n= r_0, r_1, \ldots, r_{(M-1)} \text{ except } n=r_m \text{ or } (n < pcolLr_m) \text{ or } [(n > pcolLr_m + 1) \& n < 1]} XPD_{n, [currentbit_{r_m} + kr_m (n - r_m)]}$$

With:
  if $r_m > 0$ (rebuilding data)
  {

$$X_{r_m, currentbit_{r_m}} = ES_{pcolL_m, [currentbit_{r_m} + kr_m (-r_m)]} \quad \text{EQ 7.8}$$
$$\oplus\, {}^{\oplus}\sum_{n= r_0, r_1, \ldots, r_{(M-1)} \text{ except } n=r_m \text{ or } (n < pcolLr_m) \text{ or } [(n > pcolLr_m + 1) \& n < 1]} XPD_{n, [currentbit_{r_m} + kr_m (n - \underline{r_m})]}$$

}
  else $r_m \leq 0$ (rebuilding parity)
  {

$$X_{r_m, currentbit_{r_m}} = ES_{pcolL_m, currentbit_{r_m}} \quad \text{EQ 7.9}$$
$$\oplus\, {}^{\oplus}\sum_{n= r_0, r_1, \ldots, r_{(M-1)} \text{ except } n=r_m \text{ or } (n < pcolLr_m) \text{ or } [(n > pcolLr_m + 1) \& n < 1]} XPD_{n, [currentbit_{r_m} + kr_m \underline{n}]}$$

}

Parity and Syndrome Error Canceling Decoder using flat parity slopes

*Standard syndrome using flat parity slopes:*

Use PROC 6.7, but:
Replace:

$$S_{pcolL_m, i} = P_{pcolL_m, i} \quad \text{EQ 6.9}$$
$$\oplus\, P_{(pcolL_m + 1), (i + k_m)}$$
$$\oplus\, {}^{\oplus}\sum_{n=1}^{N} D_{n, [i + k_m(n - pcolL_m)]}$$

With:

$$S_{pcolL_m, i} = P_{pcolL_m, i} \quad \text{EQ 7.10}$$
$$\oplus\, P_{(pcolL_m + 1), i}$$
$$\oplus\, {}^{\oplus}\sum_{n=1}^{N} D_{n, [i + k_m n]}$$

*To find line base offsets and predecessor bits, use equations of Proc 4.1-4.3 and 5.1-5.3, modified per the topology rules in section E6, but perform the 0-limiting operation on all $e_m$ and relace all $pcolL_m$ terms with 0:*

Examples:
Replace:
$$baseL_{1L_0} = -k_0(e_0 - pcolL_0) + k_0(e_2 - pcolL_0) - k_1(e_2 - pcolL_1)$$
With:
$$baseL_{1L_0} = -k_0 \underline{e_0} + k_0 \underline{e_2} - k_1 e_2$$

Examples:
Replace:
$$predecessorL_{1L_0} = -k_0(e_0 - pcolL_0) + k_0(e_2 - pcolL_0) - k_1(e_2 - e_0)$$
With:
$$predecessorL_{1L_0} = -k_0 \underline{e_0} + k_0 \underline{e_2} - k_1(\underline{e_2} - \underline{e_0})$$

Parity to column mapping for non-sequential mapping
In this case, the mapping equation which was used throughout the preceding sections is replaced by another equation, or in general, by a table:

Replace:
$$pcolL_m = m - (M-1) \qquad \text{EQ 1.1}$$
*and conversely,*
$$lpcol_n = n + (M-1) \qquad \text{EQ 1.2}$$

With:

Table 10.1 $pcolL_m$ (parity column for line) example for M=7 (the alternating slope method)

| $pcolL_m$ | Line $L_m$ | Slope $k_m$ | m |
|---|---|---|---|
| 0 | $L_3$ | 0 | 3 |
| -1 | $L_4$ | 1 | 4 |
| -2 | $L_2$ | -1 | 2 |
| -3 | $L_5$ | 2 | 5 |
| -4 | $L_1$ | -2 | 1 |
| -5 | $L_6$ | 3 | 6 |
| -6 | $L_0$ | -3 | 0 |

*and conversely,*

Table 10.2 $lpcol_n$ (line for parity column) example for M=7 (the alternating slope method)

| $lpcol_n$ | Parity $P_n$ | Slope $k_m$ | m |
|---|---|---|---|
| 0 | $P_{-6}$ | -3 | 0 |
| 1 | $P_{-4}$ | -2 | 1 |
| 2 | $P_{-2}$ | -1 | 2 |
| 3 | $P_0$ | 0 | 3 |
| 4 | $P_{-1}$ | 1 | 4 |
| 5 | $P_{-3}$ | 2 | 5 |
| 6 | $P_{-5}$ | 3 | 6 |

The firstbit and lastbit determination use the same Proc 1.1, but using the above table-driven values for $lpcol_n$.

Parity and Syndrome Error Canceling Decoders with non-sequential pcolL

For cancelling decoders, procedures PROC 6.8 and 6.9 apply, since the rules do not call out specific lines, but only lines that include or do not include a parity column, which adjusts automatically to any pcolL table. The determination of the bases and the predecessor bits is still a function of the resulting topology, and the equations are not expanded in this document.

Parity and Syndrome Edge Decoders with non-sequential pcolL

The normal procedure starts at the leftgood column and proceeds outward in both directions, such that $L_0$ corrects the leftmost erased column. With non-sequential pcolL, $L_0$ may not contain the leftmost parity bits, so the normal procedure won't work.

The alternating slopes of this table create some constraints and rules for on rebuild order:

1. Rebuild data bits from right to left, using $L_m$ for m= (M-1) to 0, since the lines with slope >0 are initially based on parity bits at i<0, which are reliably stored via external means and thus can be used initially even if that parity column is erased. (The erased columns in these lines are rebuilt by lines with lower slope, ahead of their initial position, later in the sequence but before the next iteration.)
2. For each line, first try to use it to rebuild a data bit (either the next leftward erased data bit from the last rebuilt data bit, along a line through it, or the $firstbit_{e_{(M-1)}}$ if this is the rightmost erased data bit. The $firstbit_{e_{(M-1)}}$ will be 0 intially, and adjusted at the end using rule 4 below. Rebuild the next data bit if:
    a. Both $pcolL_m$ or ($pcolL_m$ + 1) are good (or $pcolL_m$ = 0 and is good)
        - these are the only parity bits on the line, line will be wasted if data not rebuilt
    b. $pcolL_m$ is good and ($pcolL_m$ + 1) is bad and $k_m > 0$
        - initially, start with given $P_{(pcolL_m + 1)}$
        - $P_{(pcolL_m + 1)}$ will be rebuilt ahead of this position, along $lpcol_{(pcolL_m + 1)}$, with good or rebuilt $P_{(pcolL_m + 2)}$
    c. $pcolL_m$ is bad and ($pcolL_m$ - 1) is good and $k_m > 0$
        - initially, start with given $P_{pcolL_m}$
        - $P_{pcolL_m}$ will be rebuilt ahead of this position, along $L_{lpcol_{(pcolL_m - 1)}}$, with good $P_{(pcolL_m - 1)}$
        - bad ($pcolL_m$ + 1) doesn't matter per rule 2b
3. If can't build a data bit on $L_m$, build a parity bit or bits:
    a. If only one of $pcolL_m$ and ($pcolL_m$ + 1) are erased (or $pcolL_m$ is 0)
        i. Rebuild bad P on line $L_m$ through last rebuilt data (or $D_{N,0}$ if no D errors)
        ii. If $pcolL_m$ was rebuilt, and $pcolL_m$ -1 is erased and $k_{lpcol_{(pcolL_m - 1)}} < 0$
            1. Rebuild $P_{(pcolL_m - 1)}$ along $L_{lpcol_{(pcolL_m - 1)}}$ through the rebuilt $P_{pcolL_m}$
                - (This is the equivalent of the leftward rebuild of leftmost parities in the normal pcolL sequence case, call it "build left".)
    b. if both $pcolL_m$ and ($pcolL_m$ + 1) are erased and $k_m > 0$
        i. Rebuild bad $P_{pcolL_m}$ on line $L_m$ through last rebuilt data (or $D_{N,0}$ if no D errors)
        - $P_{(pcolL_m + 1)}$ is okay as in rule 2b.

ii. pcolL$_m$ -1 is erased (or would have rebuilt a data using rule 2c.)
    1. Rebuild P$_{(pcolL_m -1)}$ as in rule 3a.ii.1 ("build left")
  c. if both pcolL$_m$ and (pcolL$_m$ + 1) are erased and k$_m$ < 0
    i. skip L$_m$, it was used earlier for a "build left"
4. The initial firstbit for any rebuilt bit is the same as it's stored firstbit. As each bit is rebuilt on the first iteration, if the resulting offset is > that column's stored firstbit, subtract the difference from all rebuild firstbits calculated so far. Thus all stored, erased bits will be rebuilt, and in some columns, initial "rebuilds" will be earlier than the stored firstbit and don't have any effect.

What is claimed is:

1. A computerized method for data error correction comprising:
receiving at least some channels of N+M channels of encoded data that represent N channels of source data and M channels of parity data, each of the received channels including a series of entries;
storing the received series of entries in a buffer; and
iteratively reconstructing, based on the received series of entries in the buffer, entries of one or more channels of the N+M channels of encoded data, at one or more iterations applying one or more parity equations to one or more entries from the received series of entries and to one or more previously reconstructed entries to reconstruct an entry in a reconstructed channel, wherein at least N+1 entries, from the received series of entries and the previously reconstructed entries, contribute to solving at least one of the one or more parity equations.

2. The method of claim 1 wherein two or more of the N+M channels include at least some iteratively reconstructed entries.

3. The method of claim 2 wherein one or more of the at least some iteratively reconstructed entries in the two or more channels are reconstructed using a reconstructed entry from another of the two or more channels reconstructed in that iteration.

4. The method of claim 2 wherein reconstructing each entry comprises applying a single one of the one or more parity equations to received and/or reconstructed entries.

5. The method of claim 4 wherein reconstructing at least some entries comprises applying a parity equation to a reconstructed entry.

6. The method of claim 1 wherein iteratively reconstructing the entries comprises at each iteration reconstructing an entry in one of the one or more channels to be reconstructed using a combination of parity equations from the one or more parity equations, the combination of parity equations being independent of entries in at least one other of the one or more channels to be reconstructed.

7. The method of claim 6 wherein the combination of parity equations is independent of entries in all of the other one or more channels to be reconstructed.

8. The method of claim 7 wherein the one or more channels to be reconstructed includes M channels, and the combination of parity equations is independent of entries in M−1 of the one or more channels to be reconstructed.

9. The method of claim 1 further comprising determining channels of the N+M channels that were not received, wherein iteratively reconstructing entries of the one or more channels includes reconstructing entries in the channels that were not received.

10. The method of claim 1 further comprising detecting errors in entries in the received channels, wherein iteratively reconstructing entries of the one or more channels includes reconstructing entries in the channels including the detected errors.

11. The method of claim 1 wherein applying the one or more parity equations comprises modulo 2 summing of the one or more entries from the received series of entries and the one or more previously reconstructed entries.

12. The method of claim 11 wherein the one or more parity equations consists of one or more modulo 2 summation operations.

13. The method of claim 1 wherein at least N+M−1 entries, from the received series of entries and the previously reconstructed entries, contribute to solving the at least one of the one or more parity equations.

14. The method of claim 1 further comprising:
reconstructing a first set of initial entries in the N+M channels of encoded data using the one or more parity equations applied to an initial first set of the received entries in the buffer and a first set of one or more predetermined values, resulting in a first set of reconstructed entries; and
reconstructing a second set of initial entries in the N+M channels of encoded data using the one or more parity equations applied to an initial second set of the received entries in the buffer, one or more entries of the first set of reconstructed entries, and a second set of one or more predetermined values, resulting in the one or more previously reconstructed entries.

15. A data decoder comprising:
a buffer for storing at least some of N+M channels of encoded data that represent N channels of source data and M channels of parity data, each of the stored channels including a series of entries;
a data processor configured to iteratively reconstruct entries of one or more channels of the N+M channels of encoded data, including, at one or more iterations, configured to apply one or more parity equations to one or more entries in the stored series of entries and to one or more previously reconstructed entries to reconstruct an entry in a reconstructed channel, wherein at least N+1 entries, from the stored series of entries and the previously reconstructed entries, contribute to solving at least one of the one or more parity equations.

16. The data decoder of claim 15 wherein the at least one of the one or more parity equations consists of one or more modulo 2 summation operations.

17. The data decoder of claim 15 wherein at least N+M−1 entries, from the stored series of entries and the previously reconstructed entries, contribute to solving the at least one of the one or more parity equations.

18. Software stored on computer-readable media comprising instructions for causing a data processing system to:
iteratively reconstruct entries of one or more channels of N+M channels of encoded data, the N+M channels representing N channels of source data and M channels of parity data; and
at one or more iterations, apply one or more parity equations to at least one or more previously reconstructed entries to reconstruct at least one entry in the N+M channels, wherein at least N+1 entries, from a received series of entries and the previously reconstructed entries, contribute to solving at least one of the one or more parity equations.

19. The software of claim 18 wherein the at least one of the one or more parity equations consists of one or more modulo 2 summation operations.

20. The software stored on the computer-readable media of claim 18, wherein at least N+M−1 entries, from the received series of entries and the previously reconstructed entries, contribute to solving the at least one of the one or more parity equations.

21. A computerized method for data error protection comprising:
receiving source data;
representing the source data as N channels of source data, each including a series of I entries;
storing the N series of I entries in a buffer;
encoding, based on the N series of I entries in the buffer, the N channels of source data to form M channels of encoded data such that the M channels of encoded data and the N channels of source data satisfy at least M×I independent parity equations, at least I entries of some of the M channels of encoded data each being an argument to at least M of the parity equations, and at least N+1 entries, from the stored series of entries and the previously encoded entries, contribute to one or more of the parity equations;

handling the M channels of encoded data and the N channels of source data;

iteratively reconstructing entries in one or more channels of the M channels of encoded data and/or N channels of source data, at one or more iterations applying one or more of the parity equations to at least previously reconstructed entries; and recovering the source data using the reconstructed entries.

22. The method of claim 21 wherein applying the one or more of the parity equations comprises modulo 2 summing of the at least previously reconstructed entries.

23. The method of claim 21 wherein at least N+M−1 entries, from the stored series of entries and the previously encoded entries, contribute to the one or more of the parity equations.

24. A computerized method for distributed storage of data comprising:

receiving source data;

representing the source data as N channels of source data, each including a series of I entries;

storing the N channels of source data in a buffer;

iteratively encoding the N channels of source data to form N+M channels of encoded data, at one or more iterations applying one or more parity equations to one or more entries from the N channels and to one or more entries from previously encoded channels to construct a parity entry, the N+M channels of encoded data satisfying at least M×I independent parity equations, wherein at least I entries of some of the N+M channels of encoded data each being an argument to at least M of the parity equations, and at least N+1 entries, from the stored series of entries and the previously encoded entries, contribute to one or more of the parity equations; and distributing the N+M channels of encoded data to separate storages;

retrieving at least some of the N+M channels of encoded data from the separate storages;

iteratively reconstructing entries in one or more channels of the N+M channels of encoded data using the retrieved channels, at one or more iterations applying one or more of the parity equations to received and reconstructed entries of the N+M channels of encoded data to reconstruct an entry in each of the one or more of the N+M channels; and recovering the source data using the reconstructed entries.

25. The method of claim 24 wherein applying the one or more parity equations comprises modulo 2 summing of the one or more entries from the N channels and the one or more entries from previously encoded channels.

26. The method of claim 24 wherein at least N+M−1 entries, from the stored series of entries and the previously encoded entries, contribute to the one or more of the parity equations.

27. A computerized method for data error control comprising:

receiving source data;

representing the source data as N channels of source data, each including a series of I entries;

storing the N series of I entries in a buffer;

iteratively encoding, based on the N series of I entries in the buffer, the N channels of source data to form M channels of encoded data, at one or more iterations applying one or more parity equations to one or more entries in the N series of I entries and to one or more previously constructed entries in the M channels of encoded data to construct a parity entry, the M channels of encoded data and N channels of source data satisfying at least M×I independent parity equations, at least I entries of some of the M channels of encoded data each contributing to at least M of the parity equations, and at least N+1 entries, from the stored series of entries and the previously encoded entries, contribute to one or more of the parity equations; and handling the M channels of encoded data and the N channels of source data.

28. The method of claim 27 wherein encoding the N channels comprises augmenting the N channels of source data with M channels of parity data.

29. The method of claim 27 wherein handling the N+M channels of encoded data comprises transmitting the N+M channels over different paths.

30. The method of claim 29 wherein transmitting the N+M channels over different paths comprises transmitting the N+M channels over different communication links.

31. The method of claim 29 wherein transmitting the N+M channels over different paths comprises transmitting the channels at different times.

32. The method of claim 29 wherein transmitting the N+M channels over different paths comprises transmitting the channels in different packets.

33. The method of claim 27 wherein handling the N+M channels of encoded data comprises storing the N+M channels in different storage devices.

34. The method of claim 27 further comprising recovering the source data from the handled channels by correcting errors in the handled channels of encoded data, including using least N channels of encoded data to correct errors in at least m>M/2 other of the N+M channels of encoded data.

35. The method of claim 27 wherein applying the one or more parity equations comprises modulo 2 summing of the one or more entries in the N series of I entries and the one or more previously constructed entries in the M channels of encoded data.

36. The method of claim 27 wherein at least N+M−1 entries, from the stored series of entries and the previously encoded entries, contribute to the one or more of the parity equations.

37. A computerized method for data error correction comprising:

receiving at least some channels of N+M channels of encoded data that represent N channels of source data and M channels of parity data channels, each of the received channels including a series of entries, wherein N and M are integers and M is greater than or equal to 2;

storing each of the received series of entries in a buffer;

reconstructing a set of initial entries in the N+M channels of encoded data using one or more parity equations applied to a first set of one or more predetermined values, an initial set of the received entries in the buffer and an initial set of previously reconstructed entries;

reconstructing a set of subsequent entries in the N+M channels of encoded data using the one or more parity equations applied to a subsequent set of the received entries in the buffer and a subsequent set of previously reconstructed entries; and reconstructing a set of final entries in the N+M channels of encoded data using the one or more parity equations applied to a second set of one or more predetermined values, a final set of the received entries in the buffer and a final set of previously reconstructed entries.

38. The method of claim 37, wherein the first and second sets of one or more predetermined values comprises values of zero.

39. The method of claim 37, wherein the reconstructed entries comprise at least two channels of the N+M channels of encoded data.

40. The method of claim 39, wherein one or more entries of the set of subsequent entries in the at least two channels of the N+M channels of encoded data are reconstructed using a previously reconstructed entry from the set of subsequent entries in the at least two channels of the N+M channels of encoded data.

41. The method of claim 39, wherein reconstructing each of the entries in the set of subsequent entries comprises applying a single one of the one or more parity equations.

42. The method of claim 39, wherein reconstructing each of the entries in the set of subsequent entries associated with one of the N+M channels of encoded data comprises applying a linear combination of two or more of the one or more parity equations, the linear combination is independent of all entries in the set of subsequent entries associated with at least two of the N+M channels of encoded data.

43. The method of claim 42, wherein the linear combination is independent of all entries in all of the at least two of the N+M channels of encoded data.

44. The method of claim 42 wherein the linear combination of parity equations consist of one or more modulo 2 summation operations.

45. The method of claim 37, wherein reconstructing entries in the set of subsequent entries comprises iteratively applying the one or more parity equations.

46. The method of claim 37 further comprising determining whether one of the N+M channels of encoded data was not received, wherein a series of reconstructed entries from the sets of initial and subsequent entries is a reconstruction of the channel that was not received.

47. The method of claim 37 further comprising detecting errors in entries in the received channels, wherein a series of reconstructed entries from the sets of initial and subsequent entries is a reconstruction of a received channel with detected errors.

48. The method of claim 37, wherein at least N+1 entries, from the subsequent set of received entries and the subsequent set of previously reconstructed entries, contribute to solving at least one of the one or more parity equations used to reconstruct entries in the set of subsequent entries.

49. The method of claim 48 wherein at least N+M−1 entries, from the subsequent set of received entries and the subsequent set of previously reconstructed entries, contribute to solving the at least one of the one or more parity equations.

* * * * *